(12) United States Patent
Hirakata et al.

(10) Patent No.: US 7,999,462 B2
(45) Date of Patent: Aug. 16, 2011

(54) DISPLAY DEVICE WITH MULTIPLE OLEDS

(75) Inventors: Yoshiharu Hirakata, Kanagawa (JP); Takahiro Ibe, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/732,701

(22) Filed: Mar. 26, 2010

(65) Prior Publication Data

US 2010/0176719 A1 Jul. 15, 2010

Related U.S. Application Data

(63) Continuation of application No. 11/279,845, filed on Apr. 14, 2006, now Pat. No. 7,714,500.

(30) Foreign Application Priority Data

Apr. 19, 2005 (JP) ................................ 2005-121746

(51) Int. Cl.
*H01L 51/50* (2006.01)
(52) U.S. Cl. ...................................... 313/504
(58) Field of Classification Search .......... 313/504–505, 313/506, 512
See application file for complete search history.

(56) References Cited

U.S. PATENT DOCUMENTS

| | | | |
|---|---|---|---|
| 4,954,746 A | 9/1990 | Taniguchi et al. | |
| 5,457,357 A | 10/1995 | Fujii et al. | |
| 5,507,404 A | 4/1996 | Ryu | |
| 5,965,981 A | 10/1999 | Inoguchi et al. | |
| 6,380,687 B1 | 4/2002 | Yamazaki | |
| 2004/0124542 A1 | 7/2004 | Kuwabara et al. | |
| 2004/0140547 A1 | 7/2004 | Yamazaki et al. | |
| 2004/0155846 A1 | 8/2004 | Hoffman et al. | |
| 2004/0169624 A1 | 9/2004 | Yamazaki et al. | |
| 2004/0212012 A1 | 10/2004 | Yamazaki et al. | |
| 2004/0239231 A1 | 12/2004 | Miyagawa et al. | |
| 2004/0239658 A1 | 12/2004 | Koyama et al. | |
| 2004/0245529 A1 | 12/2004 | Yamazaki et al. | |

(Continued)

FOREIGN PATENT DOCUMENTS

JP 10-012378 A 1/1998

(Continued)

OTHER PUBLICATIONS

Office Action (Chinese Application No. 200610073799.2) dated Dec. 5, 2008 with English translation (11 pages).
Office Action (Chinese Application No. 200610073799.2) dated Sep. 4, 2009 with English translation (7 pages).
Office Action, Chinese Appln. No. 200610073799.2; mailed Aug. 9, 2010, 16 pages with English translation.

*Primary Examiner* — Toan Ton
*Assistant Examiner* — Hana S Featherly
(74) *Attorney, Agent, or Firm* — Fish & Richardson P.C.

(57) ABSTRACT

To improve an image quality of an organic EL display by utilizing characteristics of a dual emission type organic light emitting element. A display device includes a first substrate over which a plurality of organic light emitting elements are provided and a second substrate over which an organic light emitting element is provided. The first and second substrates are facing each other. At least either the organic light emitting elements provided over the first substrate or the organic light emitting element provided over the second substrate emit/emits light toward both surfaces of the first or second substrate. Light emitting regions of the organic light emitting elements provided over the first substrate are overlapped with a light emitting region of the organic light emitting element provided over the second substrate as seen from the second substrate.

9 Claims, 31 Drawing Sheets

| U.S. PATENT DOCUMENTS | | | | FOREIGN PATENT DOCUMENTS | | |
|---|---|---|---|---|---|---|
| 2004/0245531 A1 | 12/2004 | Fuii et al. | | JP | 2000-100560 A | 4/2000 |
| 2004/0263425 A1 | 12/2004 | Anzai et al. | | JP | 2002-313571 A | 10/2002 |
| 2005/0001211 A1 | 1/2005 | Yamazaki et al. | | JP | 2004-265691 A | 9/2004 |
| 2005/0040753 A1 | 2/2005 | Osame et al. | | JP | 2005-071693 A | 3/2005 |
| 2005/0052142 A1 | 3/2005 | Iwabuchi et al. | | | | |
| 2006/0108588 A1* | 5/2006 | Osame et al. | 257/72 | * cited by examiner | | |

DISPLAY DEVICE WITH MULTIPLE OLEDS

CROSS-REFERENCE TO RELATED APPLICATIONS

This application is a continuation of U.S. application Ser. No. 11/279,845, filed Apr. 14, 2006, now allowed, which claims the benefit of a foreign priority application filed in Japan as Serial No. 2005-121746 on Apr. 19, 2005, both of which are incorporated by reference.

BACKGROUND OF THE INVENTION

1. Field of the Invention

The present invention relates to a display device including an organic light emitting element. In particular, the present invention relates to a display device (an organic EL display) including a light emitting element having an organic compound (an organic light emitting element) which emits light by being applied with electronic field. Moreover, the present invention relates to an electronic appliance using such a display device for a display portion.

2. Description of the Related Art

An organic light emitting element has a structure in which a layer containing an organic compound (an organic light emitting material) which generates electroluminescence by being applied with electric field (hereinafter, referred to as an organic compound layer), is interposed between a pair of electrodes (a first electrode and a second electrode). The organic light emitting material is classified into a material which can convert energy upon returning to a ground state from a singlet excited state into light emission (a fluorescent material) and a material which can convert energy upon returning to a ground state from a triplet excited state into light emission (a phosphorescent material).

A display device including such an organic light emitting element (an organic EL display) has characteristics of high response speed suitable for movie display, requiring low driving voltage, and consuming less power, and therefore, the display device has been attracting attention as a next generation display for a cellular phone, a portable information terminal, or the like.

Differing from a liquid crystal display device, the organic EL display emits light by itself, and therefore, it has a feature of good viewing angle. Therefore, the organic EL display is more suitable as a display used in the open air than a liquid crystal display so that various uses of the organic EL display have been proposed.

An organic light emitting element which is formed over a light transmitting substrate and emits light from both sides of the light transmitting substrate (hereinafter, referred to as a dual emission type organic light emitting element) has been known (e.g., see patent document 1). This dual emission type light emitting element has a feature of emitting light toward the both sides of the substrate, and therefore, there has been an expectation of widespread application of the dual emission type light emitting element by utilizing such a feature.

[Patent Document 1]: Japanese Patent Application Laid-Open No. 2004-265691

Further, the patent document 2 discloses a display device which displays full color images by attaching panels including dual emission type organic light emitting elements which emits different colors of light to each other such that light emitting regions of the organic light emitting elements provided over each panel are not overlapped with each other as seen from a viewer side.

[Patent Document 2]: Japanese Patent Application Laid-Open No. 2005-71693

An object of the present invention is to provide a display device which utilizes the above mentioned features of a dual emission type organic light emitting element. Another object of the present invention is to improve image quality of an organic EL display by utilizing a dual emission type organic light emitting element. In order to improve the image quality, concretely, the following three problems can be given.

First, a problem of controlling brightness of a displayed image can be given. Suitable brightness of an organic EL display device is differed in a case of using the organic EL display device in a bright-light location such as an outdoor location and in a case of using it in doors. Therefore, it is necessary to control brightness of the display device depending on brightness of a location of use.

Next, a problem of improving chromaticity can be given. For example, when color display with red (R), green (G), and blue (B) is performed, only colors within a triangle of a chromaticity coordinate of red (R), a chromaticity coordinate of green (G), and a chromaticity coordinate of blue (B) in a chromaticity diagram, have been expressed, and therefore, there has been a limitation in a range of colors which can be expressed. If the range of colors which can be expressed, can be more widened, the number of colors to be expressed can be increased so that more microscopic and realistic images can be displayed.

Furthermore, a problem of balance of colors can be given. It has been known that visibility is differed depending on colors. The visibility indicates sensitivity of the eye to light. A yellow-green wavelength in the vicinity of 555 nm shows highest visibility. As being shifted to shorter wavelengths than 555 nm, the visibility is reduced. Meanwhile, as being shifted to longer wavelengths than 555 nm, the visibility is reduced. Accordingly, the visibility of green light is higher than the visibility of red light and the visibility of blue light. Thus, it is necessary to balance the colors depending on the visibility. Furthermore, there is also a problem that a blue organic light emitting element has lower luminance than red and green organic light emitting elements, and therefore, it is also necessary to balance the luminance of red, green, and blue light.

The present invention is made in view of the above described problems.

In an aspect of the present invention, a display device includes a first substrate over which an organic light emitting elements is provided, and a second substrate over which an organic light emitting element is provided, wherein the first substrate and second substrate are provided to face each other, at least either the organic light emitting element provided over the first substrate or the organic light emitting element provided over the second substrate emits light toward both surfaces of the substrate, and a light emitting region of the organic light emitting element provided over the first substrate and a light emitting region of the organic light emitting element provided over the second substrate are placed such that they are at least partly overlapped with each other as seen from a viewer side.

In order to form an organic light emitting element which emits light toward both sides of a substrate over which the organic light emitting element is provided, a first electrode and a second electrode of the organic light emitting element may be formed using transparent conductive films. Accordingly, in the above described structure, the phrase "at least either the organic light emitting element provided over the first substrate or the organic light emitting element provided over the second substrate emits light toward both surfaces of the substrate" indicates that a first electrode and a second electrode of at least either the organic light emitting element provided over the first substrate or the organic light emitting element provided over the second substrate are formed using a transparent conductive film.

Note that, the first electrode of the organic light emitting element is placed closer to the substrate over which the organic light emitting element is provided than the second electrode of the organic light emitting element. Thus, in the pair of electrodes of each organic light emitting element provided over the first substrate, the electrode being closer to the first substrate is the first electrode.

In the above mentioned structure, a first organic light emitting element is provided over the first substrate, a second organic light emitting element, a third organic light emitting element, and a fourth organic light emitting element are provided over the second substrate, and one pixel includes the first to fourth organic light emitting elements.

In the above mentioned structure of the present invention, a first organic light emitting element is provided over the second substrate, a second organic light emitting element, a third organic light emitting element, and a fourth organic light emitting element are provided over the first substrate, and one pixel includes the first to fourth organic light emitting elements.

In the above mentioned structure of the present invention, a first organic light emitting element and a second organic light emitting element are provided over the first substrate, a third organic light emitting element and a fourth organic light emitting element are provided over the second substrate, and one pixel includes the first to fourth organic light emitting elements.

Further, in the present invention, the first to fourth organic light emitting elements emit different colors of light from one another.

In the above mentioned structure of the present invention, a first organic light emitting element, a second organic light emitting element, and a third organic light emitting element are provided over the first substrate, a fourth organic light emitting element, a fifth organic light emitting element, and a sixth organic light emitting element are provided over the second substrate, and one pixel includes the first to sixth organic light emitting elements.

Further, in the present invention, the first to third organic light emitting elements emit different colors of light form one another.

Furthermore, the first to sixth organic light emitting elements emit different colors of light form one another.

That is, in the above mentioned structure of the present invention, two colored or three colored organic light emitting elements selected from four to six colored organic light emitting element of red, green, and blue organic light emitting elements and one to three colored organic light emitting elements selected from red, green, blue, a complementary color of red, a complementary color of green, a complementary color of blue, and white, are provided over the first substrate, and the rest of the four to six colored organic light emitting elements is/are provided over the second substrate.

Further, various kinds of combinations of organic light emitting elements provided over the first substrate and the second substrate can be given. In relation to the combination of organic light emitting elements provided over the first substrate and the second substrate, the following first to fourth structures of the present invention will be described in more detail.

In the first structure of the present invention, red, green, blue, and while organic light emitting elements are provided over a first substrate or a second substrate. That is, one pixel includes the four colored, i.e., red, green, blue, and while organic light emitting elements.

Note that, in the present specification, a minimum unit required for displaying an image is referred to as a pixel, and the pixel includes a plurality of dots. For example, when an image is displayed using three colors of red, green, and blue, one pixel is constituted by three different colored dots, i.e., a red dot, a green dot, and a blue dot as one set.

Therefore, it can be said that in the first structure of the present invention, one pixel includes a red dot, a green dot, a blue dot, and a white dot.

As the first structure of the present invention, for example, an example in which red, green, and blue organic light emitting elements are provided over one of the first substrate and the second substrate, whereas a while organic light emitting element is provided over the other substrate, can be given.

Providing the white organic light emitting element over the substrate different from the substrate over which the red, green, and blue organic light emitting elements are provided makes it possible to improve brightness of an entire display screen of a display device.

When an organic EL display is used as a display portion of an electronic appliance used in the open air and in doors regardless of location such as a cellular phone and a portable information terminal, if brightness of a display screen is not suitably controlled in accordance with surrounding brightness, visibility is degraded. In this case, by increasing luminance of only the white organic light emitting element provided over the substrate different from the other substrate over which the red, green, and blue organic light emitting elements are provided, the brightness of only the display screen can be improved.

Since the substrate having only the white organic light emitting element is provided separately from the substrate having the red, green, and blue organic light emitting elements for performing color display, the luminance of the while organic light emitting element can be changed independent from the red, green, and blue organic light emitting elements. Accordingly, the brightness of the display screen can be easily controlled.

Further, when white color is displayed on a conventional organic EL display which can perform color display, red, green, and blue organic light emitting elements emit light and three colors of light emitted from the organic light emitting elements are mixed to be while light. However, in the structure of the present invention in which a substrate having red, green, and blue organic light emitting elements and a substrate having a white organic light emitting element are overlapped with each other, only the white organic light emitting element emits light while the red, green, and blue organic light emitting elements emit no light so as to display white color. Therefore, power consumption can be more reduced as compared to the case of displaying white color by making the red, green, and blue organic light emitting elements emit light.

Note that, the arrangement of the red, green, blue, and while organic light emitting elements may, for example, be either a case A or a case B as follows.

The case A: one dot of a white organic light emitting element is provided over a second substrate such that it faces a region where one dot of a red organic light emitting element, one dot of a green organic light emitting element, and one dot of a blue organic light emitting element are provided over a first substrate.

The case B: dots of white organic light emitting elements are respectively provided at positions over a second substrate corresponding to regions over the first substrate where a dot of a red organic light emitting element, a dot of a green organic light emitting element, and a dot of a blue organic light emitting element are provided over the first substrate. Specifically, one dot of the white organic light emitting element is provided over the second substrate such that it faces the one dot of the red organic light emitting element provided over the first substrate, another one dot of the white organic light emitting element is provided over the second substrate such that it faces the one dot of the green organic light emitting element provided over the first substrate, and another one dot of the white organic light emitting element is provided over the second substrate such that it faces the one dot of the blue organic light emitting element provided over the first substrate.

In the case B, it is possible to independently control luminance of the white organic light emitting elements, which are provided at the positions corresponding to each light emitting region of the red, green, and blue organic light emitting elements provided over the first substrate. Therefore, red, green, and blue colors can be respectively controlled. That is, for example, when only the white organic light emitting element provided at the position corresponding to the red organic light emitting element emits light, the white emission and red emission is mixed to exhibit pink emission while green emission and blue emission can be exhibited as they are, and hence, reproducibility of colors can be improved.

An example of providing the red, green, and blue organic light emitting elements over the first substrate while providing the white organic light emitting element(s) over the second substrate are described in each of the cases A and B. Alternatively, the red, green, and blue organic light emitting elements provided over the first substrate and the white organic light emitting element(s) provided over the second substrate can be counterchanged. That is, the white organic light emitting element(s) may be provided over the first substrate whereas the red, green, and blue organic light emitting elements may be provided over the second substrate.

A structural example in which only the white organic light emitting element(s) is/are provided over one of the first and second substrates in each of the above described examples. Alternatively, any one of red, green, and blue organic light emitting elements may be provided over the substrate having a white organic light emitting element, whereas other two colored organic light emitting elements except for the organic light emitting element provided over the same substrate as the white organic light emitting element, may be provided over the other substrate. That is, for example, red and green organic light emitting elements may be provided over any one of a first substrate and a second substrate, and blue and white organic light emitting elements may be provided over the other substrate.

In a structure in which a white organic light emitting element and any one of red, green, and blue organic light emitting elements are provided over either a first substrate or a second substrate and the remaining two colored organic light emitting elements among the red, green, and blue organic light emitting elements (two colored organic light emitting elements other than the one of the red, green, and blue organic light emitting elements provided over the one of the first and second substrates) are provided over the other substrate, when areas of light emitting regions of the red and blue organic light emitting elements are set larger than an area of a light emitting region of the green organic light emitting element, it is possible to balance the red, green, and blue colors of light. This is because the visibility of the red and blue light is lower than that of the green light.

Further, since the two colored organic light emitting elements are provided over each of the first and second substrates, the number of elements required for driving the organic light emitting elements provided for each dot can be reduced as compared to a case of providing three colored organic light emitting elements over a substrate while having the same number of pixels, and therefore, aperture ratio can be improved.

In the second structure of the present invention, red, green, and blue organic light emitting elements and one to three colored organic light emitting element(s) whose color(s) is/are selected from a complementary color of red, a complementary color of green, and a complementary color of blue, are provided over either a first substrate or a second substrate. That is, one pixel includes four to six colored organic light emitting elements with a combination of the red, green, and blue and one to three colors selected from the complementary colors of red, green, and blue.

As the second structure of the present invention, for example, it is possible to give an example in which red, green, and blue organic light emitting elements are provided over one of a first substrate and a second substrate, whereas one to three colored organic light emitting element(s) selected from the organic light emitting elements of the complementary color of red, the complementary color of green, and the complementary color of blue, is/are provided over the other substrate.

The complementary color of red is blue-green (cyan), the complementary color of blue is yellow, and the complementary color of green is red-purple (magenta). By forming organic light emitting elements having these colors, colors which cannot be expressed by only red, green, and blue can be expressed, thereby widening the range of colors to be expressed and largely improving reproducibility of colors.

Note that, it is not necessary to form all complementary colors of organic light emitting elements with respect to red, green, and blue. The kinds or the number of colors of organic light emitting elements provided over the second substrate can be changed in accordance with quality of an image to be displayed. That is, one to three colors may be selected from the complementary colors of red, green, and blue in accordance with quality to be required.

Although the structural example in which the red, green, and blue organic light emitting elements are provided over either the first substrate or the second substrate, is described above, the present invention is not limited thereto. Alternatively, two colored organic light emitting elements selected from red, green, and blue organic light emitting elements may be provided over one of first and second substrates, and a one colored organic light emitting element, which is a remaining organic light emitting element of the red, green, and blue organic light emitting elements, and a one colored organic light emitting element or two colored organic light emitting elements whose color(s) is/are selected from the complementary colors of red, green, and blue, may be provided over the other substrate.

Since the visibility of red and blue light is lower than that of green light, when areas of light emitting regions of the red and blue organic light emitting elements are set larger than an area of a light emitting region of the green organic light emitting element, it is possible to balance the red, green, and blue colors.

As such a structural example, the following example can be given: a red organic light emitting element is provided over a first substrate; a blue organic light emitting element is provided over a second substrate; a green organic light emitting element is provided over either the first substrate or the second substrate; a one colored organic light emitting element selected from complementary colors of red, green, and blue is provided either the first substrate or the second substrate; and areas of light emitting regions of the red and blue organic light emitting elements are set larger than an area of a light emitting region of the green organic light emitting element.

As compared to a case where three colored organic light emitting elements are provided over a substrate while having the same number of pixels provided over the substrate, when two colored organic light emitting elements are provided over each of the first and second substrates, the number of elements required for driving the organic light emitting elements provided in each dot can be reduced, making it possible to improve aperture ratio.

Further, in the second structure of the present invention, emission colors of organic light emitting elements may be any colors which can widen a range of a triangle of a chromaticity coordinate of red, a chromaticity coordinate of green, and a chromaticity coordinate of blue, in addition to the complementary colors of red, green, and blue. Therefore, an organic light emitting element which emits light having a chromaticity coordinate outside of the triangle of the chromaticity coordinate of red, the chromaticity coordinate of green, and the chromaticity coordinate of blue, may be used. Therefore, one colored to three colored organic light emitting element(s) which emits/emit a color of light having a chromaticity coordinate outside of the triangle of the chromaticity coordinates of red, green, and blue, may be provided as a substitute for the complementary colors of red, green, and blue.

In the third structure of the present invention, red, green, and blue organic light emitting elements are provided over each of a first substrate and a second substrate. Specifically, one pixel includes red, green, and blue organic light emitting elements provided over the first substrate and red, green, and blue organic light emitting elements provided over the second substrate.

In the third structure of the present invention, when the organic light emitting elements provided over the first substrate and the organic light emitting elements provided over the second substrate are overlapped with one another such that the same colored organic light emitting elements are overlapped with one another, display can be performed at more higher luminance. Accordingly, more gray scales can be expressed.

Further, in this case, when light emitting regions of the same colored organic light emitting elements are at least partly overlapped with one another, display can be performed at higher luminance. However, it is preferable that overlapping areas of the different colored organic light emitting elements be increased so as to prevent reduction in aperture ratio. That is, when light emitting regions of the organic light emitting elements provided over the first substrate are overlapped with light emitting regions of the organic light emitting elements provided over the second substrate at almost the same positions as seen from a viewer side, the highest aperture ratio can be obtained.

In the third structure of the present invention, when the light emitting regions of the different colored organic light emitting elements provided over the first and second substrates are overlapped with one another as seen from a viewer side, image resolution performance can be improved.

Note that, in this case, when the light emitting regions of the different colored organic light emitting elements are at least partly overlapped with one another, the image resolution performance can be improved. However, it is preferable that overlapping areas of the different colored organic light emitting elements be increased so as to prevent reduction in aperture ratio. That is, when the light emitting regions of the organic light emitting elements provided over the first substrate are overlapped with the light emitting regions of the organic light emitting elements provided over the second substrate at almost the same positions as seen from a viewer side, the highest aperture ratio can be obtained.

In the fourth structure of the present invention, red, green, and blue organic light emitting elements are provided over a first substrate, and another blue organic light emitting element is provide over a second substrate. Specifically, one pixel includes the red, green, and blue organic light emitting elements provided over the first substrate and the blue organic light emitting element provided over the second substrate.

Since a blue organic light emitting element has low luminance, the luminance of blue emission can be compensated by forming another blue organic light emitting element over the second substrate, making it possible to improve balance of luminance of red, blue, and green.

In the above mentioned fourth structure, a white organic light emitting element may also be provided over the second substrate over which the blue organic light emitting element is provided. By providing the white organic light emitting element over the second substrate, luminance of blue emission can be compensated and brightness of a display screen can be controlled.

In the fourth structure, one or two colored organic light emitting elements selected from complementary colors of red, green, and blue may also be provided over the second substrate over which the blue organic light emitting element is provided. By providing one or two colored organic light emitting elements selected from the complementary colors of red, green, and blue, luminance of blue emission can be compensated and a range of colors to be expressed can be widened.

There are two ways of layout methods of the first substrate and the second substrate of the display device according to the present invention described above.

As a first layout method, a surface of the first substrate over which an organic light emitting element is formed and a surface of the second substrate over which an organic light emitting element is formed are attached to each other so as to face each other.

In accordance with the layout, the second substrate serves as a counter substrate with respect to the first substrate whereas the first substrate serves as a counter substrate with respect to the second substrate. Therefore, the organic light emitting elements can be sealed with only the first and second substrates. Accordingly, the display device can have almost the same thickness as a normal display device in which an organic light emitting element is formed only over one substrate and the substrate is sealed with a counter substrate.

As a second layout method, a surface of the first substrate over which an organic light emitting element is formed is attached to a surface of the second substrate which is opposite to the other surface of the second substrate over which an organic light emitting element is formed.

In the second layout method, the second substrate serves as a counter substrate with respect to the first substrate. Thus, the first substrate can be sealed with the second substrate. However, the second substrate is not sealed with the first substrate. Therefore, a third substrate is provided to face the surface of the second substrate over which the organic light emitting element is formed so as to seal the second substrate with the third substrate.

Accordingly, the organic light emitting elements can be sealed with less number of substrates in the case of the first layout method as compared to the second layout method, so that the first layout method requires lower cost. Moreover, a thickness of a panel formed by attaching the substrates can be more reduced in the first layout method as compared to the second layout method, and hence, the first layout method is more preferable.

Further, as a method for attaching the first and second substrates to seal the organic light emitting elements, various known methods can be employed, for example, the first and second substrates are sealed with a sealant in a sheet-form, a solid sealing material is applied to an entire surface of one of the first and second substrates to be attached, or a sealant is only applied to the circumference of the substrate and a filler is filled between the substrates.

When air does not exist between the first and second substrates by using the method in which a solid sealing material is applied to an entire surface of the substrates to be attached, light extraction efficiency can be improved.

Structures of the first and second layout methods of the first and second substrates will be respectively described in more detail below.

In the first layout method, the following three cases 1, 2, and 3 can be thought. In the case 1, the first and second substrates are light transmitting substrates, and organic light emitting elements provided over the first and second substrates emit light toward both sides of each substrate. In the case 2, the first substrate is a light transmitting substrate and an organic light emitting element provided over the first substrate emits light toward both sides of the first substrate, whereas an organic light emitting element provided over the second substrate emits light toward a surface of the second substrate over which the organic light emitting element is provided, i.e., toward the first substrate. In the case 3, the second substrate is a light transmitting substrate and an organic light emitting element provided over the second substrate emits light toward both sides of the second substrate, whereas an organic light emitting element provided over the first substrate emits light toward a surface of the first substrate over which the organic light emitting element is provided, i.e., toward the second substrate.

In the case 1, display screens are formed over both of the first and second substrates, and an image recognized on the display screen formed over the first substrate is a mirrored image of an image recognized on the display screen formed over the second substrate. Further, since the first and second substrates are the light transmitting substrates, the display screens are formed over the first and second substrates while a viewer can see the view beyond the first and second substrates.

Further, by providing polarizing plates over the first and second substrates, it is possible to prevent a viewer from seeing the view beyond the first and second substrates on both of the display screen formed over the first substrate and the display screen formed over the second substrate.

In the case 2, the display screen is formed only over the first substrate. In the case 3, the display screen is formed only over the second substrate.

Moreover, the following three cases 4, 5, and 6 can be thought in the second layout method. In the case 4, the first and second substrates are light transmitting substrates, and an organic light emitting element provided over the first substrate and an organic light emitting element provided over the second substrate emit light toward both sides of each substrate. In the case 5, the first substrate is a light transmitting substrate and an organic light emitting element provided over the first substrate emits light toward the both sides of the first substrate whereas an organic light emitting element provided over the second substrate emits light toward a surface of the second substrate opposite to the other surface of the second substrate over which the organic light emitting element is provided, i.e., toward the first substrate. In the case 6, the second substrate is a light transmitting substrate and an organic light emitting element provided over the second substrate emits light toward the both sides of the second substrate whereas an organic light emitting element provided over the first substrate emits light toward a surface of the first substrate opposite to the other surface of the first substrate over which the organic light emitting element is provided, i.e., toward the second substrate.

In the case 4, display screens are formed over the first and second substrates, and an image recognized on the display screen formed over the first substrate is a mirrored image of an image recognized on the display screen formed over the second substrate. Further, since the first and second substrates are the light transmitting substrates, the display screens of the first and second substrates are formed while a viewer can see the view beyond the first and second substrates.

Further, by providing polarizing plates over the first and second substrates, it is possible to prevent a viewer from seeing the view beyond the first and second substrates on both of the display screen formed over the first substrate and the display screen formed over the second substrate.

In the case 5, the display screen is formed only over the first substrate. In the case 6, the display screen is formed only over the second substrate.

In the present invention, as a light transmitting substrate, a quartz substrate, a glass substrate, a plastic substrate, or the like is used. When heat treatment at a temperature of 600° C. or more is performed in a process of manufacturing an element such as a thin film transistor or an organic light emitting element over a substrate, a quartz substrate is used. When heat treatment at a temperature of 600° C. or less is performed, a glass substrate or a plastic substrate may be used. Here, the light transmitting substrate indicates a substrate which transmits visible light therethrough. This represents visible light transmittance of the substrate is 80 to 100%.

In each of the above mentioned cases 2 and 5, the light transmitting substrate is used as the first substrate whereas a material of the second substrate is not particularly limited and a substrate having no light transmitting property may be used as the second substrate.

Further, in each of the cases 3 and 6, the light transmitting substrate is used as the second substrate whereas a material of the first substrate is not particularly limited and a substrate having no light transmitting property may be used as the first substrate.

In the above described structures of the present invention, an active matrix display device is preferable.

Organic light emitting elements mentioned in this specification include not only an organic light emitting element having a structure in which a film sandwiched between a first electrode and a second electrode contains an organic compound but also an organic light emitting element having a structure in which a film sandwiched between a first electrode and a second electrode partly contains an inorganic compound in addition to an organic compound.

Organic light emitting materials include a material which can convert energy upon returning to a ground state from a singlet excited state into light emission (a fluorescent material) and a material which can convert energy upon returning to a ground state from a triplet excited state into light emission (a phosphorescent material). Either the fluorescent material or the phosphorescent material may be used as an organic light emitting material used for a display device of the present invention.

As a structure of an organic compound layer, it is possible to employ various known structures such as a structure formed by laminating a hole transporting layer, a light emitting layer, and an electron transporting layer in this order, and a structure formed by laminating a hole injecting layer, a hole transporting layer, a light emitting layer, an electron transporting layer, and an electron injecting layer in this order.

In a display device of the present invention, a method for driving the display device for image display is not particularly limited, and for example, a dot sequential driving method, a line sequential driving method, a surface sequential driving method, and the like may be used. As a method for expressing a gray scale of an organic light emitting element, either a digital gray scale method or an analog gray scale method may be employed. Further, a source line of the display device may be input with either analog signals or digital signals. A driver circuit and the like may be arbitrarily designed according to image signals.

By providing a substrate having a white organic light emitting element in addition to a substrate having red, green, and blue organic light emitting elements, luminance of only the white organic light emitting element can be increased so that brightness of only a display screen can be improved. Since the substrate having the white organic light emitting element is provided separately from the substrate having the red, green, and blue organic light emitting elements for performing color display, the luminance of the white organic light emitting element can be changed independently from the red, green, and blue organic light emitting elements. Therefore, brightness of the display screen can be easily controlled.

Further, when white color is displayed on a conventional organic EL display which can perform color display, red, green, and blue organic light emitting elements emit light and three colors of light emitted from the organic light emitting elements are mixed to display while color. However, in the structure of the present invention in which a substrate having red, green, and blue organic light emitting elements and a substrate having a white organic light emitting element are overlapped with each other, only the white organic light emitting element emits light while the red, green, and blue organic light emitting elements emit no light so as to display white color. Therefore, power consumption can be more reduced as compared to the case of displaying white color by making the red, green, and blue organic light emitting elements emit light.

When areas of light emitting regions of red and blue organic light emitting elements are set larger than an area of a light emitting region of a green organic light emitting element, it is possible to balance the red, green, and blue colors.

In the case where an organic light emitting element which emits light with a color by which a range of a triangle of a chromaticity coordinate of red, a chromaticity coordinate of green, and a chromaticity coordinate of blue can be widened, is provided separately from red, green, and blue organic light emitting elements, colors which cannot be expressed only by red, green, and blue organic light emitting elements, can be expressed, so that more microscopic and realistic images can be displayed.

Furthermore, when red, green, and blue organic light emitting elements are provided over a first substrate and red, green, and blue organic light emitting elements are provided over a second substrate and the first and second substrates are attached to each other such that the different colored organic light emitting elements provided over the first and second substrates are overlapped with one another as seen from a viewer side, image resolution performance can be improved.

Moreover, when a substrate over which red, green, and blue organic light emitting elements are provided is overlapped with a substrate over which a blue organic light emitting element is provided, luminance of blue light emission can be compensated, making it possible to improve balance of luminance of red, green, and blue.

DETAILED DESCRIPTION OF THE INVENTION

Embodiment Modes

Embodiment modes of the present invention will be described below.

Embodiment Mode 1

Figure 1:
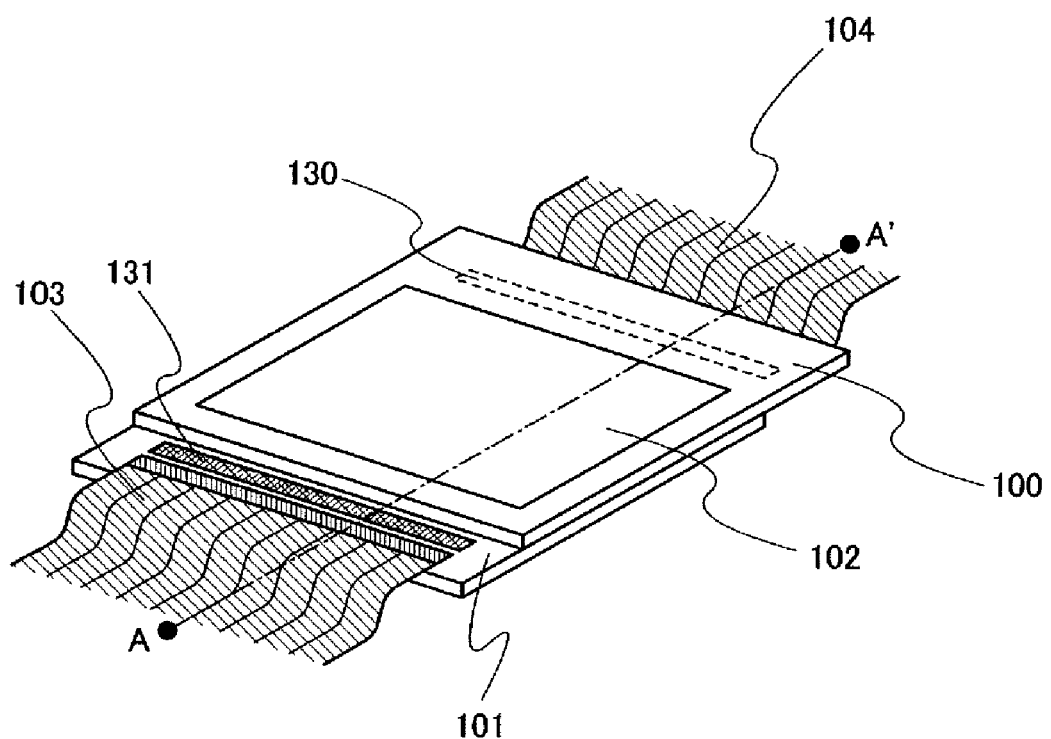
FIG. 1 is a perspective view of a display device according to the present invention.

In this embodiment mode, a display device formed by attaching a substrate having a white (W) organic light emitting element to a substrate having red (R), green (G), and blue (B) organic light emitting elements, will be described. A perspective view of a display device according to the present invention is shown in FIG. 1. In FIG. 1, reference numeral 100 is a first substrate over which red (R), green (G), and blue (B) organic light emitting elements are formed; 101, a second substrate over which a white organic light emitting element is formed; and 102, a display screen. Reference numerals 103 and 104 are FPCs (flexible printed circuits); and 130 and 131, peripheral driver circuits. Over the first substrate 100, a pixel portion (not shown) including a plurality of organic light emitting elements and the peripheral driver circuit 130 are formed. Over the second substrate 101, a pixel portion (not shown) including a plurality of organic light emitting elements and the peripheral driver circuit 131 are formed. The first substrate 100 and the second substrate 101 are attached to each other such that a surface of the first substrate over which the red, green, and blue organic light emitting elements are provided faces a surface of the second substrate over which the white organic light emitting element is provided, as shown in FIG. 1. Further, the display screen 102 is formed over the first substrate 100.

Although a case where the peripheral driver circuits are formed over the first and second substrates in FIG. 1, the peripheral driver circuits may not be provided thereover. Alternatively, driver circuits may be provided over ICs and the ICs may be connected to the first and second substrates by using a TAB technology, a COG technology, or the like.

Figure 2A:
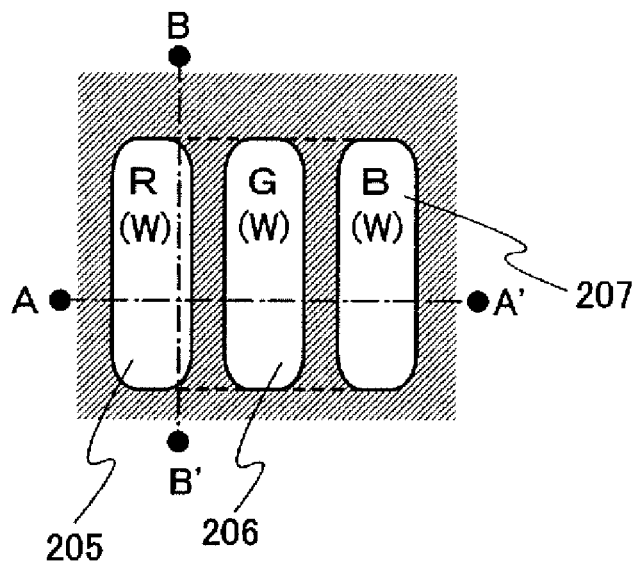
FIGS. 2A to 2C are top views showing a pixel structure of a display device described in Embodiment Mode 1.
Figure 2B:
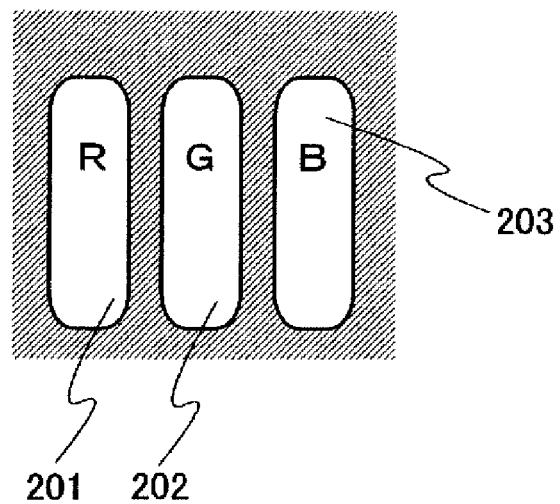
Figure 2C:
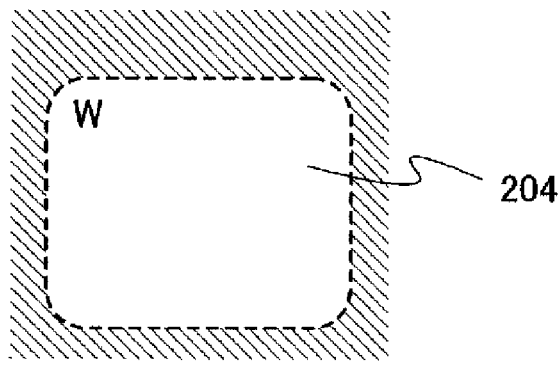

FIGS. 2A to 2C shows pixel structures of a display device of Embodiment Mode 1. FIG. 2A shows a pixel structure as seen from the display screen 102 side, that is, from a viewer side. FIG. 2B shows a pixel structure of the first substrate, and FIG. 2C shows a pixel structure of the second substrate. Each of FIGS. 2B and 2C is a top view as seen from the surface provided with the organic light emitting element(s). When the first substrate having the pixel structure shown in FIG. 2B is overlapped with the second substrate having the pixel structure shown in FIG. 2C such that the organic light emitting elements provided over the first and second substrates face one another, the pixel structure as shown in FIG. 2A can be obtained as seen from the display screen 102 side, i.e., from a viewer side. Note that, a wiring and the like are not shown in FIGS. 2A to 2C so as to simply show the overlapped light emitting regions.

In FIG. 2B, reference numeral 201 indicates a red light emitting region including a red organic light emitting element; 202, a green light emitting region including a green organic light emitting element; and 203, a blue light emitting region including a blue organic light emitting element. In FIG. 2C, reference numeral 204 indicates a white light emitting region including a white organic light emitting element.

Shaded portions in FIGS. 2A and 2B are light shielding regions since a wiring, an element for driving the organic light emitting elements, and the like are formed over the first substrate. A shaded portion in FIG. 2C is a light shielding region since a wiring, an element for driving the organic light emitting element, and the like are formed over the second substrate. Therefore, when the first and second substrates are overlapped with each other, light emitted from the white light emitting region is partly shielded by the light shielding region of the first substrate as seen from the viewer side, as shown in FIG. 2A.

When the red light emitting region 201, the green light emitting region 202, and the blue light emitting region 203 provided over the first substrate and the white light emitting region 204 provided over the second substrate emit light, a viewer sees three different colored light emitting regions denoted by reference numerals 205, 206, and 207. In this case, a red light emitting region which is lightened by white light emission, is formed in reference numeral 205. A green light emitting region which is lightened by white light emission, is formed in reference numeral 206. A blue light emitting region which is lightened by white light emission, is formed in reference numeral 207.

Further, the color of the light emitting regions over the second substrate is shown in parentheses in reference numerals 205, 206, and 207 of FIG. 2A. Specifically, in reference numeral 205, "R" and "(W)" indicate that the red light emitting region over the first substrate is overlapped with the white light emitting region over the second substrate. In reference numeral 206, "G" and "(W)" indicate that the green light emitting region over the first substrate is overlapped with the white light emitting region over the second substrate. In reference numeral 207, "B" and "(W)" indicate that the blue light emitting region over the first substrate is overlapped with the white light emitting region over the second substrate.

Figure 3A:
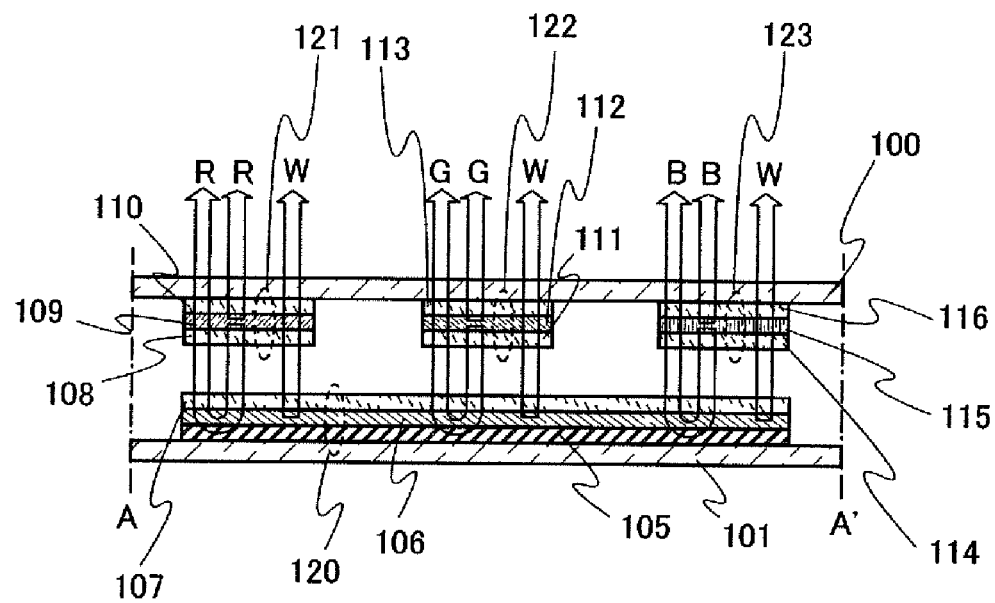
FIGS. 3A and 3B are cross sectional views showing one pixel of a display device described in Embodiment Mode 1.
Figure 3B:
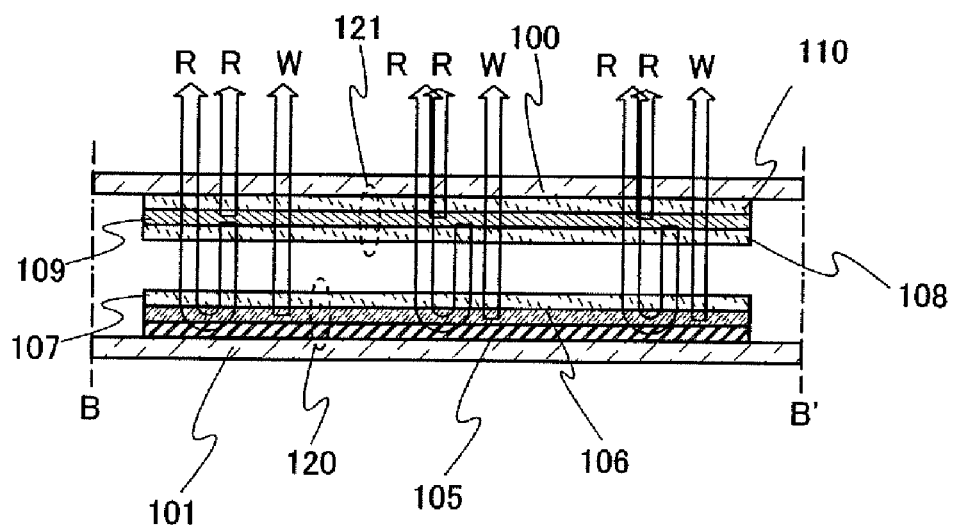

FIGS. 3A and 3B are cross sectional views of the pixel structures shown in FIGS. 2A to 2C. FIG. 3A is a cross sectional view along a line A-A of FIG. 2A. FIG. 3B is a cross sectional view along a line B-B' of FIG. 2A. The cross sectional views shown in FIGS. 3A and 3B are provided to simply show positional relations of the organic light emitting elements provided over the first substrate to the organic light emitting element provided over the second substrate in the display device of the present invention. Therefore, only the red, green, and blue organic light emitting elements provided over the first substrate and the white organic light emitting element provided over the second substrate are shown in FIGS. 3A and 3B. That is, in an actual cross sectional structure of the display device, an insulating film and the like are provided between the substrate and the organic light emitting elements rather than the structure in which the organic light emitting elements are provided in contact with the surface of the substrate. However, component parts other than the substrates and the organic light emitting elements are omitted here. This is the same for the cross sections views of the following embodiment modes and embodiments. Note that, a specific example of the cross sectional structures will be described in embodiments below.

In FIG. 3A, a red (R) organic light emitting element 121, a green (G) organic light emitting element 122, and a blue (B) organic light emitting element 123 are provided over a first substrate 100 whereas a white organic light emitting element 120 is provided over a second substrate 101. As shown in FIG. 3A, the first substrate 100 and the second substrate 101 are overlapped with each other such that the red organic light emitting element 121, the green organic light emitting element 122, and the blue organic light emitting element 123 provided over the first substrate face the white organic light emitting element 120 provided over the second substrate.

By forming such the structure, the second substrate 101 serves as a counter substrate with respect to the first substrate 100 whereas the first substrate 100 serves as a counter substrate with respect to the second substrate 101, and the organic light emitting elements can be sealed with only the first and second substrates 100 and 101. Therefore, the display device of the present invention can have almost the same thickness as a normal display device in which an organic light emitting element is provided over a substrate and is sealed with a counter substrate.

The organic light emitting elements 121, 122, and 123 provided over the first substrate 100 have a dual emission structure in which the organic light emitting elements emit light toward a surface of the first substrate 100 over which the organic light emitting elements are provided and toward the other surface of the first substrate opposite to the surface of the first substrate over which the organic light emitting elements are provided. Meanwhile, the white organic light emitting element 120 provided over the second substrate 101 has a top emission structure in which the white organic light emitting element emits light toward a surface of the second substrate 101 over which the white organic light emitting element is provided. Further, arrows indicate the directions of light emitted from the respective organic light emitting elements in FIG. 3A.

By employing such the structure, light generated in the white organic light emitting element 120 and the red, green, and blue organic light emitting elements 121, 122, and 123 can be emitted toward the surface of the first substrate 100 opposite to the other surface of the first substrate over which the red, green, and blue organic light emitting elements 121, 122, and 123 are provided. That is, a display screen can be formed over the surface of the first substrate 100 opposite to the other surface of the first substrate 100 over which the red, green, and blue organic light emitting elements 121, 122, and 123 are provided. Accordingly, an image of which brightness is controlled by light emission of the white organic light emitting element 120, can be displayed on the surface of the first substrate 100 opposite to the other surface of the first substrate over which the red, green, and blue organic light emitting elements 121, 122, and 123 are provided.

The red organic light emitting element 121 includes a first electrode 110, a second electrode 108, and a layer 109 containing an organic compound sandwiched between the first electrode 110 and the second electrode 108. The green organic light emitting element 122 includes a first electrode 113, a second electrode 111, and a layer 112 containing an organic compound sandwiched between the first electrode 113 and the second electrode 111. The blue organic light emitting element 123 includes a first electrode 116, a second electrode 114, and a layer 115 containing an organic compound sandwiched between the first electrode 116 and the second electrode 114.

The first electrodes 110, 113, and 116 and the second electrodes 108, 111, and 114 of the red, green, and blue organic light emitting elements 121, 122, and 123 are respectively formed using a transparent conductive film made from indium tin oxide (ITO), and indium zinc oxide (IZO) in which indium oxide contains zinc oxide, and the like. The materials used as the transparent conductive film is not particularly limited to the above mentioned materials, and a thin metal film and the like can be used in addition to the above materials.

Further, the first electrodes 110, 113, and 116 of the red, green, and blue organic light emitting elements 121, 122, and 123 are formed by patterning the same transparent conductive film. Also, the second electrodes 108, 111, and 114 of the red, green, and blue organic light emitting elements 121, 122, and 123 are formed by pattering the same transparent conductive film.

By forming the first and second electrodes of each organic light emitting element with the transparent conductive films, each organic light emitting element can be of a dual emission type.

The white organic light emitting element 120 includes a first electrode 105, a second electrode 107, and a layer 106 containing an organic compound sandwiched between the first electrode 105 and the second electrode 107.

As the first electrode 105 of the white organic light emitting element 120, an electrode having a function of reflecting light is preferably used. When the first electrode 105 of the white organic light emitting element 120 has a function of reflecting light, light emitted toward the second substrate 101 side from the red, green, and blue organic light emitting elements 121, 122, and 123 can be reflected by the first electrode 105 of the white organic light emitting element 120. Thus, light emitted from the red, green, and blue organic light emitting elements 121, 122, and 123 can be efficiently utilized.

As a material for forming the electrode having a function of reflecting light, for example, a metal film with high reflectivity such as an aluminum film (including an aluminum alloy film and an aluminum film containing an additive) and a silver thin film can be given. The entire first electrode 105 is not necessary to have a function of reflecting light as long as the first electrode 105 can reflect light emitted from the organic light emitting elements provided over the first substrate. Further, metal with high reflectivity which is stacked with a transparent conductive film, can be used as the first electrode 105. In addition, an electrode at least whose top surface is coated with a metal film with high reflectivity, for example, a conductive film whose top surface (a surface facing the second substrate) is aluminum-plated or silver-plated, may be used as the first electrode 105.

By using an electrode having a function of reflecting light as the first electrode 105 of the white organic light emitting element 120, light emitted toward the second substrate 101 from the red, green, and blue organic light emitting elements 121, 122, and 123 can be reflected by the first electrode 105. Accordingly, the first electrode 105 of the white organic light emitting element 120 is preferably provided to overlap with all of the light emitting regions formed by the red, green, and blue organic light emitting elements 121, 122, and 123. This can efficiently utilize light emitted from the red, green, and blue organic light emitting elements 121, 122, and 123.

As the second electrode 107 of the white organic light emitting element 120, a transparent conductive film made from indium tin oxide (TIO), indium zinc oxide (IZO) in which indium oxide contains zinc oxide, or the like is used. A material of a transparent conductive film is not limited to the above mentioned materials, and a metal thin film can also be used in addition to these materials.

In the display device of this embodiment mode, a white pixel is placed to overlap with each of a red pixel, a green pixel, and a blue pixel, and therefore, brightness of a display screen can be controlled by changing luminance of only the white organic light emitting element.

Current-luminance characteristics of the red, green, and blue organic light emitting elements are different from one another. In a conventional display device, in order to change brightness of only an entire display surface, luminance of each of red, green, and blue organic light emitting elements must be changed while keeping a balance of red, green, and blue colors. However, in the display device of the this embodiment mode, the brightness of only the entire display screen can be changed by changing luminance of only the white organic light emitting element.

Accordingly, when a light sensor for detecting surrounding brightness is provided and luminance of the white organic light emitting element is changed in accordance with the surrounding brightness detected by the light sensor, brightness of the entire display screen can be changed in accordance with the surrounding brightness in using the display device.

Further, in the display device of this embodiment mode, since a white dot is arranged to overlap with red, green, and blue dots, only a white color can be displayed by making only the white organic light emitting element emit light while making the red, green, and blue organic light emitting elements emit no light.

In a normal display device performing color display by using red, green, and blue dots as one pixel, a white color is displayed by making the red, green, and blue dots emit light. However, in the display device of this embodiment mode, since the white organic light emitting element is formed over the substrate different from the substrate over which the red, green, and blue organic light emitting elements are formed, one pixel can be displayed by making only the white organic light emitting element emit light. As compared to the case of displaying a white color by making the red, green, and blue dots emit light, the power consumption can be reduced.

Furthermore, in a case where a white organic light emitting element is formed over the same substrate as red, green, and blue organic light emitting elements, the number of dots formed over one substrate is increased, which results in reduction of the number of pixels. However, in the structure of this embodiment mode, since the white organic light emitting element is formed over the substrate different from the substrate over which the red, green, and blue organic light emitting elements are formed, both of color display and only white display can be performed without reducing the number of pixels. Also, when displaying only the white color, the power consumption can be reduced.

Although an example in which the red, green, and blue organic light emitting elements being of the dual emission type are formed over the first substrate, the white organic light emitting element being of the top emission type is formed over the second electrode, and the display screen is formed over the first substrate, is shown in FIGS. 2A to 2C and FIG. 3A, the present invention is not limited thereto.

Figure 4:
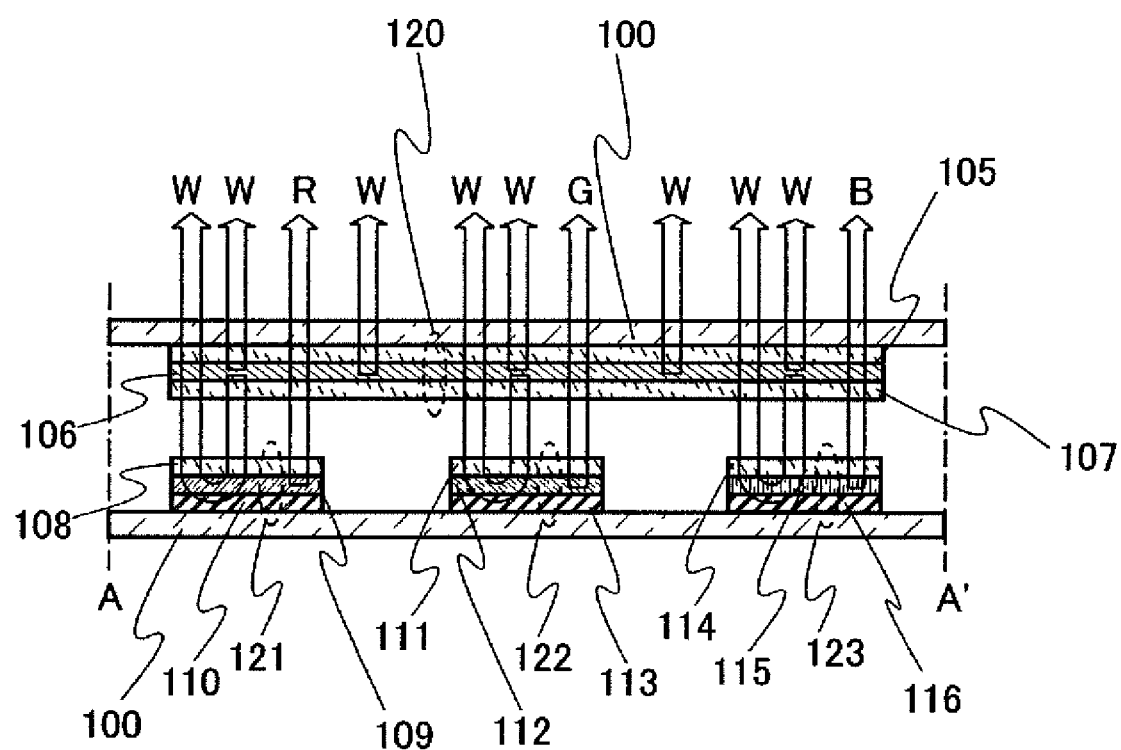
FIG. 4 is a view showing a cross sectional structure of one pixel of a display device described in Embodiment Mode 1.

For example, as shown in FIG. 4, the positions of the organic light emitting elements provided over the first substrate and the organic light emitting element provided over the second substrate, may be counterchanged.

The same portions as those of FIG. 3A are denoted by the same reference numerals in FIG. 4. Differing from FIG. 3A, in a structure of FIG. 4, the positions of the organic light emitting elements provided over the first substrate 100 and the organic light emitting element provided over the second substrate 101 are counterchanged.

That is, differing from the structure of FIG. 3A, in FIG. 4, the white organic light emitting element 120 is provided over the first substrate; the red, green, and blue organic light emitting elements 121, 122, and 123 are provided over the second substrate; the first electrode 105 and the second electrode 107 of the white organic light emitting element 120 are formed using transparent conductive films; the second electrodes 108, 111, and 114 of the red, green, and blue organic light emitting elements 121, 122, and 123 are formed using a transparent conductive film; and the first electrodes 110, 113, and 116 of the red, green, and blue organic light emitting elements 121, 122, and 123 are formed by using electrodes having a function of reflecting light.

When a display screen is provided only over the first substrate, a dual emission type organic light emitting element is provided over the first substrate 100, and a top emission type organic light emitting element is provided over the second substrate 101. Therefore, in the structure as shown in FIG. 4, the white organic light emitting element 120 formed over the first substrate is of a dual emission type and the red, green, and blue organic light emitting elements 121, 122, and 123 formed over the second substrate are of a top emission type. Note that, in FIG. 4, arrows indicate directions of light emitted from the respective organic light emitting elements.

Although the case of providing the display screen only over the first substrate is shown in FIG. 3A and FIG. 4, display screens may be formed over both of the first and second substrates.

Figure 5:
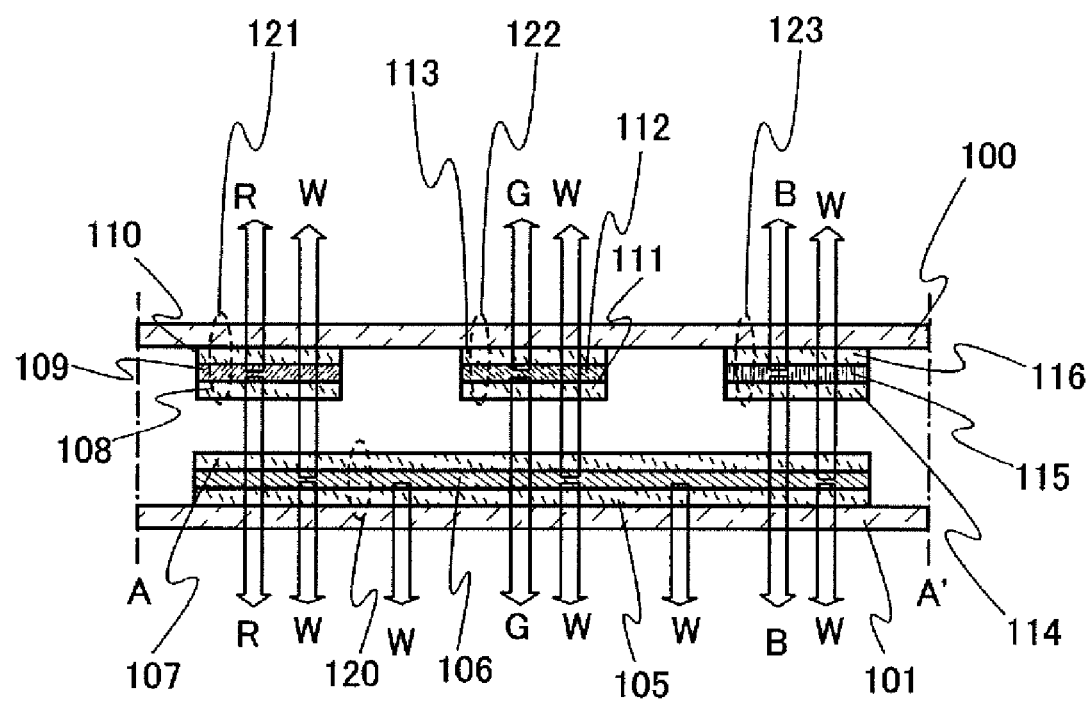
FIG. 5 is a view showing a cross sectional structure of one pixel of a display device described in Embodiment Mode 1.

FIG. 5 shows a structural example in which display screens are formed over both of the first and second substrates. The same portions as those of FIG. 3A are also denoted by the same reference numerals in FIG. 5.

Differing from FIG. 3A, the first electrode 105 of the white organic light emitting element 120 provided over the second substrate 101 is formed using a transparent conductive film in FIG. 5. As shown in FIG. 5, arrows indicate the directions of light emitted from the respective organic light emitting elements.

Since all the first electrodes and the second electrodes of the red, green, and blue organic light emitting elements 121, 122, and 123 provided over the first substrate and the white organic light emitting element 120 provided over the second substrate are formed using transparent conductive films, the red, green, and blue organic light emitting elements 121, 122, and 123 provided over the first substrate and the white organic light emitting element 120 provided over the second substrate are the dual emission type organic light emitting elements. Accordingly, light can be emitted through both of the first and second substrates 100 and 101 as shown in FIG. 5, and hence, display screens can be formed over both of the first and second substrates.

An image recognized on the display screen formed over the first substrate is a mirrored image of an image recognized on the display screen formed over the second substrate. Further, since the first and second substrates are the light transmitting substrates, the display screens are formed such that a viewer can see the view beyond the first and second substrates.

Note that, by providing polarizing plates over the first and second substrates, it is possible to prevent a viewer from seeing the view beyond the first and second substrates on the display screens formed over the first and second substrates.

Embodiment Mode 2

In this embodiment mode, an example according to the case B of the first structure of the present invention will be described. Specifically, a case in which a dot of a white organic light emitting element is provided over a second substrate so as to face a dot of a red organic light emitting element provided over a first substrate, a dot of a white organic light emitting element is provided over the second substrate so as to face a dot of a green organic light emitting element provided over the first substrate, and a dot of a white organic light emitting element is provided over the second substrate so as to face a dot of a blue organic light emitting element provided over the first substrate, will be described. Note that, a case of forming a display screen over the first substrate (that is, an image is displayed on the first substrate side) will be described in this embodiment mode.

Figure 18A:
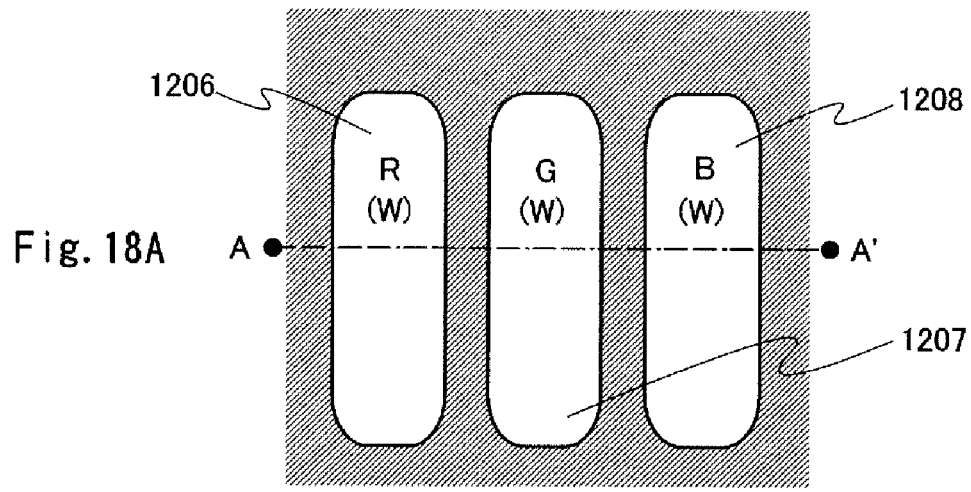
FIGS. 18A to 18C are top views showing a pixel structure of a display device described in Embodiment Mode 2.
Figure 18B:
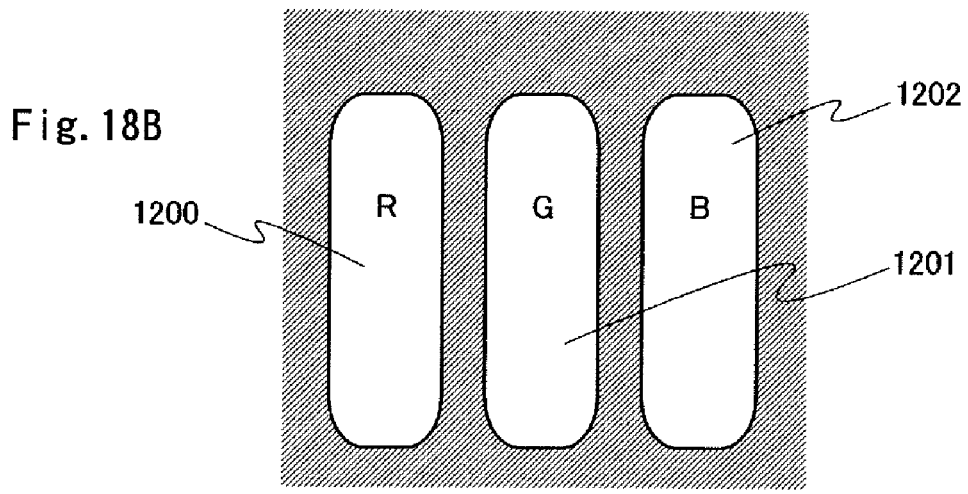
Figure 18C:
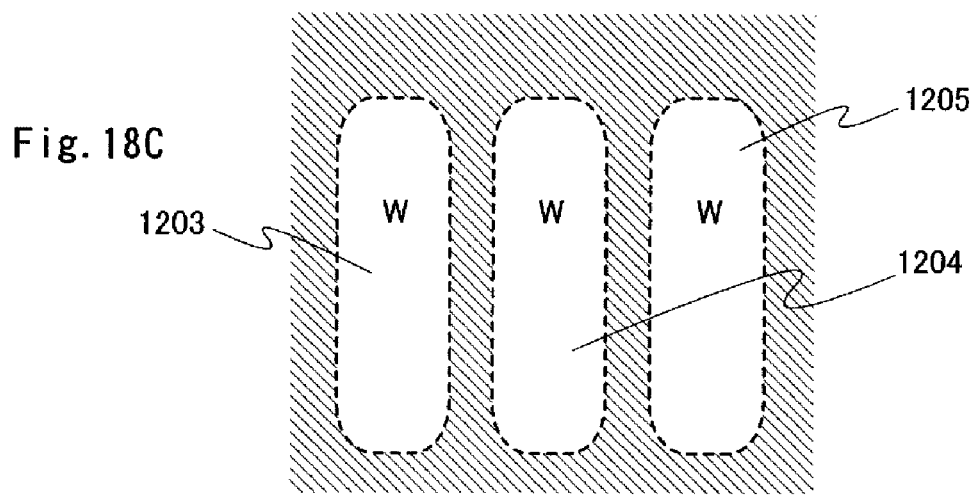

FIGS. 18A to 18C show pixel structures of a display device according to this embodiment mode. FIG. 18A shows a pixel structure as seen from the display screen side, that is, from a viewer side. FIG. 18B shows a pixel structure of the first substrate, and FIG. 18C shows a pixel structure of the second substrate. Each of FIGS. 18B and 18C is a top view as seen from the surface provided with the organic light emitting elements. When the first substrate having the pixel structure shown in FIG. 18B is overlapped with the second substrate having the pixel structure shown in FIG. 18C such that the surfaces provided with the organic light emitting elements of the first and second substrates face one another, the pixel structure as shown in FIG. 18A can be obtained as seen from the display screen 102 side, i.e., from a viewer side. Note that, a wiring and the like are not shown in FIGS. 18A to 18C so as to simply show the overlapped light emitting regions.

In FIG. 18B, reference numeral 1200 indicates a red light emitting region including a red organic light emitting element; 1201, a green light emitting region including a green organic light emitting element; and 1202, a blue light emitting region including a blue organic light emitting element. In FIG. 18C, each of reference numerals 1203, 1204, and 1205 indicates a white light emitting regions including a white organic light emitting element.

Shaded portions in FIGS. 18A and 18B are light shielding regions since a wiring, an element for driving the organic light emitting elements, and the like are formed over the first substrate. A shaded portion in FIG. 18C is a light shielding region since a wiring, an element for driving the organic light emitting element, and the like are formed over the second substrate. In this embodiment mode, the light emitting regions formed over the first substrate has almost the same size as the light emitting regions formed over the second substrate, and both of the light emitting regions are arranged to overlap with each other at the same positions. Accordingly, the light shielding region of the first substrate is formed at almost the same position as the light shielding region of the second substrate.

When the red, green, and blue light emitting regions 1200, 1201, and 1202 provided over the first substrate and the white light emitting regions 1203, 1204, and 1205 provided over the second substrate emit light, a viewer sees three different colored light emitting regions denoted by reference numerals 1206, 1207, and 1208. In this case, reference numeral 1206 is a red light emitting region which is lightened by white light emission. Reference numeral 1207 is a green light emitting region which is lightened by white light emission. Reference numeral 1208 is a blue light emitting region which is lightened by white light emission.

Further, the colors of the light emitting regions over the second substrate are shown in parentheses since the light emitting regions over the first substrate are overlapped with the light emitting regions over the second substrate in reference numerals 1206, 1207, and 1208 in FIG. 18A. Specifically, in reference numeral 1206, "R" and "(W)" indicate that the red light emitting region over the first substrate is overlapped with the white light emitting region over the second substrate. In reference numeral 1207, "G" and "(W)" indicate that the green light emitting region over the first substrate is overlapped with the white light emitting region over the second substrate. In reference numeral 1208, "B" and "(W)" indicate that the blue light emitting region over the first substrate is overlapped with the white light emitting region over the second substrate.

In the case of making only the red light emitting region 1200 over the first substrate emit light, reference numeral 1206 becomes a red light emitting region, whereas in the case of making only the white light emitting region 1203 over the second substrate emit light, reference numeral 1206 becomes a white light emitting region. In the case of making only the green light emitting region 1201 over the first substrate emit light, reference numeral 1207 becomes a green light emitting region, whereas in the case of making only the white light emitting region 1204 over the second substrate emit light, reference numeral 1207 becomes a white light emitting region. In the case of making only the blue light emitting region 1202 over the first substrate emit light, reference numeral 1208 becomes a blue light emitting region, whereas in the case of making only the white light emitting region 1205 over the second substrate emit light, reference numeral 1208 becomes a white light emitting region.

Figure 19:
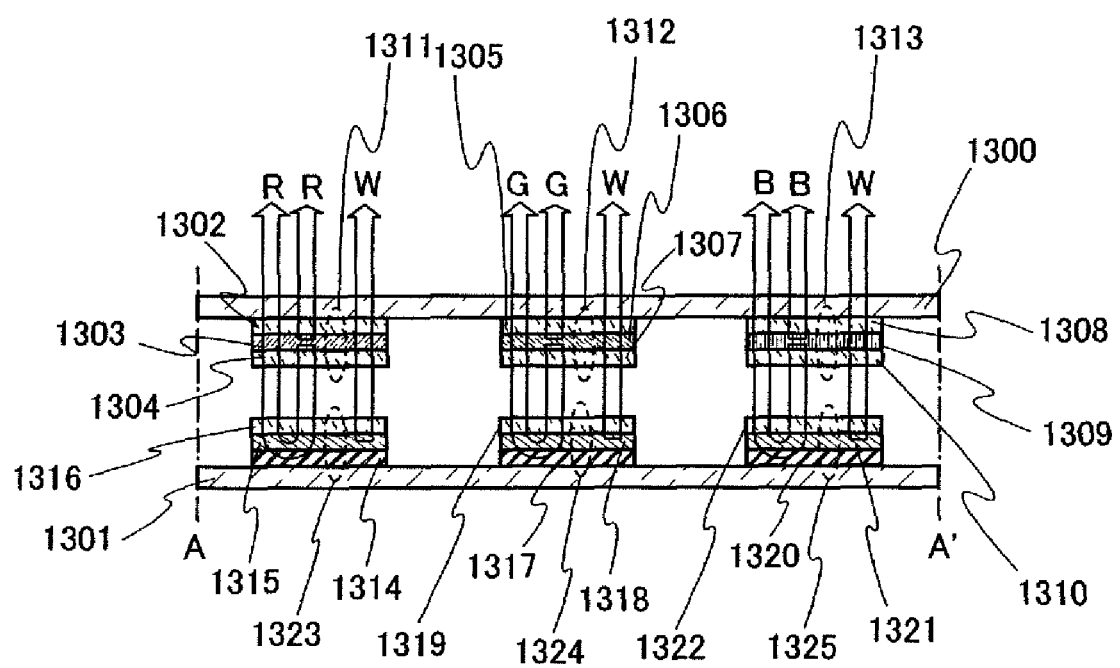
FIG. 19 is a view showing a cross sectional structure of one pixel of a display device described in Embodiment Mode 2.

FIG. 19 is a cross sectional view along a line A-A of FIG. 18A. FIG. 19 is a schematic cross sectional view to simply show a cross sectional structure of a display device according to the present invention. Only red, green, and blue organic light emitting elements provided over a first substrate and white organic light emitting elements provided over a second substrate, are shown.

In FIG. 19, a red (R) organic light emitting element 1311, a green (G) organic light emitting element 1312, and a blue (B) organic light emitting element 1313 are provided over a first substrate 1300 whereas white organic light emitting elements 1323, 1324, and 1325 are provided over a second substrate 1301. As shown in FIG. 19, the first substrate 1300 and the second substrate 1301 are attached to each other such that the red organic light emitting element 1311 provided over the first substrate faces the white organic light emitting element 1323 provided over the second substrate, the green organic light emitting element 1312 provided over the first substrate faces the white organic light emitting element 1324 provided over the second substrate, and the blue organic light emitting element 1313 provided over the first substrate faces the white organic light emitting element 1325 provided over the second substrate.

By forming such the structure, the second substrate 1301 serves as a counter substrate with respect to the first substrate 1300 whereas the first substrate 1300 serves as a counter substrate with respect to the second substrate 1301, and the organic light emitting elements can be sealed with only the first and second substrates 1300 and 1301. Therefore, the display device of the present invention can have almost the same thickness as a normal display device in which an organic light emitting element is provided over one substrate and sealed with a counter substrate.

The organic light emitting elements 1311, 1312, and 1313 provided over the first substrate 1300 have a dual emission structure in which the organic light emitting elements 1311, 1312, and 1313 emit light toward a surface of the first substrate over which the organic light emitting elements 1311, 1312, and 1313 are provided and toward the other surface of the first substrate opposite to the surface of the first substrate over which the organic light emitting elements are provided. Meanwhile, the white organic light emitting elements 1323, 1324, and 1325 provided over the second substrate 1301 has a top emission structure in which the white organic light emitting elements 1323, 1324, and 1325 emit light toward a surface of the second substrate over which the white organic light emitting elements are provided. Further, arrows indicate the directions of light emitted from the respective organic light emitting elements in FIG. 19.

By employing such the structure, light generated in the white organic light emitting elements 1323, 1324, and 1325 and the red, green, and blue organic light emitting elements 1311, 1312, and 1313 can be emitted toward the surface of the first substrate 1300 opposite to the other surface of the first substrate over which the red, green, and blue organic light emitting elements 1311, 1312, and 1313 are provided. That is, a display screen can be formed over the surface of the first substrate 1300 opposite to the other surface of the first substrate 1300 over which the red, green, and blue organic light emitting elements 1311, 1312, and 1313 are provided.

The red organic light emitting element 1311 includes a first electrode 1302, a second electrode 1304, and a layer 1303 containing an organic compound sandwiched between the first electrode 1302 and the second electrode 1304. The green organic light emitting element 1312 includes a first electrode 1305, a second electrode 1307, and a layer 1306 containing an organic compound sandwiched between the first electrode 1305 and the second electrode 1307. The blue organic light emitting element 1313 includes a first electrode 1308, a second electrode 1310, and a layer 1309 containing an organic compound sandwiched between the first electrode 1308 and the second electrode 1310.

The first electrodes 1302, 1305, and 1308 and the second electrodes 1304, 1307, and 1310 of the red, green, and blue organic light emitting elements 1311, 1312, and 1313 are formed using transparent conductive films made from indium tin oxide (ITO), indium zinc oxide (IZO) in which indium oxide contains zinc oxide, and the like. The materials used as the transparent conductive films are not particularly limited to the above mentioned materials, and a thin metal film and the like can be used in addition to the above materials.

Further, the first electrode 1302 of the red organic light emitting element 1311, the first electrode 1305 of the green organic light emitting element 1312, and the first electrode 1308 of the blue organic light emitting element 1313 are formed by patterning the same transparent conductive film. Also, the second electrode 1304 of the red organic light emitting element 1311, the second electrode 1307 of the green organic light emitting element 1312, and the second electrode 1310 of the blue organic light emitting element 1313 are formed by pattering the same transparent conductive film.

By forming the first and second electrodes of each organic light emitting element with the transparent conductive films, each organic light emitting element can be of a dual emission type.

The white organic light emitting element 1323 includes a first electrode 1314, a second electrode 1316, and a layer 1315 containing an organic compound sandwiched between the first electrode 1314 and the second electrode 1316. The white organic light emitting element 1324 includes a first electrode 1317, a second electrode 1319, and a layer 1318 containing an organic compound sandwiched between the first electrode 1317 and the second electrode 1319. The white organic light emitting element 1325 includes a first electrode 1320, a second electrode 1322, and a layer 1321 containing an organic compound sandwiched between the first electrode 1320 and the second electrode 1321.

As the first electrodes 1314, 1317, and 1320 of the white organic light emitting elements 1323, 1324, and 1325, electrodes having a function of reflecting light are preferably used. When the first electrodes 1314, 1317, and 1320 of the white organic light emitting elements 1323, 1324, and 1325 have a function of reflecting light, light emitted toward the second substrate 1301 from the red, green, and blue organic light emitting elements 1311, 1312, and 1313 can be reflected by the first electrodes 1314, 1317, and 1320 of the white organic light emitting elements 1323, 1324, and 1325. Thus, light generated in the red, green, and blue organic light emitting elements 1311, 1312, and 1313 can be efficiently utilized.

In the structure shown in this embodiment mode, luminance of white light emission overlapped with red, green, or blue light emission can be individually controlled. That is, brightness of red, green, and blue can be individually controlled in each pixel. Therefore, for example, when luminance of light emitted from a white light emitting region positioned to be overlapped with a red light emitting region as seen from a viewer side, is increased, that is, when the luminance of only the white organic light emitting element provide to face the red organic light emitting element is increased, brightness of only red emission can be increased so that a pink color can be displayed.

Further, in the case where a dot of a white organic light emitting element is provided over the second substrate so as to face a dot of a red organic light emitting element provided over a first substrate, a dot of another white organic light emitting element is provided over the second substrate so as to face a dot of a green organic light emitting element provided over the first substrate, and a dot of another white organic light emitting element is provided over the second substrate so as to face a dot of a blue organic light emitting element provided over the first substrate, when all of the white organic light emitting elements provided to face each of the red, green, and blue organic light emitting elements has the same luminance, brightness of an entire display screen can be controlled as well as Embodiment Mode 1.

In the display device of this embodiment mode, since white dots are arranged to be overlapped with red, green, and blue dots, only a white color can be displayed by making only the white organic light emitting elements emit light while making the red, green, and blue organic light emitting elements emit no light.

In the display device of this embodiment mode, in order to display only a white color, one pixel includes one white dot. Accordingly, since the white dots are provided to overlap with the red, green, and blue dots respectively, when display is performed by only the white dots, the number of pixels is three times as high as a case of performing color display, and therefore, high resolution images can be displayed.

In addition, when performing only white display, the number of pixels is three times as high as Embodiment Mode 1, and therefore, high resolution images can be displayed. As a consequence, the structure of Embodiment Mode 2 is more preferable than that of Embodiment Mode 1.

In a normal display device performing color display by using red, green, and blue dots as one pixel, a white color is displayed by making the red, green, and blue dots emit light. However, in the display device of this embodiment mode, since the white organic light emitting elements are formed over the substrate different from the substrate over which the red, green, and blue organic light emitting elements are formed, one pixel can be displayed by making only the white organic light emitting element emit light. As compared to the case of displaying a white color by making the red, green, and blue dots emit light, the power consumption can be reduced.

Furthermore, in the case where white organic light emitting elements are formed over the same substrate as red, green, and blue organic light emitting elements, the number of dots formed over one substrate is increased, which results in reduction of the number of pixels. However, in the structure of this embodiment mode, since the white organic light emitting elements are formed over the substrate different from the substrate over which the red, green, and blue organic light emitting elements are formed, both of color display and only white display can be performed without reducing the number of pixels. Also, when displaying only the white color, the power consumption can be reduced.

Although an example in which the red, green, and blue organic light emitting elements are formed over the first substrate, the white organic light emitting elements are formed over the second substrate, and the display screen is formed over the first substrate, is shown in this embodiment mode, the present invention is not limited thereto.

For example, the positions of the organic light emitting elements provided over the first substrate and the organic light emitting elements provided over the second substrate, may be counterchanged. Specifically, the white organic light emitting elements may be provided over the first substrate whereas the red, green, and blue organic light emitting elements may be provided over the second substrate.

Further, display screens may be provided over both of the first and second substrates. In this case, dual emission type organic light emitting elements may be provided over both of the first and second substrates. Specifically, first electrodes and second electrodes of the organic light emitting elements provided over both of the first and second substrates may be formed using transparent conductive films.

Embodiment Mode 3

In the first structure of the present invention, a case where red and green organic light emitting elements are provided over a first substrate and blue and white organic light emitting elements are provided over a second substrate, will be described in this embodiment mode.

Figure 27A:
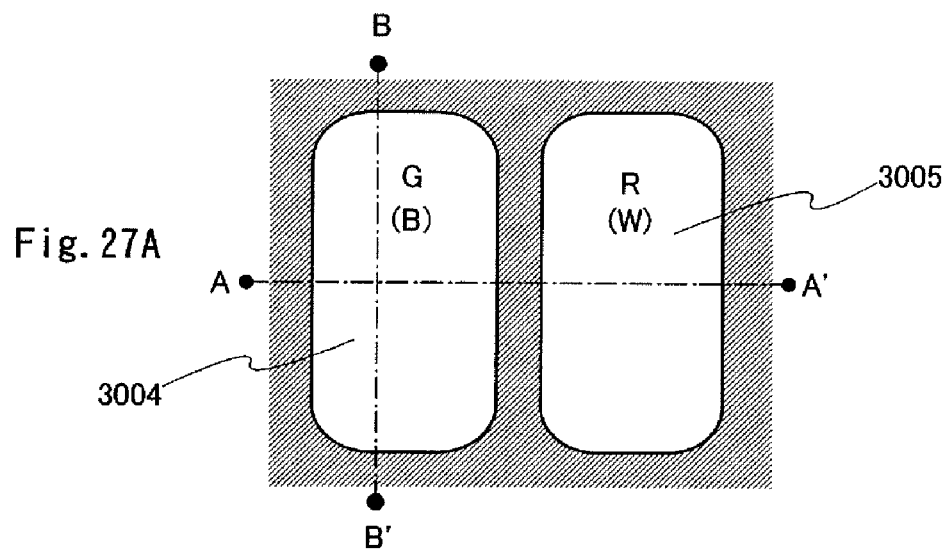
FIGS. 27A to 27C are top views showing a pixel structure of a display device described in Embodiment 3.
Figure 27B:
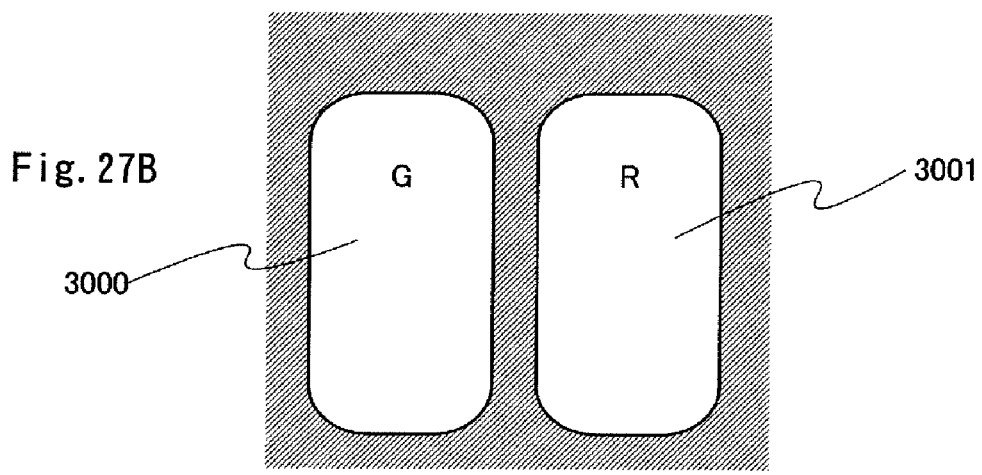
Figure 27C:
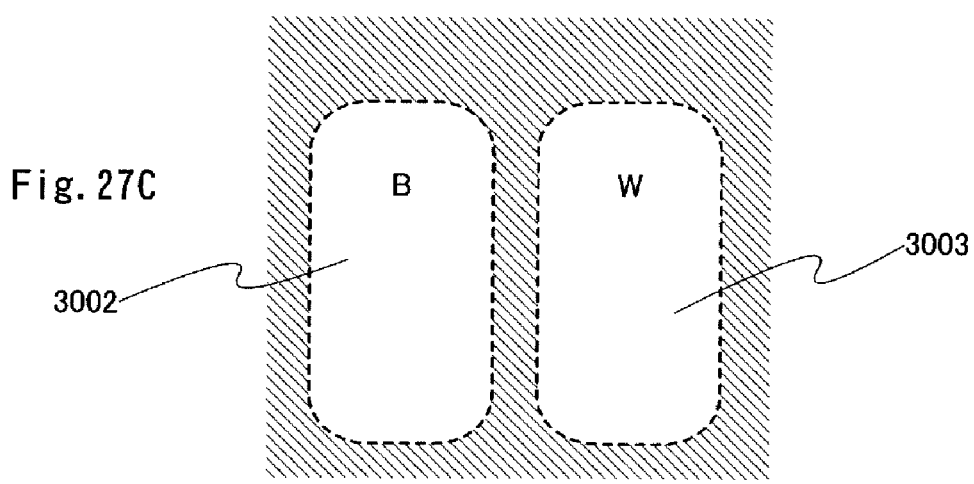

FIGS. 27A to 27C show pixel structures of a display device according to this embodiment mode. FIG. 27A shows a pixel structure as seen from a display screen side, that is, from a viewer side. FIG. 27B shows a pixel structure of the first substrate, and FIG. 27C shows a pixel structure of the second substrate. Each of FIGS. 27B and 27C is a top view as seen from the surface provided with the organic light emitting elements. When the first substrate having the pixel structure shown in FIG. 27B is overlapped with the second substrate having the pixel structure shown in FIG. 27C such that the organic light emitting elements provided over the first and second substrates face one another, the pixel structure as shown in FIG. 27A can be obtained as seen from the display screen 102 side, i.e., from a viewer side. Note that, a wiring and the like are not shown in FIGS. 27A to 27C so as to simply show the overlapped light emitting regions.

In FIG. 27B, reference numeral 3000 indicates a green light emitting region including a green organic light emitting element; and 3001, a red light emitting region including a red organic light emitting element. In FIG. 27C, reference numeral 3002 indicates a blue light emitting region including a blue organic light emitting element; and 3003, a white light emitting region including a white organic light emitting element.

Shaded portions in FIGS. 27A and 27B are light shielding regions since a wiring, an element for driving the organic light emitting elements, and the like are formed over the first substrate. A shaded portion in FIG. 27C is also a light shielding region since a wiring, an element for driving the organic light emitting elements, and the like are formed over the second substrate. In this embodiment mode, the light emitting regions formed over the first substrate has almost the same size as the light emitting regions provided over the second substrate, and these light emitting regions are arranged to overlap with one another at the same positions. Accordingly, the light shielding region of the first substrate is formed at almost the same position as the light shielding region of the second substrate.

When the green light emitting region 3000 and the red light emitting region 3001 provided over the first substrate, and the blue light emitting region 3002 and the white light emitting region 3003 provided over the second substrate emit light, a viewer sees two different colored light emitting regions denoted by reference numerals 3004 and 3005. In this case, a mixed colored light emitting region in which blue and green are mixed, is formed in reference numeral 3004. A red light emitting region which is lightened by white light emission, is formed in reference numeral 3005.

Note that, the colors of the light emitting regions over the second substrate are shown in parentheses of FIG. 27A since the light emitting regions formed over the first substrate are overlapped with the light emitting regions formed over the second substrate at the same positions. That is, in reference numeral 3004, "G" and "(B)" indicate that the green light emitting region over the first substrate is overlapped with the blue light emitting region over the second substrate. In reference numeral 3005, "R" and "(W)" indicate that the red light emitting region over the first substrate is overlapped with the white light emitting region over the second substrate.

In the case of making only the green light emitting region 3000 over the first substrate emit light, reference numeral 3004 becomes a green light emitting region, whereas in the case of making only the blue light emitting region 3002 over the second substrate emit light, reference numeral 3004 becomes a blue light emitting region. In the case of making only the red light emitting region 3001 over the first substrate emit light, reference numeral 3005 becomes a red light emitting region, whereas in the case of making only the white light emitting region 3003 over the second substrate emit light, reference numeral 3005 becomes a white light emitting region.

Figure 28A:
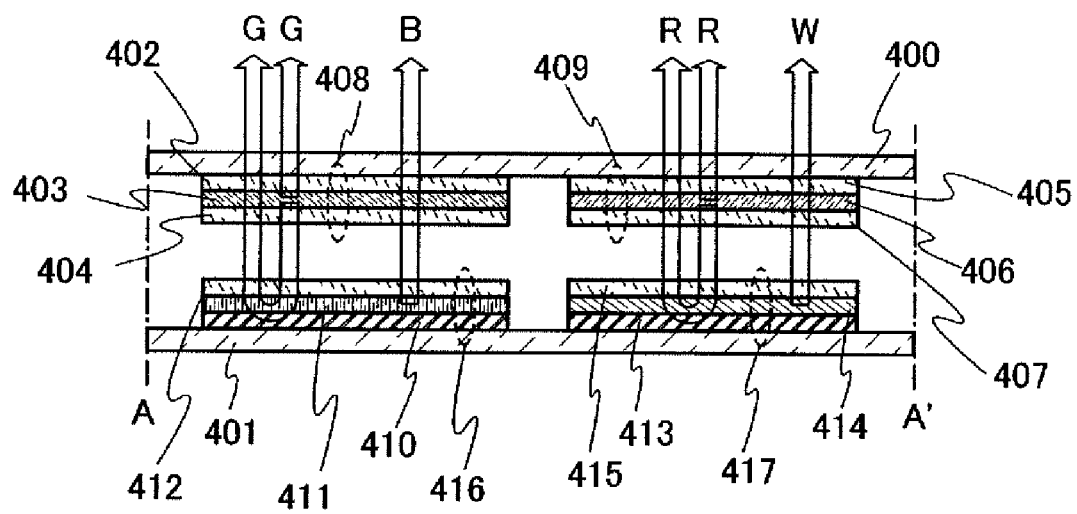
FIGS. 28A and 28B are cross sectional views showing one pixel of a display device described in Embodiment Mode 3.
Figure 28B:
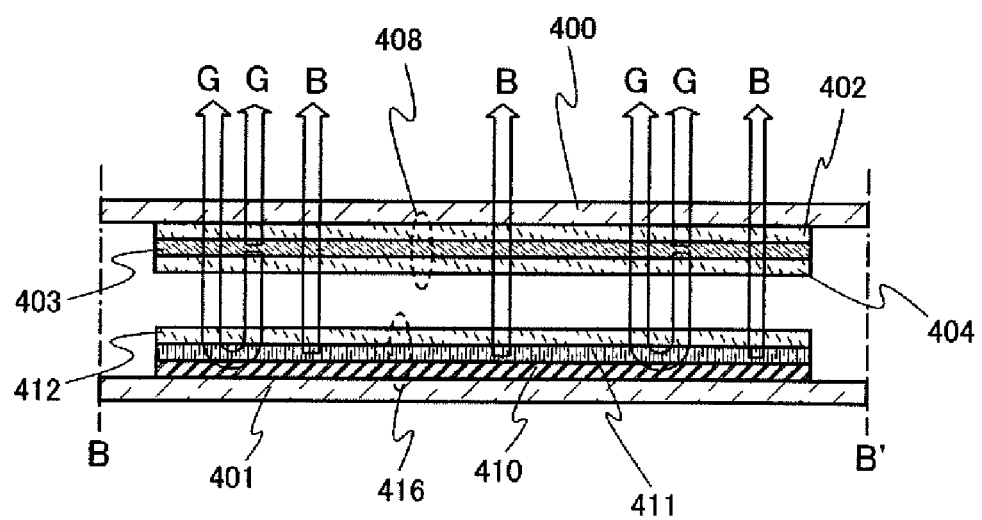

Cross sectional views of the pixel structures shown in FIGS. 27A to 27C are shown in FIGS. 28A and 28B. FIG. 28A is a cross sectional view along a line A-A' of FIG. 27A, and FIG. 28B is a cross sectional view along a line B-B' of FIG. 27A. The cross sectional views shown in FIGS. 28A and 28B are provided to simply show positional relations of the organic light emitting elements provided over the first and second substrates in the display device of the present invention. Therefore, only the red and green organic light emitting elements provided over the first substrate and the blue and white organic light emitting elements provided over the second substrate are shown in FIGS. 28A and 28B.

In FIG. 28A, a green (G) organic light emitting element 408 and a red (R) organic light emitting element 409 are provided over a first substrate 400 whereas a blue (B) organic light emitting element 416 and a white (W) organic light emitting element 417 are provided over a second substrate 401. As shown in FIG. 28A, the first substrate 400 and the second substrate 401 are attached to each other such that the green organic light emitting element 408 provided over the first substrate faces the blue organic light emitting element 416 provided over the second substrate whereas the red organic light emitting element 409 provided over the first substrate faces the white organic light emitting element 417 provided over the second substrate.

By forming such the structure, the second substrate 401 serves as a counter substrate with respect to the first substrate 400 whereas the first substrate 400 serves as a counter substrate with respect to the second substrate 401, and the organic light emitting elements can be sealed with only the first and second substrates 400 and 401. Therefore, the display device of the present invention can have almost the same thickness as a normal display device in which an organic light emitting element is formed over only one substrate and sealed with a counter substrate.

The organic light emitting elements 408 and 409 provided over the first substrate 400 have a dual emission structure in which the organic light emitting elements emit light toward a surface of the first substrate 400 over which the organic light emitting elements 408 and 409 are provided and toward the other surface of the first substrate 400 opposite to the surface over which the organic light emitting elements are provided, i.e., toward the second substrate 401. Meanwhile, the organic light emitting elements 416 and 417 provided over the second substrate 401 have a top emission structure in which the organic light emitting elements 416 and 417 emit light toward a surface of the second substrate 401 over which the organic light emitting elements 416 and 417 are provided, i.e., toward the first substrate 400. Further, arrows indicate the directions of light emitted from the respective organic light emitting elements in FIGS. 28A and 28B.

The green organic light emitting element 408 includes a first electrode 402, a second electrode 404, and a layer 403 containing an organic compound sandwiched between the first electrode 402 and the second electrode 404. The red organic light emitting element 409 includes a first electrode 405, a second electrode 407, and a layer 406 containing an organic compound sandwiched between the first electrode 405 and the second electrode 407. The blue organic light emitting element 416 includes a first electrode 410, a second electrode 412, and a layer 411 containing an organic compound sandwiched between the first electrode 410 and the second electrode 412. The white organic light emitting element 417 includes a first electrode 413, a second electrode 415, and a layer 414 containing an organic compound sandwiched between the first electrode 413 and the second electrode 415.

The first electrodes 402 and 405 and the second electrodes 404 and 407 of the green and red organic light emitting elements 408 and 409, the second electrodes 412 and 415 of the blue and white organic light emitting elements 416 and 417 are respectively formed using transparent conductive films made from indium tin oxide (ITO), indium zinc oxide (IZO) in which indium oxide contains zinc oxide, and the like. Further, the first electrode 402 of the green organic light emitting element 408 and the first electrode 405 of the red organic light emitting element 409 are formed by patterning the same transparent conductive film. The second electrode 404 of the green organic light emitting element 408 and the second electrode 407 of the red organic light emitting element 409 are formed by pattering the same transparent conductive film. Also, the second electrode 412 of the blue organic light emitting element 416 and the second electrode 415 of the white organic light emitting element 417 are formed by pattering the same transparent conductive film.

By forming the first and second electrodes for each organic light emitting element provided over the first substrate 400 with the transparent conductive films, each organic light emitting element can be of a dual emission type.

As the first electrodes 410 and 413 of the blue and white organic light emitting elements 416 and 417, electrodes having a function of reflecting light are preferably used. When the first electrodes 410 and 413 of the blue and white organic light emitting elements 416 and 417 have a function of reflecting light, light emitted toward the second substrate 401 from the green and red organic light emitting elements 408 and 409 can be reflected by the first electrodes 410 and 413 of the blue and white organic light emitting elements 416 and 417. Thus, light emitted from the green and red organic light emitting elements 408 and 409 can be efficiently utilized.

Further, in FIGS. 27A to 27C and FIGS. 28A and 28B, all of the light emitting regions of the organic light emitting elements have the same area; however, the light emitting regions of the organic light emitting elements may have different areas from one another depending on their colors.

Figure 6A:
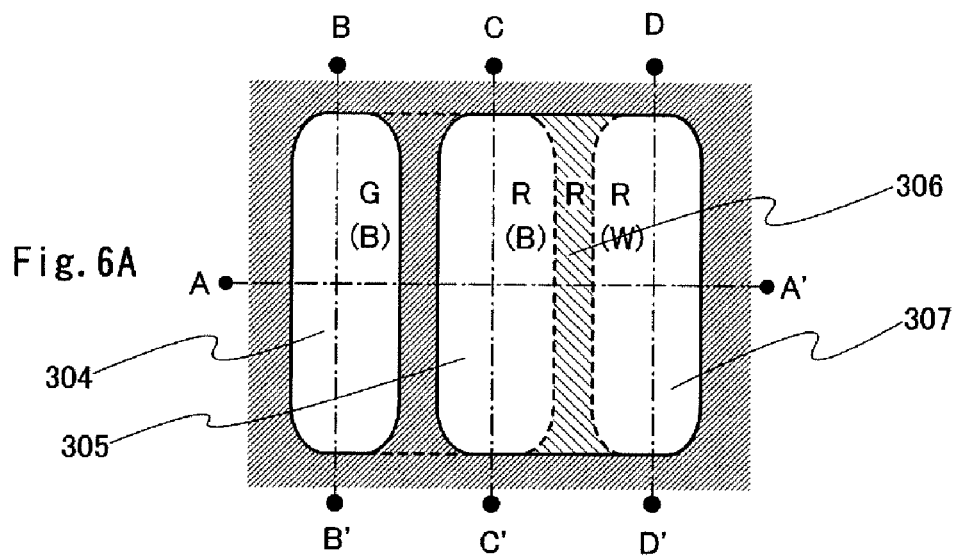
FIGS. 6A to 6C are top views showing a pixel structure of a display device described in Embodiment Mode 3.
Figure 6B:
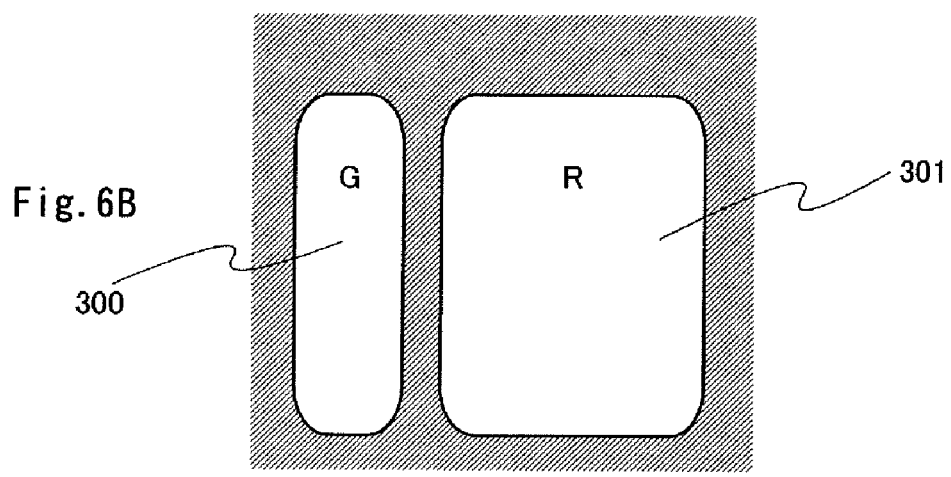
Figure 6C:
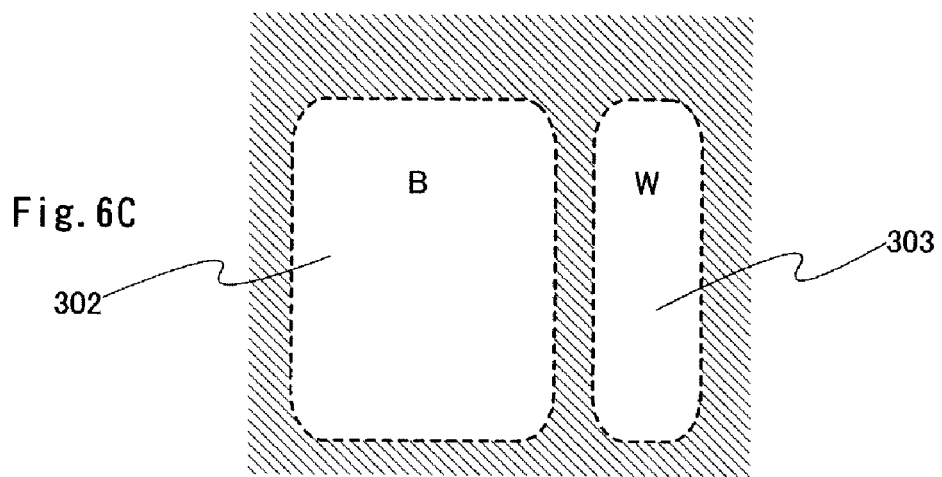

FIGS. 6A to 6C shows pixel structures of a display device in the case where areas of light emitting regions of organic light emitting elements are different from one another depending on colors. FIG. 6A shows a pixel structure as seen from the display screen side, that is, from a viewer side. FIG. 6B shows a pixel structure of a first substrate, and FIG. 6C shows a pixel structure of a second substrate. When the first substrate having the pixel structure shown in FIG. 6B is overlapped with the second substrate having the pixel structure shown in FIG. 6C such that the organic light emitting elements provided over the first and second substrates face one another, the pixel structure as shown in FIG. 6A can be obtained as seen from a display screen side, i.e., from a viewer side. Each of FIGS. 6B and 6C is a top view as seen from the surface provided with the organic light emitting elements.

In FIG. 6B, reference numeral 300 indicates a green light emitting region including a green organic light emitting element; and 301, a red light emitting region including a red organic light emitting element. In FIG. 6C, reference numeral 302 indicates a blue light emitting region including a blue organic light emitting element; and 303, a white light emitting region including a white organic light emitting element. Note that, a wiring and the like are not shown in FIGS. 6A to 6C so as to simply show the overlapped light emitting regions.

Differing from the structures shown in FIGS. 27A and 27B, areas of light emitting regions of the red and blue organic light emitting elements are larger than areas of light emitting regions of the green and white organic light emitting elements. In the example shown in FIGS. 6A to 6C, since the areas of the light emitting regions of the red and blue organic light emitting elements are larger than the areas of the light emitting regions of the green and white organic light emitting elements, a part of the light emitting region 301 of the red organic light emitting element is overlapped with a part of the light emitting region 302 of the blue organic light emitting element as seem from a viewer side.

Shaded portions in FIGS. 6A and 6B are light shielding regions since a wiring, an element for driving the organic light emitting elements, and the like are formed over the first substrate. A shaded portion in FIG. 6C is also a light shielding region since a wiring, an element for driving the organic light emitting elements, and the like are formed over the second substrate. Therefore, when the first substrate overlapped with the second substrate is seen from the first substrate side (a viewer side), light emitted from the organic light emitting elements formed over the second substrate is shielded in a region other than the green light emitting region 300 and the red light emitting region 301 provided over the first substrate. Thus, when a viewer sees the superimposed first and second substrates from the first substrate side, light emitted from the blue light emitting region 302 provided over the second substrate is partly shielded by the light shielding region of the first substrate.

When the green light emitting region 300 and the red light emitting region 301 provided over the first substrate, and the blue light emitting region 302 and the white light emitting region 303 provided over the second substrate emit light, a viewer sees four different colored light emitting regions denoted by reference numerals 304, 305, 306, and 307. In this case, a mixed colored light emitting region in which blue and green are mixed, is formed in reference numeral 304. A mixed colored light emitting region in which red and blue are mixed, is formed in reference numeral 305. A red light emitting region is formed in reference numeral 306. A mixed colored light emitting region in which red and white are mixed, is formed in reference numeral 307.

Further, the colors of the light emitting regions over the second substrate are shown in parentheses in reference numerals 304, 305, 306, and 307 of FIG. 6A. Specifically, in reference numeral 304, "G" and "(B)" indicate that the green light emitting region over the first substrate is overlapped with the blue light emitting region over the second substrate. In reference numeral 305, "R" and "(B)" indicate that the red light emitting region over the first substrate is overlapped with the blue light emitting region over the second substrate. In reference numeral 306, "R" indicates that there is only a part of the red light emitting region provided over the first substrate. In reference numeral 307, "R" and "(W)" indicate that the red light emitting region over the first substrate is overlapped with the white light emitting region over the second substrate.

In the case of making only the green light emitting region 300 over the first substrate emit light, reference numeral 304 becomes a green light emitting region, whereas in the case of making only the red light emitting region 301 over the first substrate emit light, reference numerals 305, 306, and 307 become red light emitting regions. In the case of making only the blue light emitting region 302 over the second substrate emit light, reference numerals 304 and 305 become blue light emitting regions, whereas in the case of making only the white light emitting region 303 over the second substrate emit light, reference numeral 307 becomes a white light emitting region.

Figure 7A:
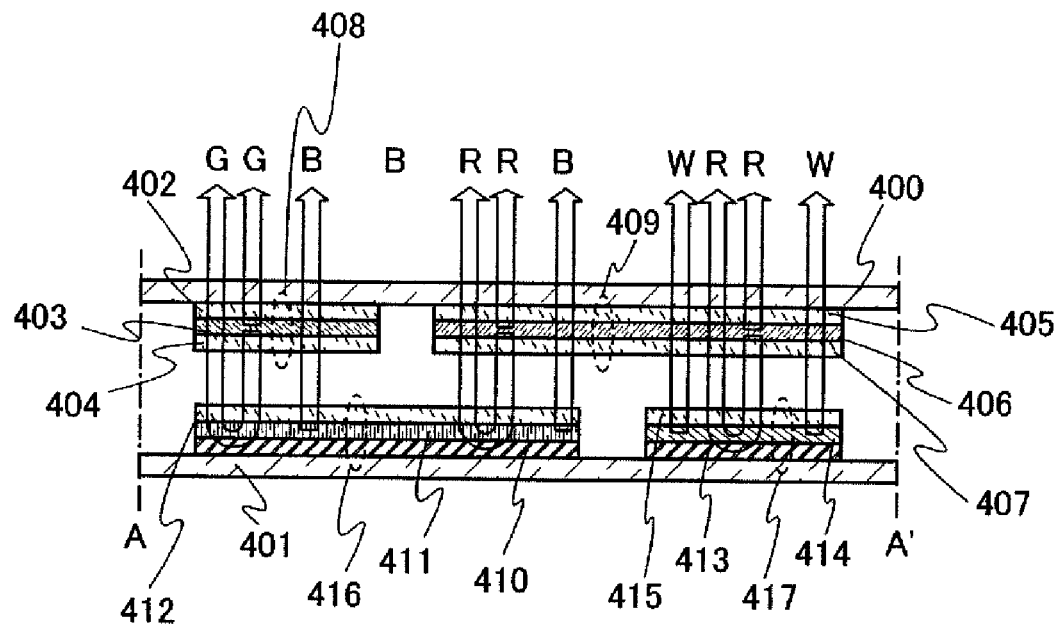
FIGS. 7A and 7B are cross sectional views showing one pixel of a display device described in Embodiment Mode 3.
Figure 7B:
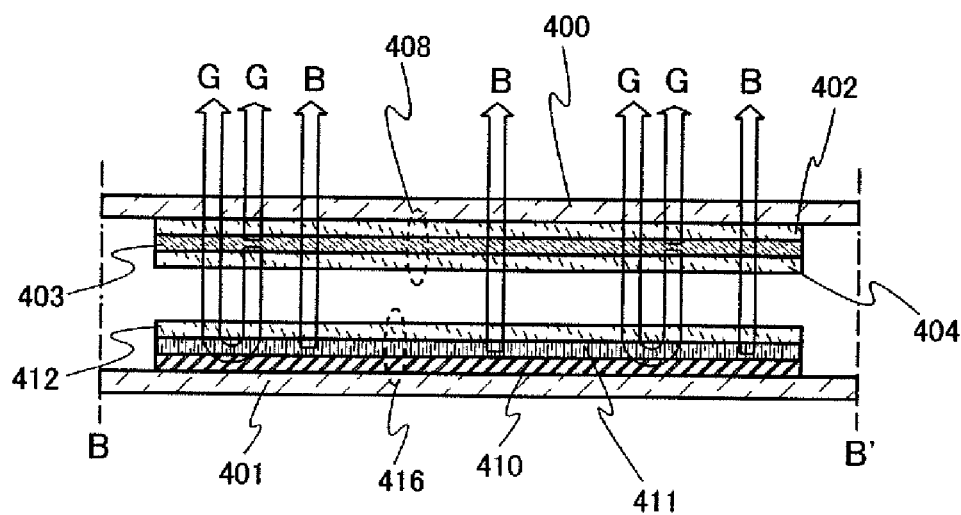
Figure 8A:
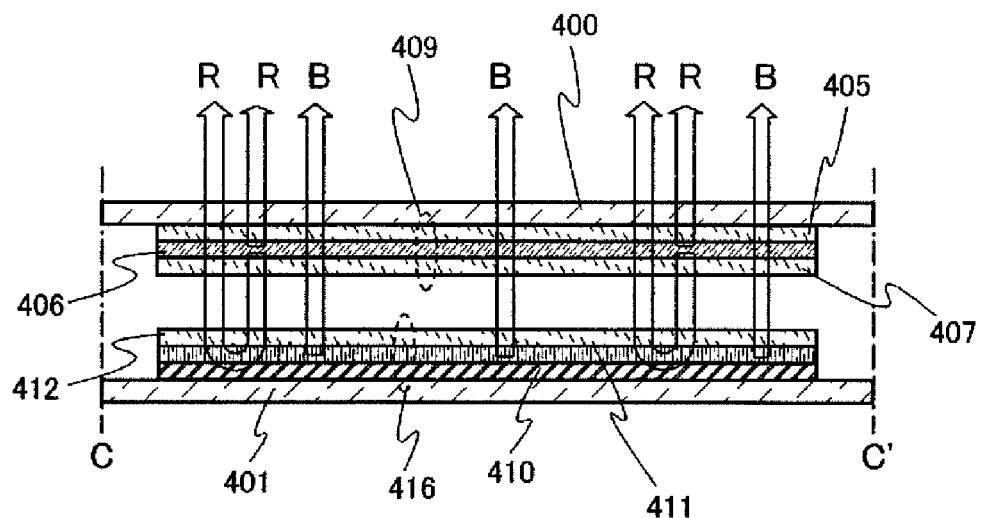
FIGS. 8A and 8B are cross sectional views showing one pixel of a display device described in Embodiment Mode 3.
Figure 8B:
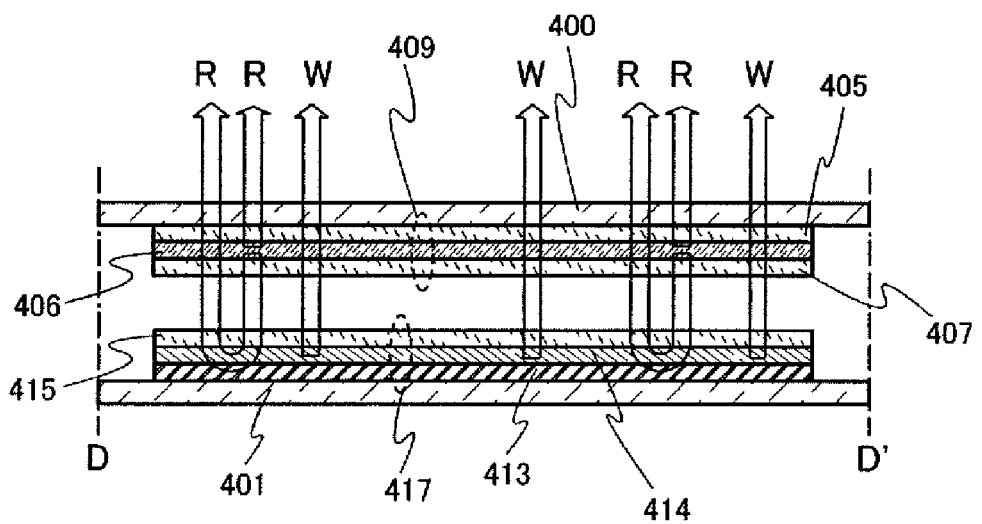

Cross sectional views of the pixel structures shown in FIGS. 6A to 6C are shown in FIGS. 7A and 7B and FIGS. 8A and 8B. FIG. 7A is a cross sectional view along a line A-A' of FIG. 6A, and FIG. 7B is a cross sectional view along a line B-B' of FIG. 6A. FIG. 8A is a cross sectional view along a line C-C' of FIG. 6A, and FIG. 8B is a cross sectional view along a line D-D' of FIG. 6A. FIGS. 7A and 7B and FIGS. 8A and 8B are schematic cross sectional views simply showing cross sectional structures of a display device according to the present invention, and each of the drawings shows only a first substrate, green and red organic light emitting elements provided over the first substrate, a second substrate, and blue and white organic light emitting elements provided over the second substrate. In FIGS. 7A and 7B and FIGS. 8A and 8B, the same portions as those of FIGS. 28A and 28B are denoted by the same reference numerals.

In FIG. 7A, a green (G) organic light emitting element 408, and a red (R) organic light emitting element 409 are provided over a first substrate 400 whereas a blue (B) organic light emitting element 416 and a white (W) organic light emitting element 417 are provided over a second substrate 401. As shown in FIG. 7A, the first substrate 400 and the second substrate 401 are attached to each other such that the green organic light emitting element 408 provided over the first substrate 400 faces the blue organic light emitting element 416 provided over the second substrate 401 whereas the red organic light emitting element 409 provided over the first substrate faces a part of the blue organic light emitting element 416 and the white organic light emitting element 417 provided over the second substrate. Note that arrows indicate directions of light emitted from the respective organic light emitting elements.

Since the visibility of red and blue is lower than that of green, and therefore, when areas of light emitting regions of the red and blue organic light emitting elements are set larger than an area of a light emitting region of the green organic light emitting element, it is possible to balance the red, green, and blue colors. In addition, since the white organic light emitting element is also provided over the second substrate, brightness of a display screen can be controlled. Moreover, since two colored organic light emitting elements are provided over each of the first and second substrates, as compared to a case of providing three colored organic light emitting elements over a substrate, wherein the number of pixels provided over the substrate is the same as the number of pixels provided over the first and second substrates, the number of elements required for driving the organic light emitting elements provided for each dot can be reduced. As a consequence, aperture ratio can be improved.

The cross sectional structures along the lines B-B', C-C', and D-D' of FIG. 6A will hereinafter be described. As shown in FIG. 7B, it is known that the green organic light emitting element 408 provided over the first substrate 400 faces the blue organic light emitting element 416 provided over the second substrate 401 in the line B-B' of FIG. 6A.

As shown in FIG. 8A, it is known that the red organic light emitting element 409 provided over the first substrate 400 faces the blue organic light emitting element 416 provided over the second substrate 401 in the line C-C' of FIG. 6A.

As shown in FIG. 8B, it is known that the red organic light emitting element 409 provided over the first substrate 400 faces the white organic light emitting element 417 provided over the second substrate 401 in the line D-D' of FIG. 6A.

The case in which the red and green organic light emitting elements are provided over the first substrate whereas the blue and white organic light emitting elements are provided over the second substrate, is described in this embodiment mode; however, the present invention is not limited thereto. The area of the light emitting regions of the red and blue organic light emitting elements having lower visibility than the green, can be set larger than the area of the light emitting region of the green organic light emitting element so as to balance the red, green, and blue colors. Therefore, either the red organic light emitting element or the blue organic light emitting element may be provided over the same substrate as the green organic light emitting element. Also, the positions of the green and white organic light emitting elements may be counterchanged. That is, the red and white organic light emitting elements may be provided over the first substrate whereas the blue and green organic light emitting elements may be provided over the second substrate.

Note that the respective organic light emitting elements are arranged such that the green organic light emitting element 408 provided over the first substrate 400 faces a part of the blue organic light emitting element 416 provided over the second substrate 401, and the red organic light emitting element 409 provided over the first substrate faces a part of the blue organic light emitting element and the white organic light emitting element 417 provided over the second substrate in FIGS. 6A to 6C, FIGS. 7A and 7B, and FIGS. 8A and 8B; however, the present invention is not limited to this arrangement. For example, the green organic light emitting element may face the white organic light emitting element whereas the red organic light emitting element may face the blue organic light emitting element. Further, for example, the organic light emitting elements provided over the second substrate can be provided to be rotated ±90 degrees.

Figure 9A:
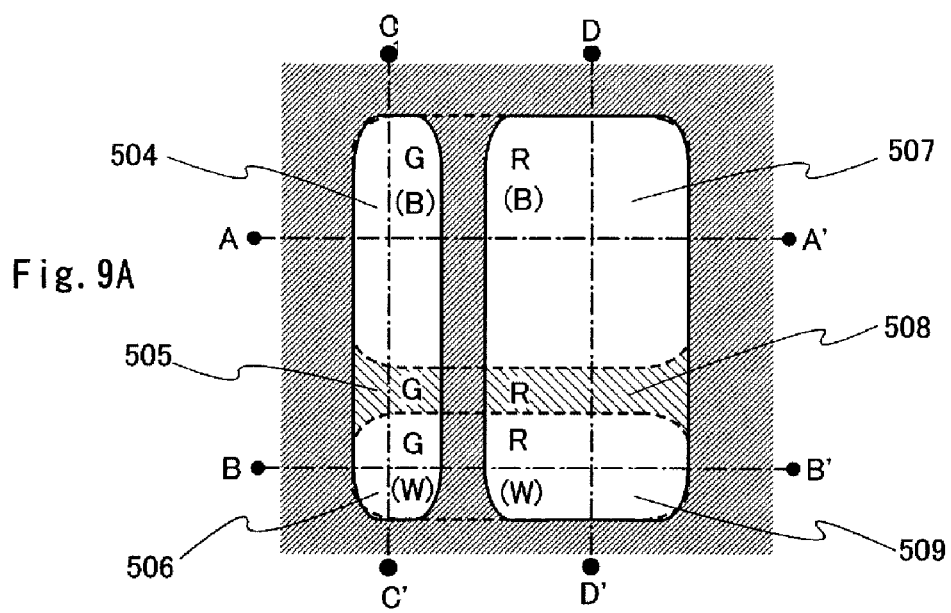
FIGS. 9A to 9C are top views showing a pixel structure of a display device described in Embodiment Mode 3.
Figure 9B:
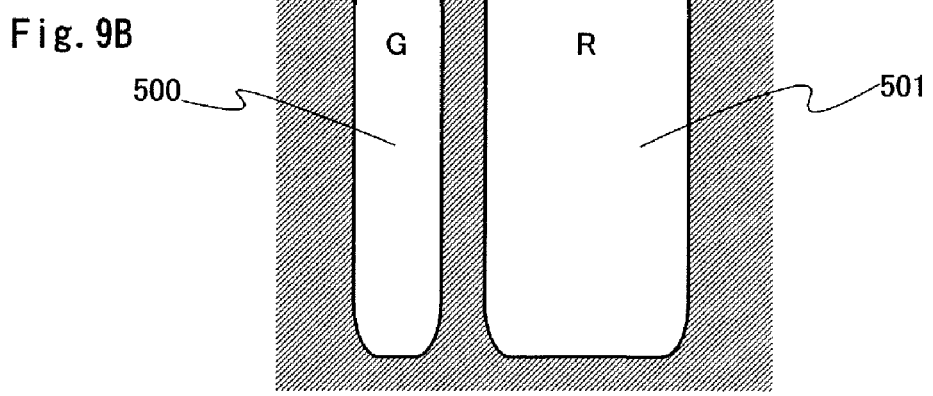
Figure 9C:
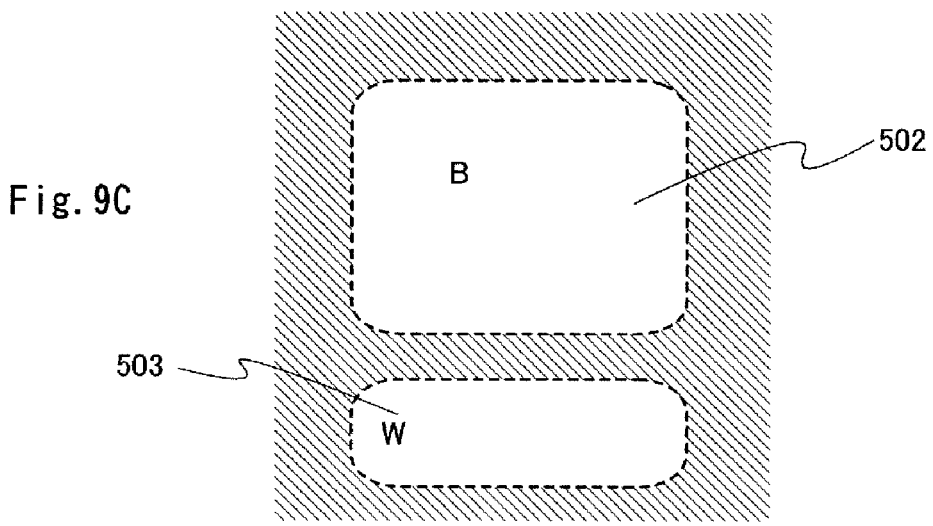

An example of rotating the organic light emitting elements provided over the second substrate by +90 degrees will be described with reference to FIGS. 9A to 9C, FIGS. 10A and 10B, and FIGS. 11A and 11B. Pixel structures in which the organic light emitting elements provided over the second substrate are rotated by +90 degrees, are shown in FIGS. 9A to 9C. FIG. 9A shows the pixel structure as seen from a display screen side, i.e., from a viewer side. FIG. 9B shows the pixel structure over the first substrate, and FIG. 9C shows the pixel structure over the second substrate. By overlapping the first substrate having the pixel structure shown in FIG. 9B with the second substrate having the pixel structure shown in FIG. 9C such that the organic light emitting elements provided over the first substrate face the organic light emitting elements provided over the second substrate, the pixel structure as shown in FIG. 9A is obtained as seen from a display screen side, i.e., from a viewer side. FIGS. 9B and 9C are top views as seen from each surface over which the organic light emitting elements are formed.

In FIG. 9B, reference numeral 500 indicates a green light emitting region including a green organic light emitting element; and 501, a red light emitting region including a red organic light emitting element.

In FIG. 9C, reference numeral 502 indicates a blue light emitting region including a blue organic light emitting element; and 503, a white light emitting region including a white organic light emitting element. Note that a wiring and the like are not shown in FIGS. 9A to 9C so as to simply show the overlapped light emitting regions.

Shaded portions in FIGS. 9A and 9B are light shielding regions since a wiring, an element for driving the organic light emitting elements, and the like are formed over the first substrate. A shaded portion in FIG. 9C is a light shielding region since a wiring, an element for driving the organic light emitting element, and the like are formed over the second substrate. Therefore, when a viewer sees the first substrate overlapped with the second substrate from the first substrate side, light emitted from the organic light emitting elements formed over the second substrate is shielded in a region other than the green light emitting region 500 and the red light emitting region 501 provided over the first substrate. Thus, when a viewer sees the superimposed first and second substrates, light emitted from the blue and white light emitting regions 502 and 503 provided over the second substrate is partly shielded by the light shielding region of the first substrate.

When the green light emitting region 500 and the red light emitting region 501 provided over the first substrate, and the blue light emitting region 502 and the white light emitting region 503 provided over the second substrate emit light, a viewer sees six different colored light emitting regions denoted by reference numerals 504, 505, 506, 507, 508, and 509. In this case, a mixed colored light emitting region in which green and blue are mixed, is formed in reference numeral 504. A green light emitting region is formed in reference numeral 505. A mixed colored light emitting region in which green and white are mixed, is formed in reference numeral 506. A mixed colored light emitting region in which red and blue are mixed, is formed in reference numeral 507. A red light emitting region is formed in reference numeral 508. A mixed colored light emitting region in which red and white are mixed, is formed in reference numeral 509.

Further, the colors of the light emitting regions over the second substrate are shown in parentheses in reference numerals 504, 506, 507, and 509 of FIG. 9A. Specifically, in reference numeral 504, "G" and "(B)" indicate that the green light emitting region over the first substrate is overlapped with the blue light emitting region over the second substrate. In reference numeral 505, "G" indicates that there is only a part of the green light emitting region provided over the first substrate. In reference numeral 506, "G" and "(W)" indicate that the green light emitting region over the first substrate is overlapped with the white light emitting region over the second substrate. In reference numeral 507, "R" and "(B)" indicate that the red light emitting region over the first substrate is overlapped with the blue light emitting region over the second substrate. In reference numeral 508, "R" indicates that there is only a part of the red light emitting region provided over the first substrate. In reference numeral 509, "R" and "(W)" indicate that the red light emitting region over the first substrate is overlapped with the white light emitting region over the second substrate.

In the case of making only the green light emitting region 500 over the first substrate emit light, reference numerals 504, 505, and 506 become green light emitting regions, whereas in the case of making only the red light emitting region 501 over the first substrate emit light, reference numerals 507, 508, and 509 become red light emitting regions. In the case of making only the blue light emitting region 502 over the second substrate emit light, reference numerals 504 and 507 become blue light emitting regions, whereas in the case of making only the white light emitting region 503 over the second substrate emit light, reference numerals 506 and 509 become white light emitting regions.

Figure 10A:
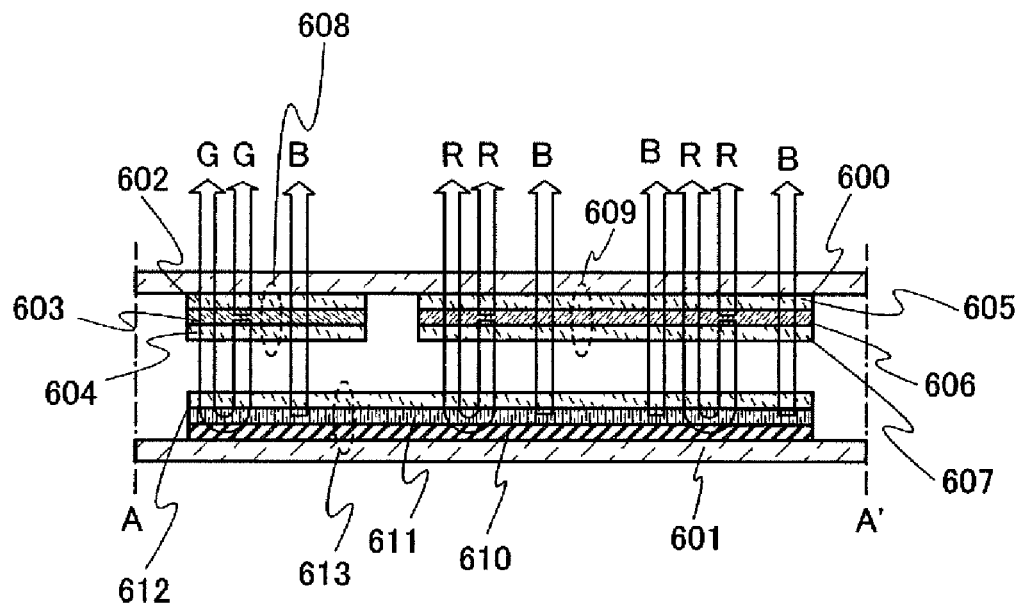
FIGS. 10A and 10B are cross sectional views showing one pixel of a display device described in Embodiment Mode 3.
Figure 10B:
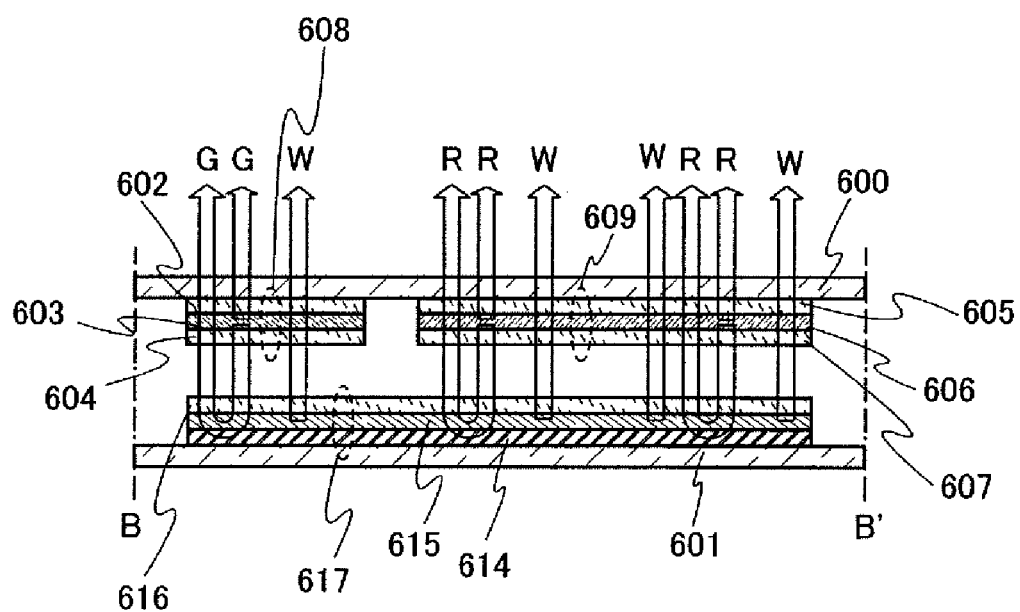
Figure 11A:
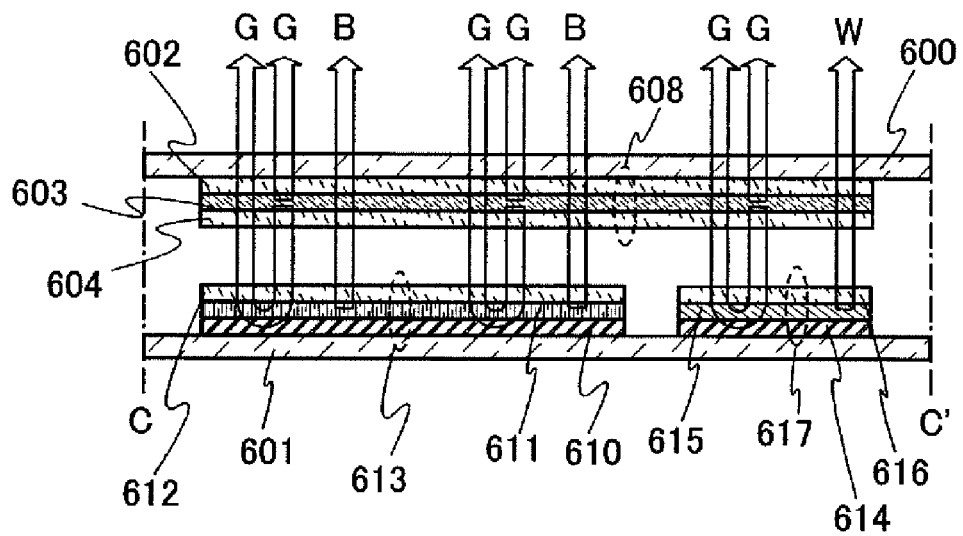
FIGS. 11A and 11B are cross sectional views showing one pixel of a display device described in Embodiment Mode 3.
Figure 11B:
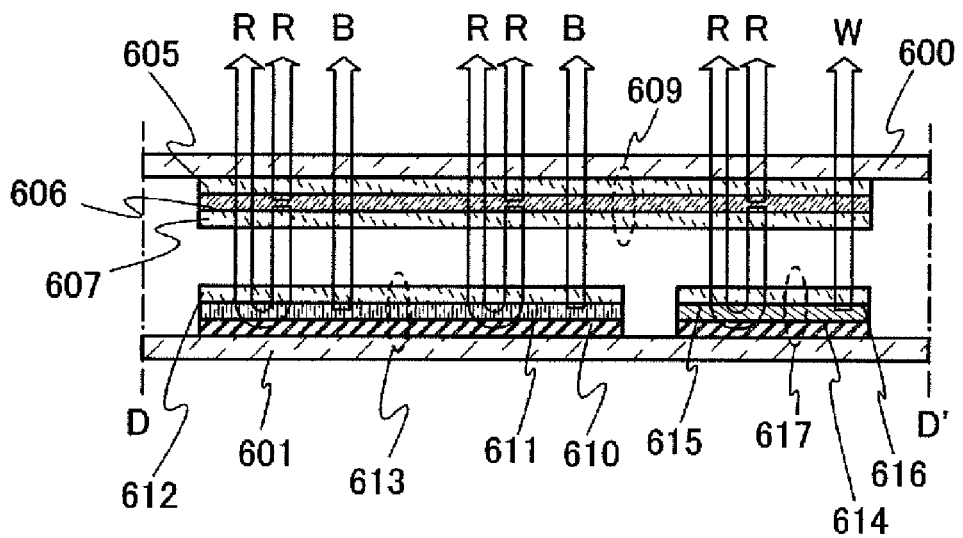

Cross sectional views of the pixel structures shown in FIGS. 9A to 9C are shown in FIGS. 10A and 10B and FIGS. 11A and 11B. FIG. 10A is a cross sectional view along a line A-A' of FIG. 9A, and FIG. 10B is a cross sectional view along a line B-B' of FIG. 9A. FIG. 11A is a cross sectional view along a line C-C' of FIG. 9A, and FIG. 11B is a cross sectional view along a line D-D' of FIG. 9A. FIGS. 10A and 10B and FIGS. 11A and 11B are the cross sectional views to simply show positional relations of the organic light emitting elements provided over the first substrate and the organic light emitting elements provided over the second substrate. Therefore, only the first substrate, the organic light emitting elements provided over the first substrates, the second substrate, and the organic light emitting elements provided over the second substrate are shown in FIGS. 10A and 10B and FIGS. 11A and 11B.

In FIG. 10A, a green (G) organic light emitting element 608 and a red (R) organic light emitting element 609 are provided over a first substrate 600 whereas a blue (B) organic light emitting element 613 is provided over a second substrate 601. As shown in FIG. 10A, the first substrate 600 and the second substrate 601 are attached to each other such that the blue organic light emitting element 613 provided over the second substrate 601 faces the green organic light emitting element 608 and the red organic light emitting element 609 provided over the first substrate.

The green and red organic light emitting elements 608 and 609 provided over the first substrate 600 have a dual emission structure in which the green and red organic light emitting elements 608 and 609 emit light toward a surface of the first substrate 600 over which the green and red organic light emitting elements are provided and toward the other surface of the first substrate 600 opposite to the surface over which the organic light emitting elements are provided, i.e., toward the second substrate 601. Meanwhile, the blue organic light emitting element 613 provided over the second substrate 601 has a top emission structure in which the blue organic light emitting element emits light toward a surface of the second substrate 601 over which the blue organic light emitting element is provided, i.e., toward the first substrate. Further, arrows indicate the directions of light emitted from the respective organic light emitting elements in FIGS. 10A and 10B and FIGS. 11A and 11B.

The green organic light emitting element 608 includes a first electrode 602, a second electrode 604, and a layer 603 containing an organic compound sandwiched between the first electrode 602 and the second electrode 604. The red organic light emitting element 609 includes a first electrode 605, a second electrode 607, and a layer 606 containing an organic compound sandwiched between the first electrode 605 and the second electrode 607. The blue organic light emitting element 613 includes a first electrode 610, a second electrode 612, and a layer 611 containing an organic compound sandwiched between the first electrode 610 and the second electrode 612. The white organic light emitting element 617 includes a first electrode 614, a second electrode 616, and a layer 615 containing an organic compound sandwiched between the first electrode 614 and the second electrode 616.

Note that, as materials for forming the first electrodes, the second electrodes, and the layers containing an organic compound of the respective organic light emitting elements, the same materials as those of the pixel structures shown in FIGS. 6A to 6C, FIGS. 7A and 7B, FIGS. 8A and 8B, FIGS. 27A to 27C, and FIGS. 28A and 28B, may be used.

Further, this embodiment mode is not limited to the structure shown in FIGS. 9A to 9C, and positions of the blue light emitting region 502 and the white light emitting region 503 may be counterchanged.

The overlapping ways of the light emitting regions of the organic light emitting elements formed over the first substrate and the light emitting regions of the organic light emitting elements formed over the second substrate shown in the pixel structures shown in FIGS. 9A to 9C, FIGS. 10A and 10B, and FIGS. 11A and 11B are different from the overlapping ways of the pixel structures shown in FIGS. 6A to 6C, FIGS. 7A and 7B, and FIGS. 8A and 8B, and therefore, mixed colors, that is, colors to be displayed are also different from one another.

By changing the arrangements of the light emitting regions of the organic light emitting elements formed over the first substrate and the light emitting regions of the organic light emitting elements formed over the second substrate, the overlapping ways of colors of the light emitting regions of the organic light emitting elements formed over the first substrate and the light emitting regions of the organic light emitting elements formed over the second substrates are changed, and therefore, colors of an image to be displayed can be changed. Consequently, by changing the arrangements of the light emitting regions of the organic light emitting elements formed over the first substrate and the light emitting regions of the organic light emitting elements formed over the second substrate in accordance with an image quality to be required for each image, colors appropriate for each image can be made.

Embodiment Mode 4

In this embodiment mode, an example of the second structure of the present invention will be described. Specifically, this embodiment mode will describe a display device in which a first substrate over which a red (R) organic light emitting element, a green (G) organic light emitting element, and a blue (B) organic light emitting element are provided is attached to a second substrate over which a cyan (C) organic light emitting element, which is a complementary color of red, a magenta (M) organic light emitting element, which is a complementary color of green (G), and a yellow (Y) organic light emitting element, which is a complementary color of blue (B) are provided, and a display screen is provided over the first substrate.

In the display device of this embodiment mode, the cyan organic light emitting element, which is the complementary color of red, the magenta organic light emitting element, which is the complementary color of green, and the yellow organic light emitting element, which is the complementary color of blue, are formed over the second substrate as a substitute for the white organic light emitting element of Embodiment Mode 1.

Figure 12A:
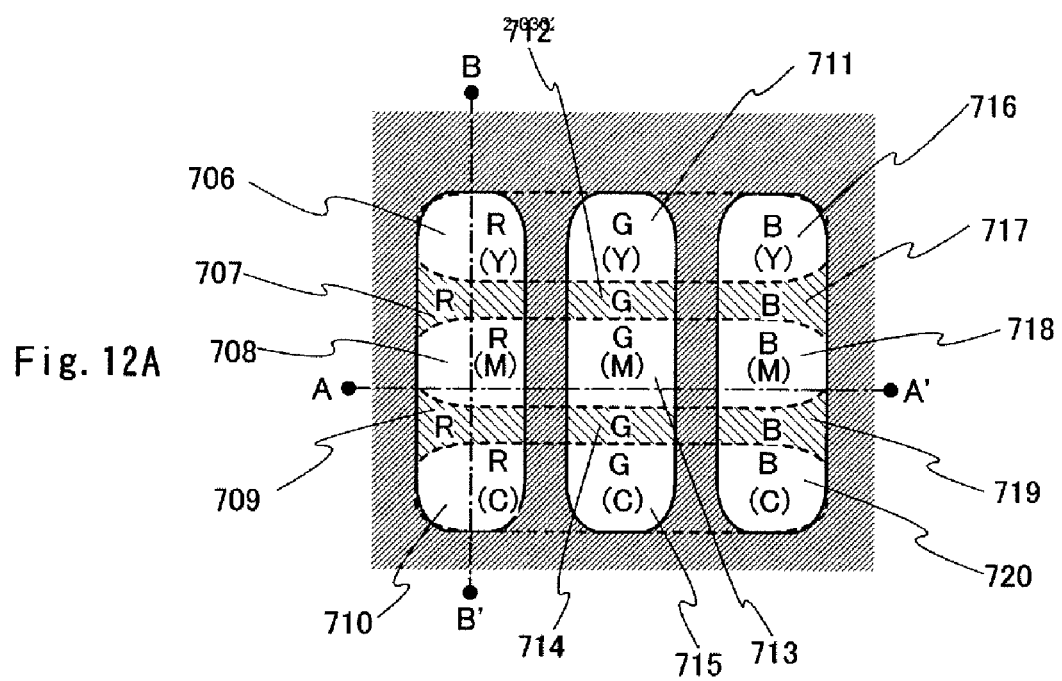
FIGS. 12A to 12C are top views showing a pixel structure of a display device described in Embodiment Mode 4.
Figure 12B:
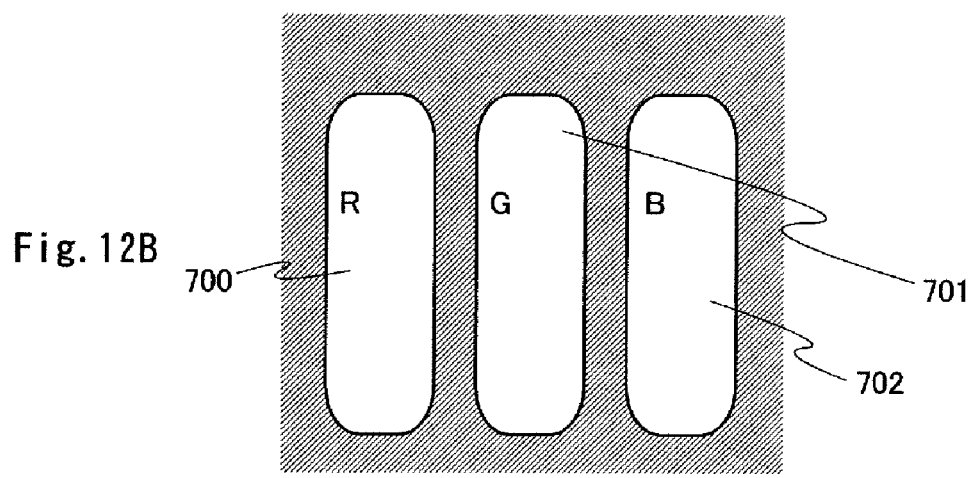
Figure 12C:
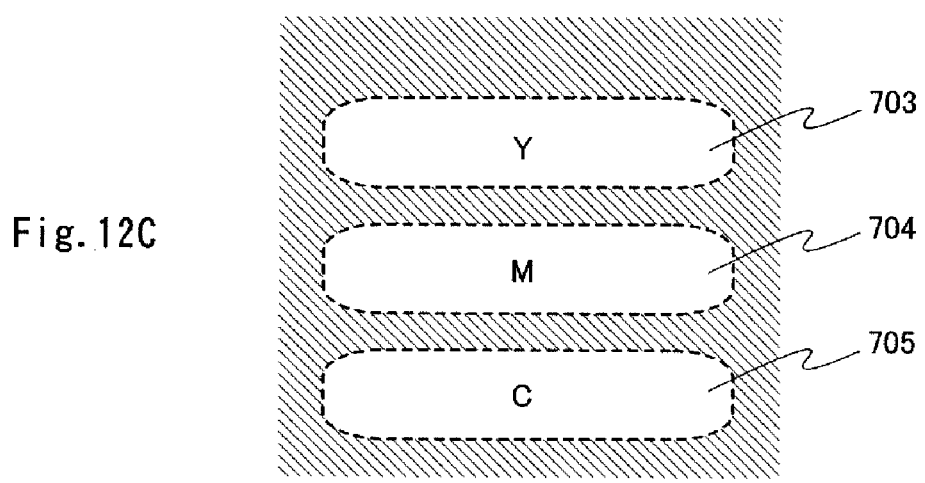

FIG. 12A to 12C are diagrams showing an example of pixel structures of the display device of this embodiment mode. FIG. 12A shows a pixel structure as seen from a display screen side (i.e., from a viewer side) in the case where the display screen is formed only over the first substrate. FIG. 12B shows a pixel structure over the first substrate. FIG. 12C shows a pixel structure over the second substrate. By attaching the first substrate having the pixel structure shown in FIG. 12B to the second substrate having the pixel structure shown in FIG. 12C such that the organic light emitting elements provided over the both substrates face one another, the pixel structure as shown in FIG. 12A is obtained as seen from the display screen side, i.e., from a viewer side. FIGS. 12B and 12C are top views as seen from each surface of the substrates over which the organic light emitting elements are formed.

In FIG. 12B, reference numeral 700 indicates a red light emitting region including the red (R) organic light emitting element; 701, a green light emitting region including the green (G) organic light emitting element; and 702, a blue light emitting region including the blue (B) organic light emitting element.

In FIG. 12C, reference numeral 703 indicates a yellow light emitting region including the yellow (Y) organic light emitting element; 704, a magenta light emitting region including the magenta (M) organic light emitting element; and 705, a cyan light emitting region including the cyan (C) organic light emitting element. Note that a wiring and the like are not shown in FIGS. 12A to 12C so as to simply show overlapped light emitting regions.

As shown in FIG. 12A, the first and second substrates are attached to each other such that the red, green, and blue light emitting regions 700, 701, and 702 are almost orthogonal to the yellow, magenta, and cyan light emitting regions 703, 704, and 705. Specifically, the red light emitting region 700 is overlapped with the yellow light emitting region 703, the magenta light emitting region 704, and the cyan light emitting region 705 respectively, the green light emitting region 701 is overlapped with the yellow light emitting region 703, the magenta light emitting region 704, and the cyan light emitting region 705, and the blue light emitting region 702 is overlapped with the yellow light emitting region 703, the magenta light emitting region 704, and the cyan light emitting region 705 respectively.

Shaded portions in FIGS. 12A and 12B are light shielding regions since a wiring, an element for driving the organic light emitting elements, and the like are formed over the first substrate. A shaded portion in FIG. 12C is a light shielding region since a wiring, an element for driving the organic light emitting element, and the like are formed over the second substrate. Therefore, when the superimposed first and second substrates are seen from the first substrate side (i.e., from a viewer side), light emitted from the organic light emitting elements formed over the second substrate are shielded at a portion other than the red, green, and blue light emitting regions 700, 701, and 702 formed over the first substrate. Accordingly, when a viewer sees the superimposed first and second substrates, light generated from the yellow, magenta, and cyan light emitting regions 703, 704, and 705 provided over the second substrate, is partly shielded by the light shielding region of the first substrate.

When the red light emitting region 700, the green light emitting region 701, and the blue light emitting region 702 provided over the first substrate and the yellow light emitting region 703, the magenta light emitting region 704, and the cyan light emitting region 705 provided over the second substrate emit light, a viewer sees fifteen different colored light emitting regions denoted by reference numerals 706, 707, 708, 709, 710, 711, 712, 713, 714, 715, 716, 717, 718, 719, and 720. In this case, a mixed colored light emitting region in which red and yellow are mixed, is formed in reference numeral 706. A red light emitting region is formed in reference numeral 707. A mixed colored light emitting region in which red and magenta are mixed, is formed in reference numeral 708. Another red light emitting region is formed in reference numeral 709. A mixed colored light emitting region in which red and cyan are mixed, is formed in reference numeral 710. A mixed colored light emitting region in which green and yellow are mixed, is formed in reference numeral 711. A green light emitting region is formed in reference numeral 712. A mixed colored light emitting region in which green and magenta are mixed, is formed in reference numeral 713. Another green light emitting region is formed in reference numeral 714. A mixed colored light emitting region in which green and cyan are mixed, is formed in reference numeral 715. A mixed colored light emitting region in which blue and yellow are mixed, is formed in reference numeral 716. A blue light emitting region is formed in reference numeral 717. A mixed colored light emitting region in which blue and magenta are mixed, is formed in reference numeral 718. Another blue light emitting region is formed in reference numeral 719. A mixed colored light emitting region in which blue and cyan are mixed, is formed in reference numeral 720.

Further, the colors of the light emitting regions over the second substrate are shown in parentheses in reference numerals 706, 708, 710, 711, 713, 715, 716, 718, and 720 of FIG. 12A. That is, in reference numeral 706, "R" and "(Y)" indicate that the red light emitting region over the first substrate is overlapped with the yellow light emitting region over the second substrate. In reference numeral 707, "R" indicates that there is only a part of the red light emitting region provided over the first substrate. In reference numeral 708, "R" and "(M)" indicate that the red light emitting region over the first substrate is overlapped with the magenta light emitting region over the second substrate. In reference numeral 709, "R" indicates that there is only a part of the red light emitting region provided over the first substrate. In reference numeral 710, "R" and "(C)" indicate that the red light emitting region over the first substrate is overlapped with the cyan light emitting region over the second substrate. In reference numeral 711, "G" and "(Y)" indicate that the green light emitting region over the first substrate is overlapped with the yellow light emitting region over the second substrate. In reference numeral 712, "G" indicates that there is only a part of the green light emitting region provided over the first substrate. In reference numeral 713, "G" and "(M)" indicate that the green light emitting region over the first substrate is overlapped with the magenta light emitting region over the second substrate. In reference numeral 714, "G" indicates that there is only a part of the green light emitting region provided over the first substrate. In reference numeral 715, "G" and "(C)" indicate that the green light emitting region over the first substrate is overlapped with the cyan light emitting region over the second substrate. In reference numeral 716, "B" and "(Y)" indicate that the blue light emitting region over the first substrate is overlapped with the yellow light emitting region over the second substrate. In reference numeral 717, "B" indicates that there is only a part of the blue light emitting region provided over the first substrate. In reference numeral 718, "B" and "(M)" indicate that the blue light emitting region over the first substrate is overlapped with the magenta light emitting region over the second substrate. In reference numeral 719, "B" indicates that there is only a part of the blue light emitting region provided over the first substrate. In reference numeral 720, "B" and "(C)" indicate that the blue light emitting region over the first substrate is overlapped with the cyan light emitting region over the second substrate.

In the case of making only the red light emitting region 700 over the first substrate emit light, reference numerals 706, 707, 708, 709, and 710 become red light emitting regions. In the case of making only the green light emitting region 701 over the first substrate emit light, reference numerals 711, 712, 713, 714, and 715 become green light emitting regions. In the case of making only the blue light emitting region 702 over the first substrate emit light, reference numerals 716, 717, 718, 719, and 720 become blue light emitting regions. In the case of making only the yellow light emitting region 703 over the second substrate emit light, reference numerals 706, 711, and 716 become yellow light emitting regions. In the case of making only the magenta light emitting region 704 over the second substrate emit light, reference numerals 708, 713, and 718 become magenta light emitting regions. In the case of making only the cyan light emitting region 705 over the second substrate emit light, reference numerals 710, 715, and 720 become cyan light emitting regions.

Figure 13A:
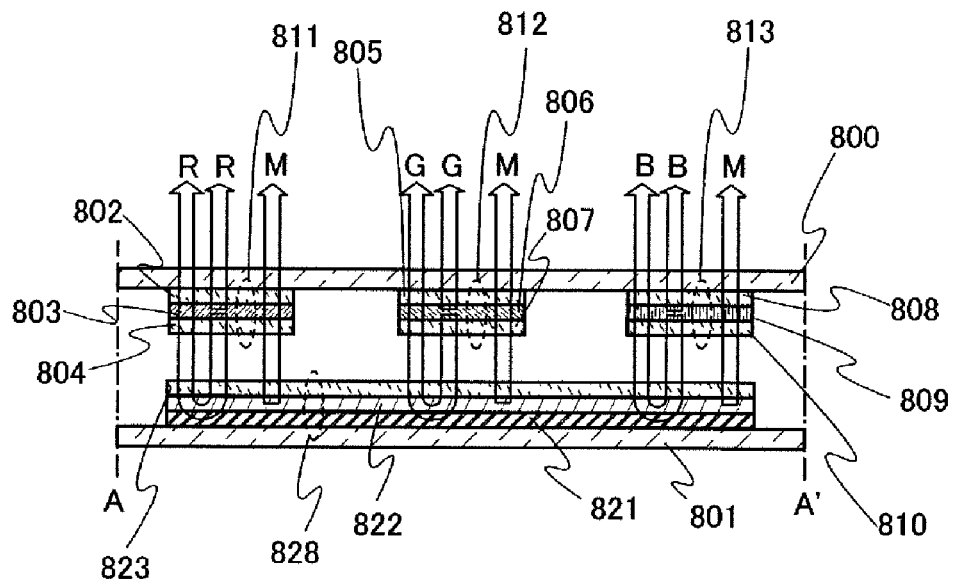
FIGS. 13A and 13B are cross sectional views showing one pixel of a display device described in Embodiment Mode 4.
Figure 13B:
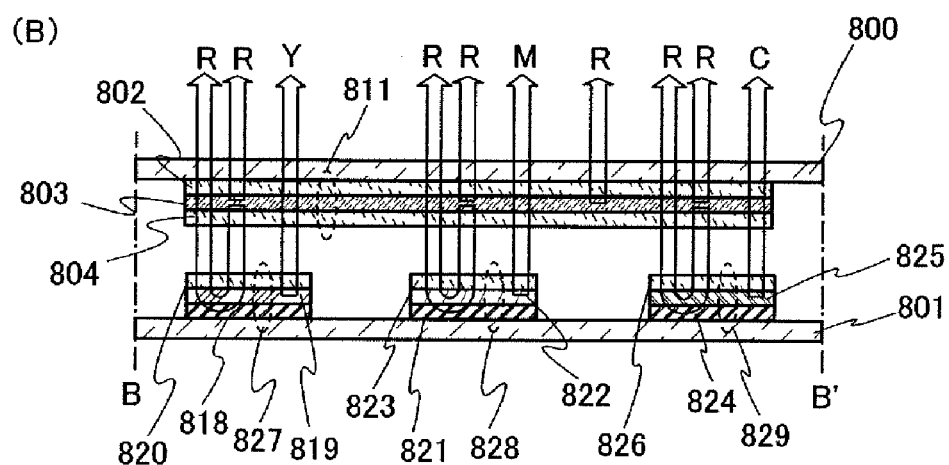

Cross sectional views of the pixel structures shown in FIGS. 12A to 12C are shown in FIGS. 13A and 13B. FIG. 13A is a cross sectional view along a line A-A' of FIG. 12A, and FIG. 13B is a cross sectional view along a line B-B' of FIG. 12A. FIGS. 13A and 13B are schematic cross sectional views simply showing cross sectional structures of a display device according to the present invention, and each of the views shows only a first substrate, red, green, blue organic light emitting elements provided over the first substrate, a second substrate, and yellow, magenta, and cyan organic light emitting elements provided over the second substrate.

In FIG. 13A, a red organic light emitting element 811, a green organic light emitting element 812, and a blue organic light emitting element 813 are provided over a first substrate 800 whereas a magenta organic light emitting element 828 is provided over a second substrate 801. The magenta organic light emitting element 828 provided over the second substrate faces the red organic light emitting element 811, the green organic light emitting element 812, and the blue organic light emitting element 813.

In FIG. 13B, the red organic light emitting element 811 is provided over the first substrate 800 whereas a yellow organic light emitting element 827, the magenta organic light emitting element 828, and a cyan organic light emitting element 829 are provided over the second substrate 801.

The red organic light emitting element 811 includes a first electrode 802, a second electrode 804, and a layer 803 containing an organic compound sandwiched between the first electrode 802 and the second electrode 804. The green organic light emitting element 812 includes a first electrode 805, a second electrode 807, and a layer 806 containing an organic compound sandwiched between the first electrode 805 and the second electrode 807. The blue organic light emitting element 813 includes a first electrode 808, a second electrode 810, and a layer 809 containing an organic compound sandwiched between the first electrode 808 and the second electrode 810.

The yellow organic light emitting element 827 includes a first electrode 818, a second electrode 820, and a layer 819 containing an organic compound sandwiched between the first electrode 818 and the second electrode 820. The magenta organic light emitting element 828 includes a first electrode 821, a second electrode 823, and a layer 822 containing an organic compound sandwiched between the first electrode 821 and the second electrode 823. The cyan organic light emitting element 829 includes a first electrode 824, a second electrode 826, and a layer 825 containing an organic compound sandwiched between the first electrode 824 and the second electrode 826.

In FIGS. 13A and 13B, arrows indicate the directions of light emitted from the respective organic light emitting elements. In FIGS. 13A and 13B, images are displayed over the first substrate. That is, a display screen is provided only over the first substrate. Accordingly, the red, green, and blue organic light emitting elements 811, 812, and 813 provided over the first substrate have a dual emission structure, whereas the yellow, magenta, and cyan organic light emitting elements 827, 828, and 829 provided over the second substrate have a top emission type structure. Therefore, the first and second electrodes of the organic light emitting elements provided over the first substrate are formed using transparent conducive films. The second electrodes of the organic light emitting elements provided over the second substrate are also formed using a transparent conductive film. Note that the first electrodes of the organic light emitting elements provided over the second substrate are preferably formed using reflecting electrodes so as to reflect light emitted toward the second substrates from the organic light emitting elements provided over the first substrate toward the first substrate.

Note that the materials described in Embodiment Mode 1 may be used as materials for forming the reflecting electrodes and the transparent conductive films.

By using the above mentioned structure, yellow, magenta, and cyan can be mixed with red, green, and blue to be displayed. Thus, colors which cannot be expressed only by the three colors of red, green, and blue, can be expressed.

Note that the pixel structures shown in FIGS. 12A to 12C and FIGS. 13A and 13B are just examples, and the present invention is not limited thereto. In this embodiment mode, the example of forming the cyan, magenta, and yellow organic light emitting elements is shown in this embodiment mode; however, the number of colors of organic light emitting elements to be formed are not limited to the three colors. Alternatively, one or two colored organic light emitting elements selected from cyan, magenta, and yellow may be formed. Further, the colors of organic light emitting elements to be formed are not limited to cyan, magenta, and yellow which are the complementary colors of red, green, and blue. An organic light emitting element having a color other than cyan, magenta, yellow, red, green, and blue may be provided so long as it is a color which can widen a range of colors which can be displayed. Accordingly, any organic light emitting element may be formed so long as it emits light with a color having a chromaticity coordinate outside of a triangle of a red chromaticity coordinate, a green chromaticity coordinate, and a blue chromaticity coordinate.

The arrangements of the yellow, magenta, and cyan organic light emitting elements are not particularly limited to the arrangements of FIGS. 12A to 12C. The light emitting regions of the organic light emitting elements provided over the first substrate are overlapped with the light emitting regions of the organic light emitting elements provided over the second substrate such that they are almost orthogonal to one another in FIGS. 12A to 12C; however, the present invention is not limited thereto. Alternatively, the light emitting regions of the organic light emitting elements provided over the first and second substrates may be arranged in parallel such that one color of the organic light emitting elements provided over the first substrate faces one color of the organic light emitting elements provided over the second substrate. However, in a case where the light emitting regions of the organic light emitting elements provided over the first and second substrates are arranged in the same manner as FIGS. 12A to 12C, the three colors of organic light emitting elements provided over the second substrate are uniformly overlapped with the one color of the organic light emitting element provided over the first substrate, and therefore, an image can be displayed with uniform colors.

Note that only the case where the red, green, and blue organic light emitting elements are provided over the first substrate, the yellow, magenta, and cyan organic light emitting elements are provided over the second substrate, and the display screen is provided over the first substrate, is described in this embodiment mode; however, the present invention is not limited thereto.

Further, the positions of the organic light emitting elements provided over the first substrate and the organic light emitting elements provided over the second substrate may be counterchanged. Furthermore, a white organic light emitting element may be provided over the first substrate and yellow, magenta, and cyan organic light emitting elements may be provided over the second substrate.

Moreover, display screens may be provided over both of the first and second substrates. In this case, the organic light emitting elements provided over the first and second substrates may have a dual emission structure. That is, the first and second electrodes of the organic light emitting elements provided over the first and second substrates maybe formed using transparent conductive films.

Embodiment Mode 5

In this embodiment mode, an example of the second structure of the present invention will be described. Specifically, a display device in which a red organic light emitting element is formed over a first substrate, a blue organic light emitting element is formed over a second substrate, a green organic light emitting element is formed over either the first substrate or the second substrate, a one colored organic light emitting element selected from a complementary color of red, a complementary color of green, and a complementary color of blue is formed over either the first substrate or the second substrate, areas of light emitting regions of the red and blue organic light emitting elements set larger than an area of a light emitting region of the green organic light emitting element, will be described.

The display device in which the red organic light emitting element and either the green organic light emitting element or the white organic light emitting element are provided over the first substrate, the blue organic light emitting element and either the green light emitting element or the white organic light emitting element are provided over the second substrate, the areas of the light emitting regions of the red and blue organic light emitting elements are set larger than the area of the light emitting region of the green organic light emitting element, are described in Embodiment Mode 3. In this structure of Embodiment Mode 3, when a one colored organic light emitting element selected from the complementary colors of red, green, and blue is provided as a substitute for the white organic light emitting element, the fourth structure of the present invention can be implemented.

Since the visibility of red and blue is lower than the visibility of green, by making areas of light emitting regions of red and blue organic light emitting elements larger than an area of a light emitting region of a green organic light emitting element, it is possible to balance red, green, and blue colors according to the structure of this embodiment mode. In addition, since the one colored organic light emitting element selected from the complementary colors of red, green, and blue is provided, colors which cannot be expressed only by red, green, and blue organic light emitting elements, can be expressed, making it possible to widen the range of colors to be reproduced. In addition, since the two colored organic light emitting elements are provided over each of the first and second substrates, as compared to a case of providing three colored organic light emitting elements over a substrate while having the same number of pixels provided over the substrate, the number of elements required for driving the organic light emitting elements provided over each dot can be reduced. As a consequence, aperture ratio can be improved.

Note that a color selected from the complementary colors of red, green, and blue may be determined in accordance with an image quality to be required. Moreover, the above described effect can be obtained even in a case of using a color other than the complementary colors of red, green, and blue so long as it is a color which can widen the range of a triangle of a red chromaticity coordinate, a green chromaticity coordinate, and a blue chromaticity coordinate. Accordingly, any colored organic light emitting element is allowable so long as it can emit light with a color having a chromaticity coordinate outside of the range of the triangle of the red, green, and blue chromaticity coordinates other than the complementary colors of red, green, and blue.

Embodiment Mode 6

In this embodiment mode, an example of the third structure of the present invention will be described. Specifically, a display device in which red, green, and blue organic light emitting elements are provided over a first substrate, red, green, and blue organic light emitting elements are provided over a second substrate, and different colored organic light emitting elements provided over the first and second substrates are overlapped with one another, will be described with reference to FIGS. 29A to 29C, and FIG. 30.

Figure 29A:
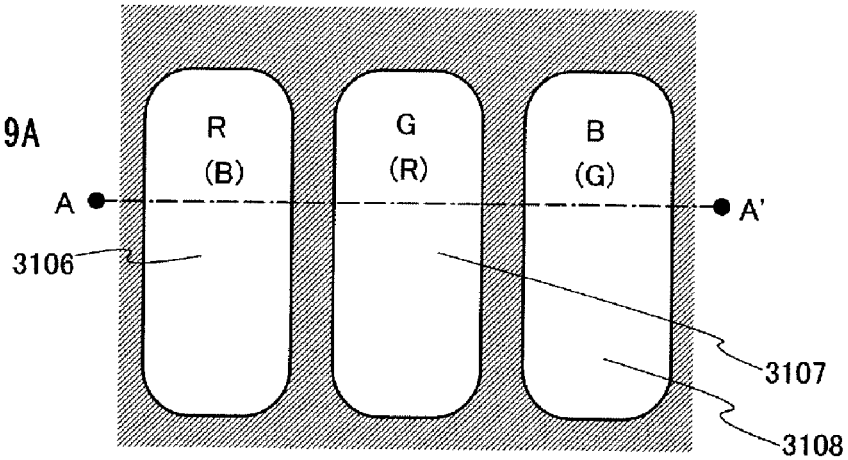
FIGS. 29A to 29C are top views showing a pixel structure of a display device described in Embodiment Mode 6.
Figure 29B:
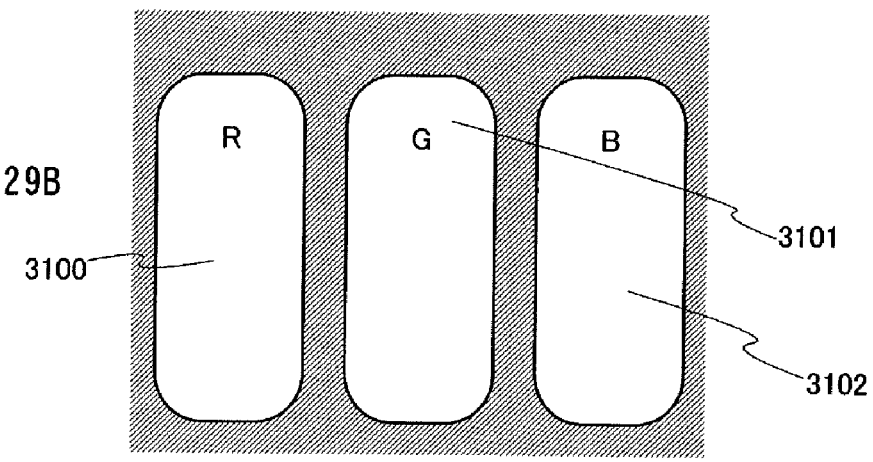
Figure 29C:
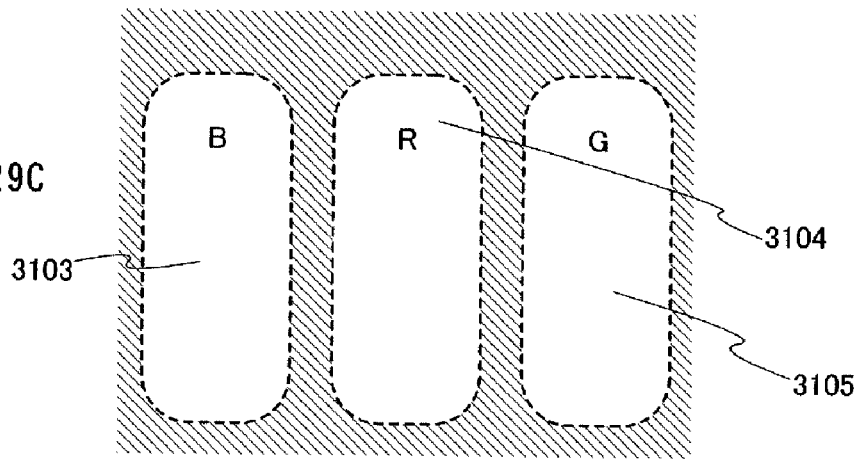

Pixel structures of a display device of this embodiment mode are shown in FIGS. 29A to 29C. FIG. 29A shows a pixel structure as seen from a display screen side, i.e., from a viewer side, FIG. 29B shows a pixel structure of a first substrate, and FIG. 29C shows a pixel structure of a second substrate. When the first substrate having the pixel structure shown in FIG. 29B is overlapped with the second substrate having the pixel structure shown in FIG. 29C such that the organic light emitting elements provided over the first and second substrates face one another, the pixel structure as shown in FIG. 29A can be obtained as seen from the display screen side, i.e., from a viewer side. FIGS. 29B and 29C are top views as seen from the surfaces of the first and second substrates over which the organic light emitting elements are provided. Note that, FIG. 29A to 29C show an example where the display screen is provided only over the first substrate.

In FIG. 29B, reference numeral 3100 indicates a red light emitting region including a red organic light emitting element; 3101, a green light emitting region including a green organic light emitting element; and 3102, a blue light emitting region including a blue organic light emitting element. In FIG. 29C, reference numeral 3103 indicates a blue light emitting region including a blue organic light emitting element; 3104, a red light emitting region including a red organic light emitting element; and 3105, a green light emitting region including a green organic light emitting element. Note that, in order to simply show the overlapped light emitting regions, a wiring and the like are not shown in FIGS. 29A to 29C, and only the light emitting regions are shown therein.

Shaded portions in FIGS. 29A and 29B are light shielding regions since a wiring, an element for driving the organic light emitting elements, and the like are formed over the first substrate. A shaded portion in FIG. 29C is a light shielding region since a wiring, an element for driving the organic light emitting element, and the like are formed over the second substrate. In this embodiment mode, the light emitting regions formed over the first substrate has almost the same size as the light emitting regions provided over the second substrate, and these light emitting regions are arranged to overlap with one another at the same positions. Accordingly, the light shielding region of the first substrate is formed at almost the same position as the light shielding region of the second substrate.

When the red light emitting region 3100, the green light emitting region 3101, and the blue light emitting region 3102 provided over the first substrate and the blue light emitting region 3103, the red light emitting region 3104, and the green light emitting region 3105 provided over the second substrate emit light, a viewer sees three different colored light emitting regions denoted by reference numerals 3106, 3107, and 3108. In this case, in reference numeral 3106, a mixed colored light emitting region in which red and blue are mixed, is formed. In reference numeral 3107, a mixed colored light emitting region in which green and red are mixed, is formed. In reference numeral 3108, a mixed colored light emitting region in which blue and green are mixed, is formed.

Further, the colors of the light emitting regions of the second substrate are shown in parentheses in reference numerals 3106, 3107, and 3108 of FIG. 29A since the light emitting regions of the first and second substrates are overlapped with one another at the same positions. That is, in reference numeral 3106, "R" and "(B)" indicate that the red light emitting region of the first substrate is overlapped with the blue light emitting region of the second substrate. In reference numeral 3107, "G" and "(R)" indicate that the green light emitting region of the first substrate is overlapped with the red light emitting region of the second substrate. In reference numeral 3108, "B" and "(G)" indicate that the blue light emitting region of the first substrate is overlapped with the green light emitting region of the second substrate.

In the case of making only the red light emitting region 3100 over the first substrate emit light, reference numeral 3106 becomes a red light emitting region. In the case of making only the green light emitting region 3101 over the first substrate emit light, reference numeral 3107 becomes a green light emitting region. In the case of making only the blue light emitting region 3102 over the first substrate emit light, reference numeral 3108 becomes a blue light emitting region. In the case of making only the blue light emitting region 3103 over the second substrate emit light, reference numeral 3106 becomes a blue light emitting region. In the case of making only the red light emitting region 3104 over the second substrate emit light, reference numeral 3107 becomes a red light emitting region. In the case of making only the green light emitting region 3105 over the second substrate emit light, reference numeral 3108 becomes a green light emitting region.

Figure 30:
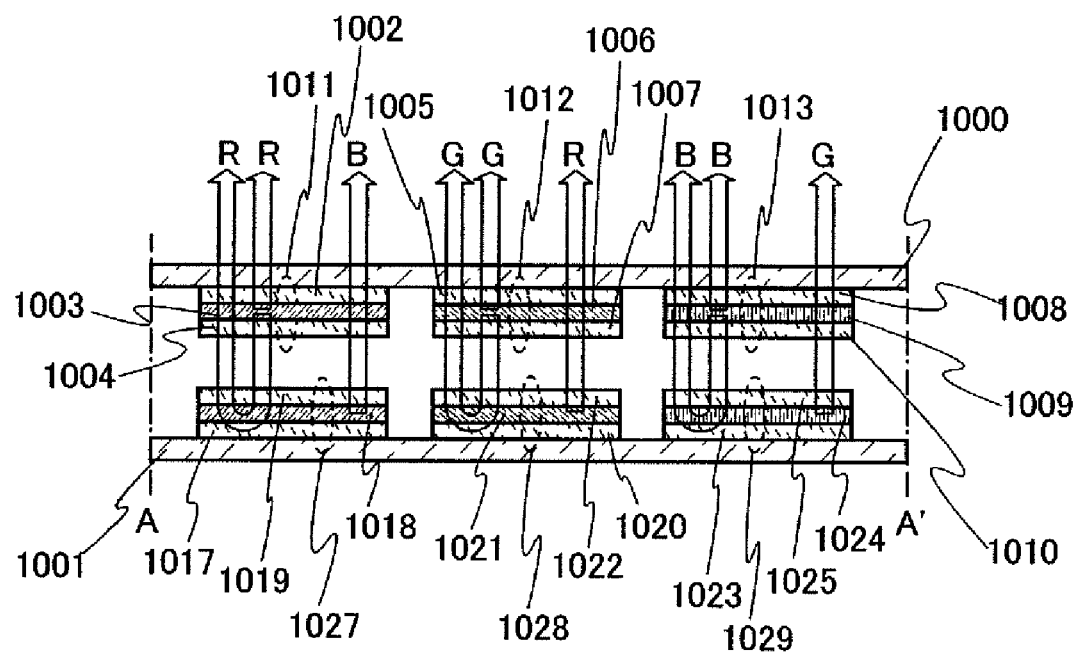
FIG. 30 is a view showing a cross sectional structure of one pixel of a display device described in Embodiment Mode 6.

FIG. 30 is a cross sectional view along a line A-A of FIG. 29A. FIG. 30 is a schematic cross sectional view to simply show a cross sectional structure of a display device according to the present invention. Only the red, green, and blue organic light emitting elements provided over the first substrate and the red, green, and blue organic light emitting elements provided over the second substrate, are shown.

In FIG. 30, a red (R) organic light emitting element 1011, a green (G) organic light emitting element 1012, and a blue (B) organic light emitting element 1013 are provided over a first substrate 1000 whereas a blue organic light emitting element 1027, a red organic light emitting element 1028, and a green organic light emitting element 1029 are provided over a second substrate 1001.

The organic light emitting elements 1011, 1012, and 1013 provided over the first substrate 1000 have a dual emission structure in which the organic light emitting elements emit light toward a surface of the first substrate 1000 over which the organic light emitting elements are provided and toward the other surface of the first substrate opposite to the surface of the first substrate over which the organic light emitting elements are provided, i.e., toward the second substrate 1001. Meanwhile, the organic light emitting elements 1027, 1028, and 1029 provided over the second substrate 1001 has a top emission structure in which the organic light emitting elements emit light toward a surface of the second substrate over which the organic light emitting elements are provided, i.e., toward the first substrate. Further, arrows indicate the directions of light emitted from the respective organic light emitting elements in FIG. 30.

The red organic light emitting element 1011 includes a first electrode 1002, a second electrode 1004, and a layer 1003 containing an organic compound sandwiched between the first electrode 1002 and the second electrode 1004. The green organic light emitting element 1012 includes a first electrode 1005, a second electrode 1007, and a layer 1006 containing an organic compound sandwiched between the first electrode 1005 and the second electrode 1007. The blue organic light emitting element 1013 includes a first electrode 1008, a second electrode 1010, and a layer 1009 containing an organic compound sandwiched between the first electrode 1008 and the second electrode 1010. The blue organic light emitting element 1027 includes a first electrode 1017, a second electrode 1019, and a layer 1018 containing an organic compound sandwiched between the first electrode 1017 and the second electrode 1019. The red organic light emitting element 1028 includes a first electrode 1020, a second electrode 1022, and a layer 1021 containing an organic compound sandwiched between the first electrode 1020 and the second electrode 1022. The green organic light emitting element 1029 includes a first electrode 1023, a second electrode 1025, and a layer 1024 containing an organic compound sandwiched between the first electrode 1023 and the second electrode 1025.

Note that the materials described in Embodiment Mode 1 may be used as materials of the first and second electrodes of the respective organic light emitting elements.

As shown in FIG. 30, the first substrate 1000 and the second substrate 1001 are overlapped with each other such that the red organic light emitting element 1011 formed over the first substrate faces the blue organic light emitting element 1027 formed over the second substrate, the green organic light emitting element 1012 formed over the first substrate faces the red organic light emitting element 1028 formed over the second substrate, and the blue organic light emitting element 1013 formed over the first substrate faces the green organic light emitting element 1029 formed over the second substrate.

Overlapping the different colored organic light emitting elements one another makes it possible to improve image resolution performance.

Figure 16:
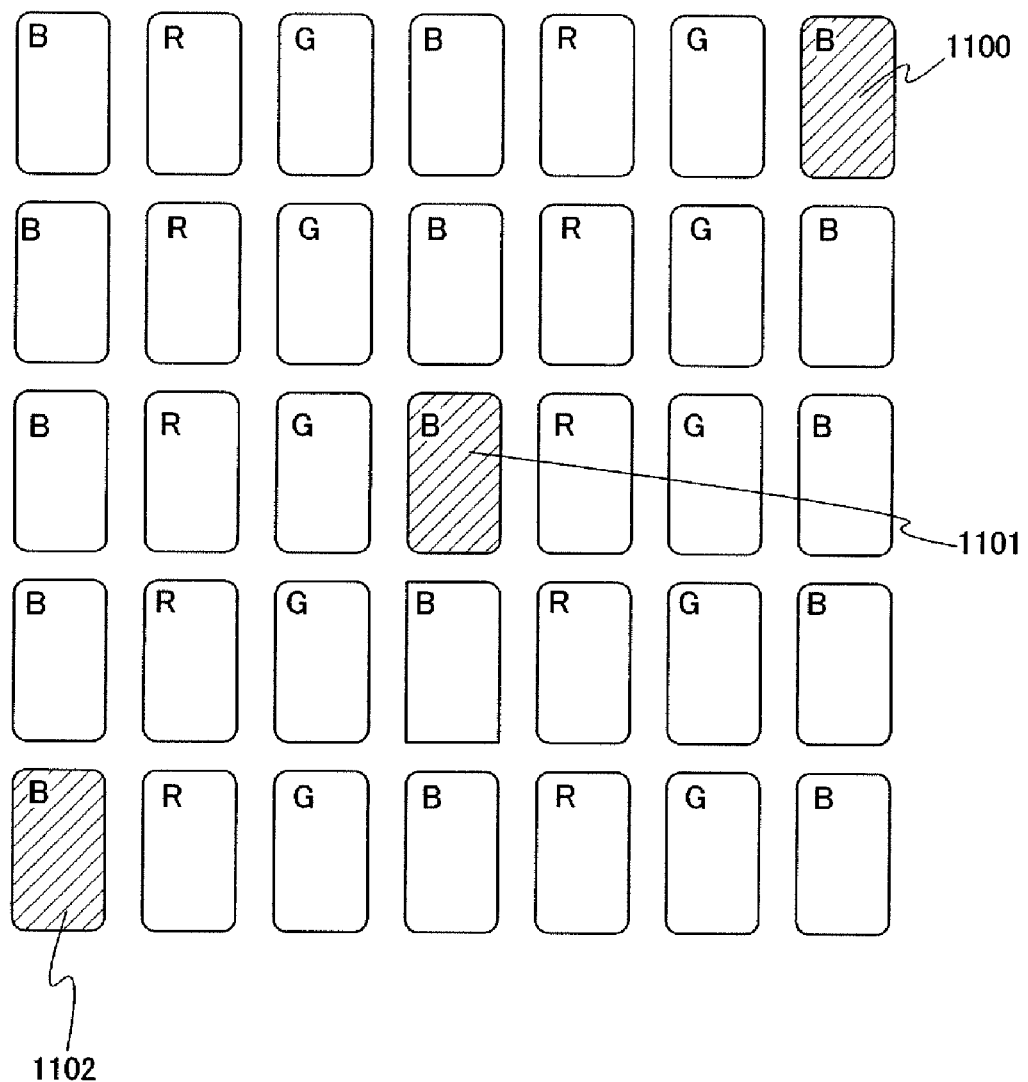
FIG. 16 is a diagram explaining an effect of a display device described in Embodiment Mode 6.

This point will be described with reference to FIG. 16 and FIG. 17. FIG. 16 is a top view of a portion where dots are aligned in five rows and seven columns in a normal display device for color display in a case where one pixel includes red, green, and blue dots. In FIG. 16, R indicates a red light emitting region (a red dot) including a red organic light emitting element, G indicates a green light emitting region (a green dot) including a green organic light emitting element, and B indicates a blue light emitting region (a blue dot) including a blue organic light emitting element.

For example, in order to display a blue diagonal line, as shown in FIG. 16, blue dots 1100, 1101, and 1102 emit light. Note that, in FIG. 16, shaded dots represent dots which emit light whereas dots which are not shaded, represent dots which emit no light.

Figure 17:
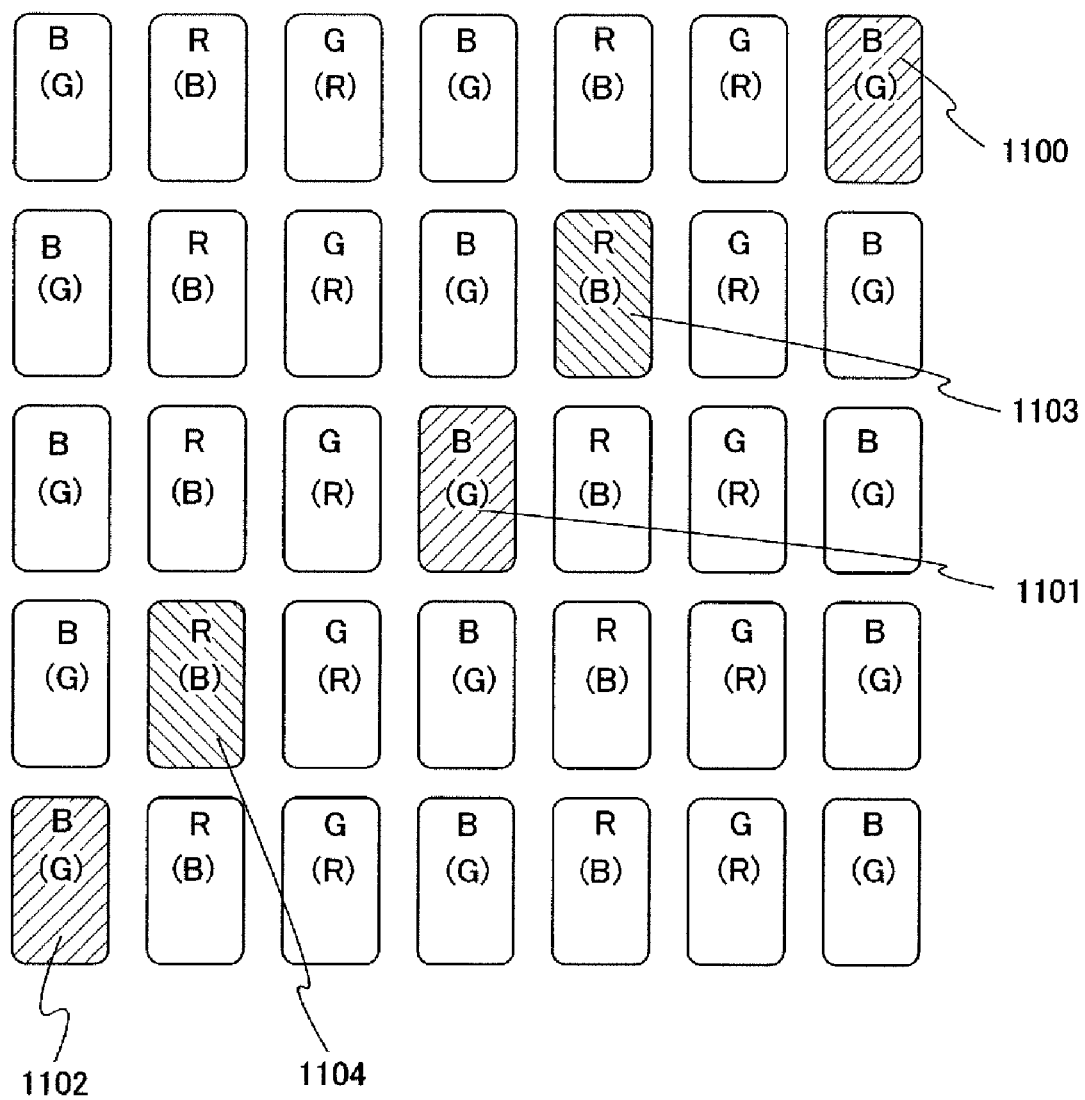
FIG. 17 is a diagram explaining an effect of a display device described in Embodiment Mode 6.

FIG. 17 is a top view as seen from a display screen of a portion where dots are aligned in five rows and seven columns over the first substrate of the display device of this embodiment mode. Note that, as shown in FIGS. 29A to 29C, since dots formed over the first substrate and dots formed over the second substrate are recognized as being overlapped with one another at the same positions as seen from a viewer side, colors of the dots formed over the second substrate are shown in parentheses in FIG. 17.

Specifically, in FIG. 17, R indicates a red light emitting region (a red dot) including a red organic light emitting element provided over the first substrate, G indicates a green light emitting region (a green dot) including a green organic light emitting element provided over the first substrate, and B indicates a blue light emitting region (a blue dot) including a blue organic light emitting element provided over the first substrate. Further, (R) indicates a red light emitting region (a red dot) including a red organic light emitting element provided over the second substrate, (G) indicates a green light emitting region (a green dot) including a green organic light emitting element provided over the second substrate, and (B) indicates a blue light emitting region (a blue dot) including a blue organic light emitting element provided over the second substrate. For example, with respect to a dot 1100, a dot provided over the first substrate at the position of the dot 1100 is blue and a dot provided over the second substrate at the position of the dot 1100 (which is overlapped with the dot provided over the first substrate at the same position as seen from a viewer side) is green.

In order to display a blue diagonal line on the display device of this embodiment mode as well as the normal display device shown in FIG. 16, as shown in FIG. 17, blue dots 1103 and 1104 emit light in addition to the blue dots 1100, 1101, and 1102. Note that, in FIG. 17, shaded dots represent dots which emit light whereas dots which are not shaded, represent dots which emit no light. Among the dots emitting light, the dots 1100, 1101, and 1102 provided over the first substrate are marked by upward-shaded lines whereas the dots 1103 and 1104 provided over the second substrate are marked by downward-shaded lines.

As known form FIG. 16 and FIG. 17, image resolution performance of FIG. 17 is higher than that of FIG. 16. That is, when the organic light emitting elements provided over the first and second substrates are arranged such that the different colored organic light emitting elements are overlapped with one another, image resolution performance can be improved, thereby displaying a higher-resolution image.

Further, FIGS. 29A to 29C and FIG. 30 show the case where the dots provided over the first substrate and the dots provided over the second substrate are overlapped with one another at the same positions; however, the present invention is not limited to this structure. In a case where the organic light emitting elements provided over the first and second substrates are arranged such that the different colored organic light emitting elements are overlapped one another, the image resolution performance can be improved. That is, when the organic light emitting elements provided over the first and second substrates are provided such that the different colored organic light emitting elements are at least partly overlapped with one another as seen from a viewer side, an effect of improving image resolution performance can be obtained. Accordingly, the light emitting regions of the organic light emitting elements provided over the first and second substrates may be arranged such that the different colored light emitting regions provided over the first and second substrates are partly overlapped with one another.

A case where light emitting regions of different colored organic light emitting elements provided over first and second substrates are partly overlapped with one another, will be described with reference to FIGS. 14A to 14C and FIG. 15.

Figure 14A:
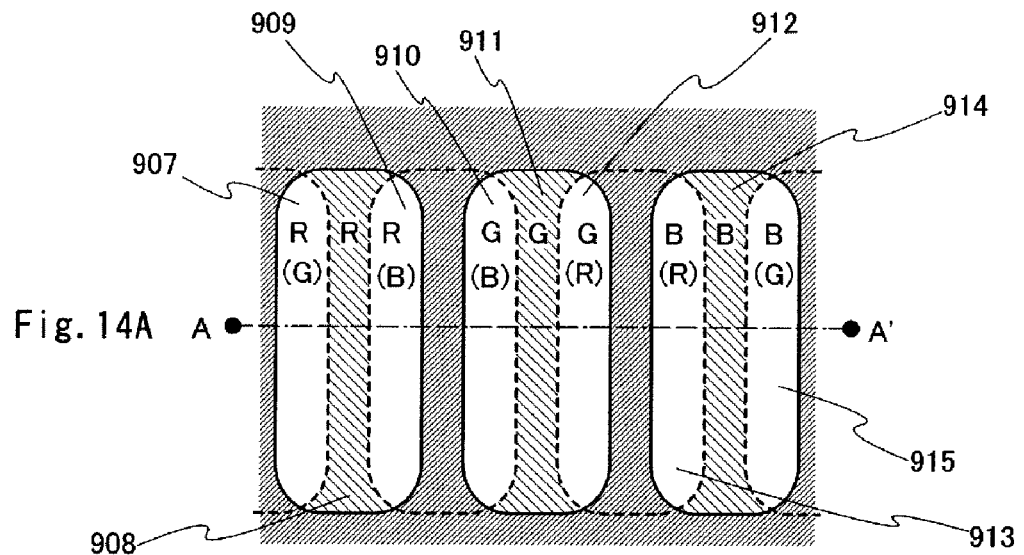
FIGS. 14A to 14C are top views showing a pixel structure of a display device described in Embodiment Mode 6.
Figure 14B:
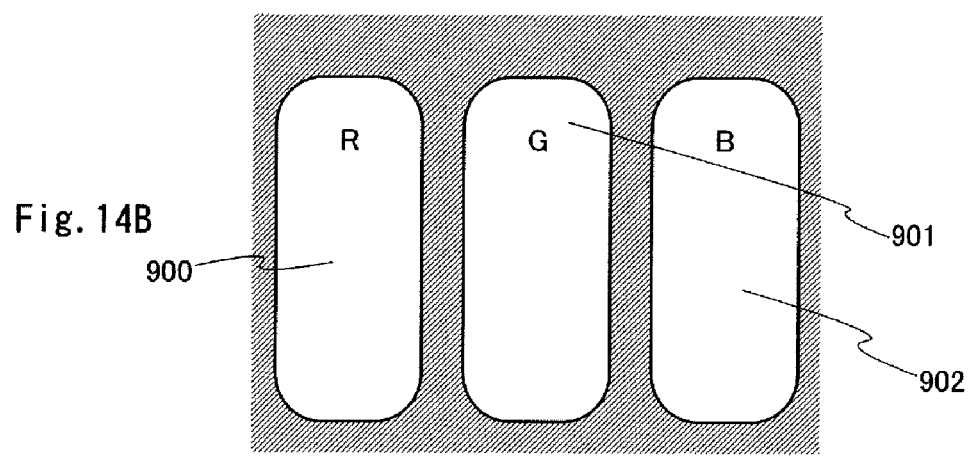
Figure 14C:
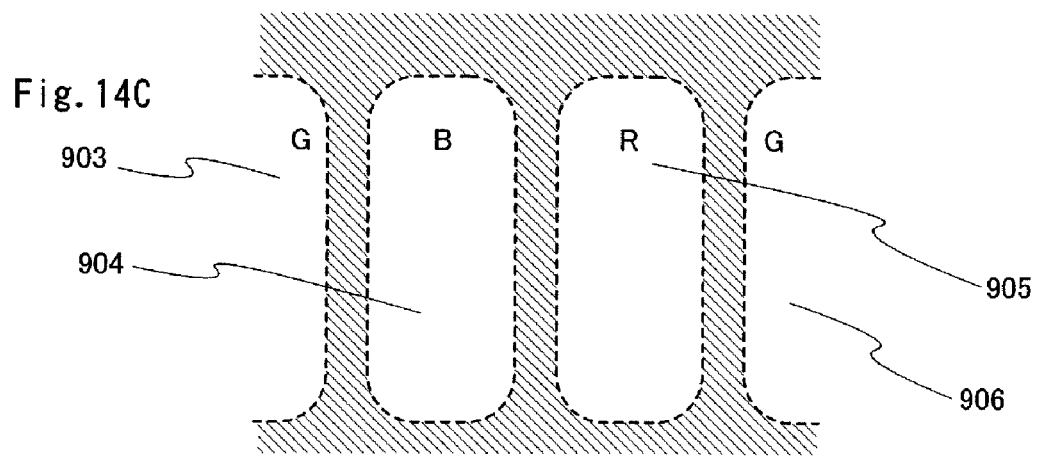

FIGS. 14A to 14C show pixel structures of a display device according to this embodiment mode. FIG. 14A shows a pixel structure as seen from the display screen side, that is, from a viewer side. FIG. 14B shows a pixel structure of the first substrate, and FIG. 14C shows a pixel structure of the second substrate. When the first substrate having the pixel structure shown in FIG. 14B is overlapped with the second substrate having the pixel structure shown in FIG. 14C such that the organic light emitting elements provided over the first and second substrates face one another, the pixel structure as shown in FIG. 14A can be obtained as seen from a display screen side, i.e., from a viewer side. Each of FIGS. 14B and 14C is a top view as seen from the surface provided with the organic light emitting elements. Note that, FIGS. 14A to 14C show a case where a display screen is provided only over the first substrate.

In FIG. 14B, reference numeral 900 indicates a red light emitting region including a red organic light emitting element; 901, a green light emitting region including a green organic light emitting element; and 902, a blue light emitting region including a blue organic light emitting element. In FIG. 14C, reference numeral 903 indicates a part of a green light emitting region including a green organic light emitting element; 904, a blue light emitting region including a blue organic light emitting element; 905, a red light emitting region including a red organic light emitting element; and 906, a part of a green light emitting region including a green organic light emitting element.

Note that FIG. 14A shows a portion corresponding to one pixel over the first substrate. Therefore, FIG. 14C shows only a part of the green light emitting region 903 and a part of the green light emitting region 906 over the second substrate, respectively.

Further, a wiring and the like are not shown in FIGS. 14A to 14C and only the light emitting regions are shown therein so as to simply show the overlapped light emitting regions. Furthermore, FIGS. 14A to 14C show a case where a display screen is provided only over the first substrate.

Shaded portions in FIGS. 14A and 14B are light shielding regions since a wiring, an element for driving the organic light emitting elements, and the like are formed over the first substrate. A shaded portion in FIG. 14C is also a light shielding region since a wiring, an element for driving the organic light emitting elements, and the like are formed over the second substrate. Therefore, when a viewer sees the first substrate overlapped with the second substrate from the first substrate side, light emitted from the organic light emitting elements formed over the second substrate is shielded in a region other than the red light emitting region 900, the green light emitting region 901, and the blue light emitting region 902 provided over the first substrate. Thus, when a viewer sees the superimposed first and second substrates from the first substrate side, light emitted from the green, blue, and red light emitting regions 903, 904, 905, and 906 provided over the second substrate is partly shielded by the light shielding region of the first substrate.

When the red light emitting region 900, the green light emitting region 901, and the blue light emitting region 902 provided over the first substrate, and the part of the green light emitting region 903, the blue light emitting region 904, the red light emitting region 905, and the part of the green light emitting region 906 provided over the second substrate emit light, a viewer sees nine different colored light emitting regions denoted by reference numerals 907, 908, 909, 910, 911, 912, 913, 914, and 915. In this case, a mixed colored light emitting region in which red and green are mixed, is formed in reference numeral 907. A red light emitting region is formed in reference numeral 908. A mixed colored light emitting region in which red and blue are mixed, is formed in reference numeral 909. A mixed colored light emitting region in which green and blue are mixed, is formed in reference numeral 910. A green light emitting region is formed in reference numeral 911. A mixed colored light emitting region in which green and red are mixed, is formed in reference numeral 912. A mixed colored light emitting region in which blue and red are mixed, is formed in reference numeral 913. A blue light emitting region is formed in reference numeral 914. A mixed colored light emitting region in which blue and green are mixed, is formed in reference numeral 915.

Further, the colors of the light emitting regions over the second substrate are shown in parentheses in reference numerals 907, 909, 910, 912, 913, and 915 of FIG. 14A. Specifically, in reference numeral 907, "R" and "(G)" indicate that the red light emitting region over the first substrate is overlapped with the green light emitting region over the second substrate. In reference numeral 908, "R" indicates that there is only a part of the red light emitting region provided over the first substrate. In reference numeral 909, "R" and "(B)" indicate that the red light emitting region over the first substrate is overlapped with the blue light emitting region over the second substrate. In reference numeral 910, "G" and "(B)" indicate that the green light emitting region over the first substrate is overlapped with the blue light emitting region over the second substrate. In reference numeral 911, "G" indicates that there is only a part of the green light emitting region provided over the first substrate. In reference numeral 912, "G" and "(R)" indicate that the green light emitting region over the first substrate is overlapped with the red light emitting region over the second substrate. In reference numeral 913, "B" and "(R)" indicate that the blue light emitting region over the first substrate is overlapped with the red light emitting region over the second substrate. In reference numeral 914, "B" indicates that there is only a part of the blue light emitting region provided over the first substrate. In reference numeral 915, "B" and "(G)" indicate that the blue light emitting region over the first substrate is overlapped with the green light emitting region over the second substrate.

In the case of making only the red light emitting region 900 over the first substrate emit light, reference numerals 907, 908, and 909 become red light emitting regions. In the case of making only the green light emitting region 901 over the first substrate emit light, reference numerals 910, 911, and 912 become green light emitting regions. In the case of making only the blue light emitting region 902 over the first substrate emit light, reference numerals 913, 914, and 915 become blue light emitting regions. In the case of making only the green light emitting region 903 over the second substrate emit light, reference numeral 907 becomes a green light emitting region. In the case of making only the blue light emitting region 904 over the second substrate emit light, reference numerals 909 and 910 become blue light emitting regions. In the case of making only the red light emitting region 905 over the second substrate emit light, reference numerals 912 and 913 become red light emitting regions. In the case of making only the green light emitting region 906 over the second substrate emit light, reference numeral 915 becomes a green light emitting region.

Figure 15:
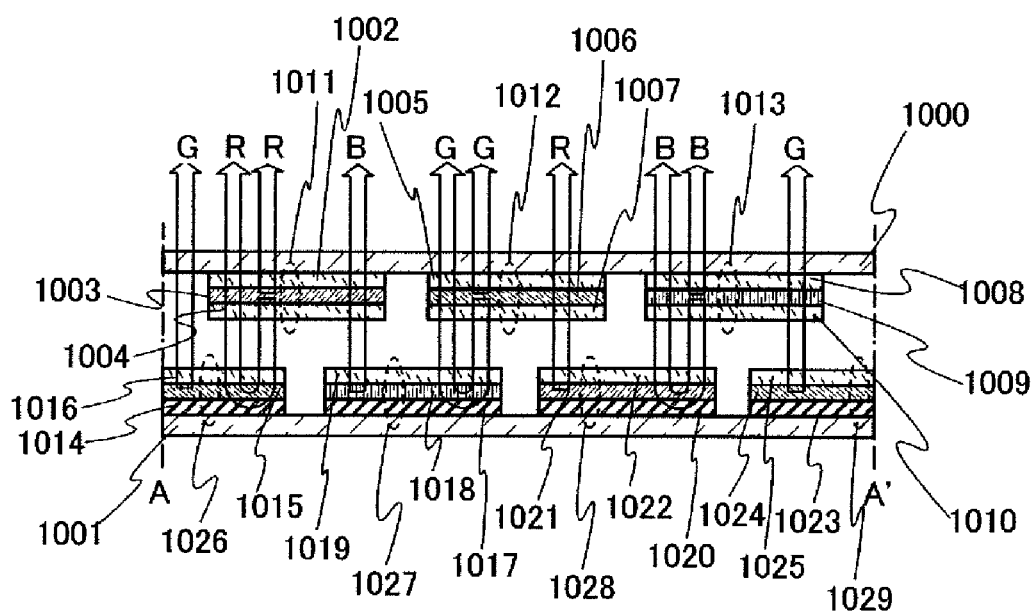
FIG. 15 is a view showing a cross sectional structure of one pixel of a display device described in Embodiment Mode 6.

Cross sectional views along a line A-A' of FIG. 14A is shown in FIG. 15. FIG. 15 is a schematic cross sectional view simply showing a cross sectional structure of the display device according to the present invention, and shows only a first substrate, red, green, and blue organic light emitting elements provided over the first substrate, a second substrate, and red, green, and blue organic light emitting elements provided over the second substrate.

In FIG. 15, a red (R) organic light emitting element 1011, a green (G) organic light emitting element 1012, and a blue (B) organic light emitting element 1013 are provided over a first substrate 1000 whereas green organic light emitting elements 1026 and 1029, a blue organic light emitting element 1027, and a red organic light emitting element 1028 are provided over a second substrate 1001. Note that only a part of the green organic light emitting element 1026 and a part of the green organic light emitting element 1029 are shown in FIG. 15.

In FIG. 15, the same portions as those of FIG. 30 are denoted by the same reference numerals. In FIG. 15, reference numeral 1026 indicates a green organic light emitting element including a first electrode 1014, a second electrode 1016, and a layer 1015 containing an organic compound sandwiched between the first electrode 1014 and the second electrode 1016.

As shown in FIG. 15, the first substrate 1000 and the second substrate 1001 are overlapped with each other such that the red organic light emitting element 1011 provided over the first substrate faces a part of the green organic light emitting element 1026 and a part of the blue organic light emitting element 1027 provided over the second substrate, the green organic light emitting element 1012 provided over the first substrate faces a part of the blue organic light emitting element 1027 and a part of the red organic light emitting element 1028 provided over the second substrate, and the blue organic light emitting element 1013 provided over the first substrate faces a part of the red organic light emitting element 1028 and a part of the green organic light emitting element 1029 provided over the second substrate. That is, the organic light emitting elements provided over the first and second substrates are arranged such that the different colored organic light emitting elements are partly overlapped with one another.

By overlapping the different colored organic light emitting elements with one another in such a manner, image resolution performance can be improved.

Embodiment Mode 7

In this embodiment mode, the fourth structure of the present invention will be described. Specifically, an example where red, green, and blue organic light emitting elements are provided over one of first and second substrates and a blue organic light emitting element is provided over the other substrate, will be described. In order to form a structure in which the red, green, and blue organic light emitting elements are provided over one of the first and second substrates and the blue organic light emitting element is provided over the other substrate, in the structure of Embodiment Mode 1, a blue organic light emitting element may be provided as a substitute for the white organic light emitting element 120 provided over the second substrate.

In the case of providing the white organic light emitting element over the second substrate as shown in Embodiment Mode 1, since the brightness of the entire display screen is necessary to be made uniform, the light emitting regions of the red, green, and blue organic light emitting elements provided over the first substrate are uniformly overlapped with the white organic light emitting region. Meanwhile, in the case of providing a blue organic light emitting element over the second substrate, the blue organic light emitting element formed over the second substrate is provided to compensate luminance of the blue organic light emitting element formed over the first substrate, and therefore, the light emitting regions of the red, green, and blue organic light emitting elements provided over the first substrate are not necessary to be uniformly overlapped with the blue organic light emitting element provided over the second substrate. For example, the blue organic light emitting element may be provided over the second substrate to be overlapped with only the blue organic light emitting element provided over the first substrate.

Note that, an organic light emitting element provided over the second substrate is not limited to the blue organic light emitting element. For example, in a case where the red organic light emitting element provided over the first substrate does not have sufficient luminance, another red organic light emitting element may be provided over the second substrate. Alternatively, in a case where the green organic light emitting element provided over the first substrate does not have sufficient luminance, another green organic light emitting element may be provided over the second substrate.

Embodiment 1

Figure 20A:
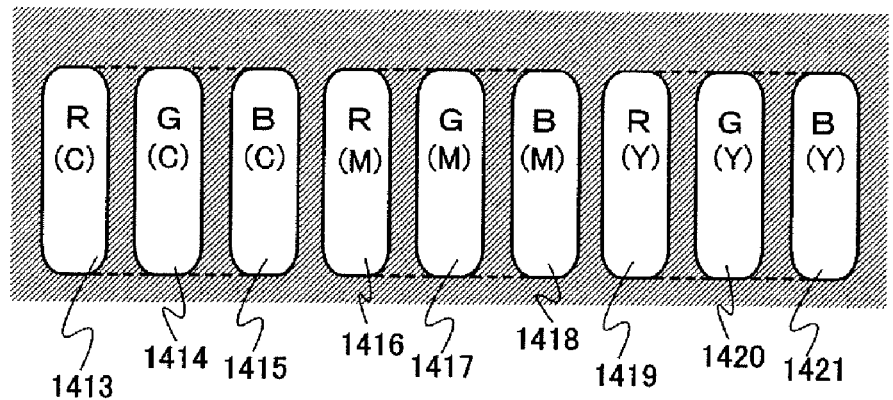
FIGS. 20A to 20C are top views showing a pixel structure of a display device described in Embodiment 1.
Figure 20B:
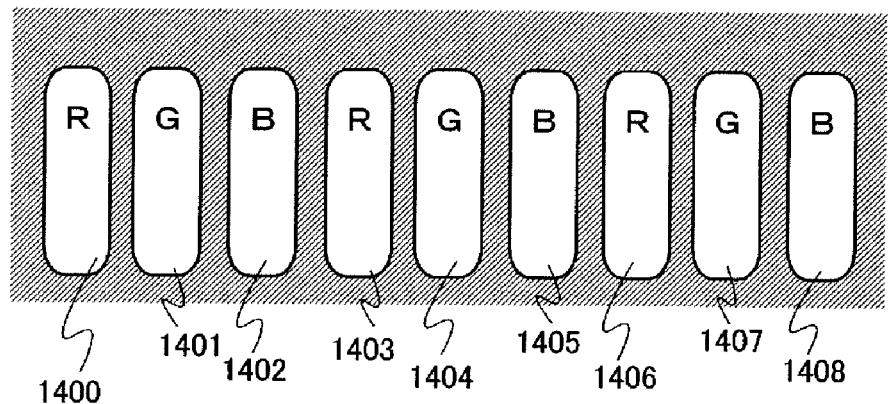
Figure 20C:
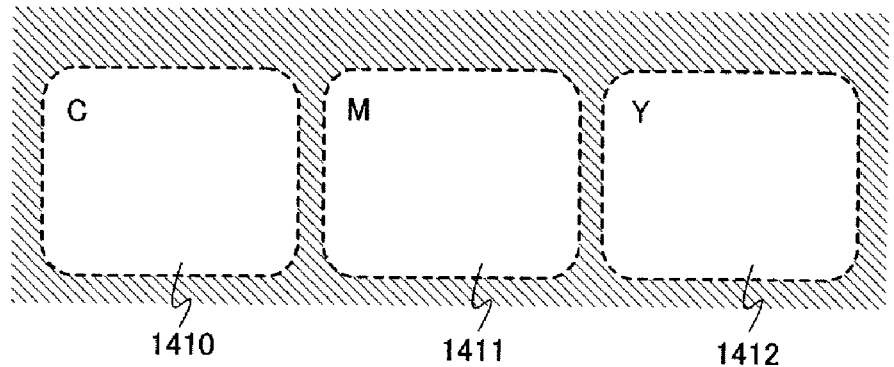

In this embodiment, an example of pixel structures of the second structure of the present invention, which is different from Embodiment Mode 4, will be described. FIGS. 20A to 20C show pixel structures of a display device, which are different from those of Embodiment Mode 4. FIG. 20A shows a pixel structure as seen from a display screen side. FIG. 20B shows a pixel structure over the first substrate. FIG. 20C shows a pixel structure over the second substrate. When the first substrate having the pixel structure shown in FIG. 20B is overlapped with the second substrate having the pixel structure shown in FIG. 20C such that organic light emitting elements provided over the first and second substrates face one another, the pixel structure as shown in FIG. 20A is obtained as seen from the display screen side, i.e., from a viewer side. Note that the display screen is provided only over the first substrate. Each of FIGS. 20B and 20C is a top view as seen from a surface of each substrate over which the organic light emitting elements are formed.

In FIG. 20B, reference numerals 1400, 1403, and 1406 indicate red light emitting regions including red (R) organic light emitting elements; 1401, 1404, and 1407, green light emitting regions including green (G) organic light emitting elements; and 1402, 1405, and 1408, blue light emitting regions including blue (B) organic light emitting elements.

In FIG. 20C, reference numeral 1410 indicates a cyan light emitting region including a cyan (C) organic light emitting element; 1411, a magenta light emitting region including a magenta (M) organic light emitting element; and 1412, a yellow light emitting region including a yellow (Y) organic light emitting element. Note that a wiring and the like are not shown in FIGS. 20A to 20C so as to simply show overlapped light emitting regions.

As shown in FIG. 20, the red light emitting region 1400, the green light emitting region 1401, and the blue light emitting region 1402 are overlapped with the cyan light emitting region 1410. The red light emitting region 1403, the green light emitting region 1404, and the blue light emitting region 1405 are overlapped with the magenta light emitting region 1411. The red light emitting region 1406, the green light emitting region 1407, and the blue light emitting region 1408 are overlapped with the yellow light emitting region 1412. According to this structure, colors which cannot be expressed only by red, green, and blue, can be expressed.

Shaded portions in FIGS. 20A and 20B are light shielding regions since a wiring, an element for driving the organic light emitting elements, and the like are formed over the first substrate. A shaded portion in FIG. 20C is a light shielding region since a wiring, an element for driving the organic light emitting elements, and the like are formed over the second substrate. Therefore, when the superimposed first and second substrates are seen from the first substrate side (i.e., from a viewer side), light emitted from the organic light emitting elements formed over the second substrate is shielded at a portion other than the red light emitting regions 1400, 1403, and 1406, the green light emitting regions 1401, 1404, and 1407, and the blue light emitting regions 1402, 1405, and 1408 formed over the first substrate. Accordingly, when the superimposed first and second substrates are seen from the viewer side, light emitted from the cyan, magenta, and yellow light emitting region 1410, 1411, and 1412, is partly shielded by the light shielding region of the first substrate.

When the red light emitting regions 1400, 1403, and 1406, the green light emitting regions 1401, 1404, and 1407, and the blue light emitting regions 1402, 1405, and 1408 provided over the first substrate emit light while the cyan light emitting region 1410, the magenta light emitting region 1411, and the yellow light emitting region 1412 provided over the second substrate emit light, a viewer sees nine different colored light emitting regions denoted by reference numerals 1413, 1414, 1415, 1416, 1417, 1418, 1419, 1420, and 1421. In this case, a mixed colored light emitting region in which red and cyan are mixed, is formed in reference numeral 1413. A mixed colored light emitting region in which green and cyan are mixed, is formed in reference numeral 1414. A mixed colored light emitting region in which blue and cyan are mixed, is formed in reference numeral 1415. A mixed colored light emitting region in which red and magenta are mixed, is formed in reference numeral 1416. A mixed colored light emitting region in which green and magenta are mixed, is formed in reference numeral 1417. A mixed colored light emitting region in which blue and magenta are mixed, is formed in reference numeral 1418. A mixed colored light emitting region in which red and yellow are mixed, is formed in reference numeral 1419. A mixed colored light emitting region in which green and yellow are mixed, is formed in reference numeral 1420. A mixed colored light emitting region in which blue and yellow are mixed, is formed in reference numeral 1421.

Further, the colors of the light emitting regions over the second substrate are shown in parentheses in reference numerals 1413, 1414, 1415, 1416, 1417, 1418, 1419, 1420, and 1421 of FIG. 20A. Specifically, in reference numeral 1413, "R" and "(C)" indicate that the red light emitting region over the first substrate is overlapped with the cyan light emitting region over the second substrate. In reference numeral 1414, "G" and "(C)" indicate that the green light emitting region over the first substrate is overlapped with the cyan light emitting region over the second substrate. In reference numeral 1415, "B" and "(C)" indicate that the blue light emitting region over the first substrate is overlapped with the cyan light emitting region over the second substrate. In reference numeral 1416, "R" and "(M)" indicate that the red light emitting region over the first substrate is overlapped with the magenta light emitting region over the second substrate. In reference numeral 1417, "G" and "(M)" indicate that the green light emitting region over the first substrate is overlapped with the magenta light emitting region over the second substrate. In reference numeral 1418, "B" and "(M)" indicate that the blue light emitting region over the first substrate is overlapped with the magenta light emitting region over the second substrate. In reference numeral 1419, "R" and "(Y)" indicate that the red light emitting region over the first substrate is overlapped with the yellow light emitting region over the second substrate. In reference numeral 1420, "G" and "(Y)" indicate that the green light emitting region over the first substrate is overlapped with the yellow light emitting region over the second substrate. In reference numeral 1421, "B" and "(Y)" indicate that the blue light emitting region over the first substrate is overlapped with the yellow light emitting region over the second substrate.

In the case of making only the red light emitting region 1400 over the first substrate emit light, reference numeral 1413 become a red light emitting region. In the case of making only the green light emitting region 1401 over the first substrate emit light, reference numeral 1414 become a green light emitting region. In the case of making only the blue light emitting region 1402 over the first substrate emit light, reference numeral 1415 become a blue light emitting region. In the case of making only the cyan light emitting region 1410 over the second substrate emit light, reference numerals 1413, 1414, and 1415 become cyan light emitting regions. In the case of making only the magenta light emitting region 1411 over the second substrate emit light, reference numerals 1416, 1417, and 1418 become magenta light emitting regions. In the case of making only the yellow light emitting region 1412 over the second substrate emit light, reference numerals 1419, 1420, and 1421 become yellow light emitting regions.

Note that the example of forming the cyan, magenta, and yellow organic light emitting elements is shown in this embodiment; however, the present invention is not limited thereto. A one colored organic light emitting element or two colored organic light emitting elements selected from cyan, magenta, and yellow may be formed. Further, the colors of organic light emitting elements to be formed are not particularly limited to cyan, magenta, and yellow, which are complementary colors of red, green, and blue. Colors other than red, green, blue, cyan, magenta, and yellow may be employed so long as they can widen the range of colors to be displayed. That is, any colored organic light emitting element may be employed so long as the organic light emitting element emits light with a color having a chromaticity coordinate outside of the range of a triangle of red, green, and blue chromaticity coordinates.

Further, in this embodiment, the case where the red, green, and blue organic light emitting elements are provided over the first substrate, the cyan, magenta, and yellow organic light emitting elements are provided over the second substrate, and a display screen is provided over the first substrate, is described; however, the present invention is not limited thereto.

The positions of the organic light emitting elements provided over the first substrate and the organic light emitting elements provided over the second substrate, may be counterchanged. Specifically, the cyan, magenta, and yellow organic light emitting elements may be provided over the first substrate whereas the red, green, and blue organic light emitting elements may be provided over the second substrate.

Further, display screens may be provided over both of the first and second substrates. In this case, dual emission type organic light emitting elements may be provided over both of the first and second substrates. Specifically, first electrodes and second electrodes of the organic light emitting elements provided over both of the first and second substrates may be formed using transparent conductive films.

Embodiment 2

The display device in which the organic light emitting elements provided over the first and second substrates are sealed with the first and second substrates such that the surfaces of the first and second substrates over which the organic light emitting elements are provided face each other, is described in each of the above described Embodiment Modes. In this embodiment, a display device having a structure in which organic light emitting elements provided over first and second substrates are sealed with a third substrate, will be described with reference to FIGS. 21A and 21B.

In this embodiment, the arrangements of organic light emitting elements provided over a first substrate and a second substrate are the same as the first structure of the present invention as well as Embodiment Mode 1, that is, in the case A of the present invention, wherein red, green, and blue organic light emitting elements are provided over a first substrate and a white organic light emitting element is provided over a second substrate; however, the present invention is not limited to this case. A combination of organic light emitting elements provided over each of the first and second substrates may be any case of the first to fourth structures of the present invention.

Figure 21A:
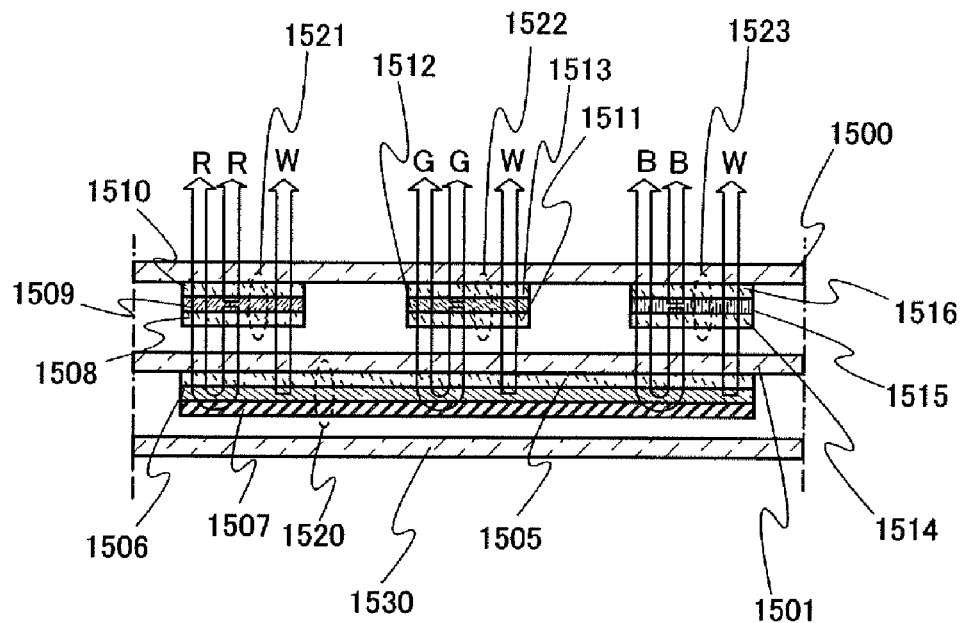
FIGS. 21A and 21B are cross sectional views showing a pixel structure of a display device described in Embodiment 2.

In FIG. 21A, reference numeral 1500 indicates a first substrate; 1501, a second substrate; and 1530, a third substrate. As the first and second substrates 1500 and 1501, light transmitting substrates such as a glass substrate and a plastic substrate are used.

Over the first substrate 1500, a red organic light emitting element 1521, a green organic light emitting element 1522, and a blue organic light emitting element 1523 are provided. Over the second substrate 1501, a white organic light emitting element 1520 is provided.

The red organic light emitting element 1521 includes a first electrode 1510, a second electrode 1508, and a layer 1509 containing an organic compound sandwiched between the first electrode 1510 and the second electrode 1508. The green organic light emitting element 1522 includes a first electrode 1513, a second electrode 1511, and a layer 1512 containing an organic compound sandwiched between the first electrode 1513 and the second electrode 1511. The blue organic light emitting element 1523 includes a first electrode 1516, a second electrode 1514, and a layer 1515 containing an organic compound sandwiched between the first electrode 1516 and the second electrode 1514.

The white organic light emitting element 1520 includes a first electrode 1505, a second electrode 1507, and a layer 1506 containing an organic compound sandwiched between the first electrode 1505 and the second electrode 1507.

As shown in FIG. 21A, the first and second substrates are attached to each other such that a surface of the first substrate over which the organic light emitting elements 1521, 1522, and 1523 are provided faces a surface of the second substrate, which is opposite to the other surface of the second substrate over which the organic light emitting element 1520 is provided.

Further, the second substrate is attached to a third substrate such that the surface of the second substrate over which the organic light emitting element 1520 is provided faces a surface of the third substrate.

The second substrate serves as a counter substrate with respect to the first substrate whereas the third substrate serves as a counter substrate with respect to the second substrate.

The organic light emitting elements 1521, 1522, and 1523 provided over the first substrate have a dual emission structure, in which the organic light emitting elements emit light toward the both sides of the first substrate 1500. Accordingly, the first electrodes 1510, 1513, and 1516 and the second electrodes 1508, 1511, and 1514 of the organic light emitting elements 1521, 1522, and 1523 provided over the first substrate are formed using transparent conducive films.

The organic light emitting element 1520 provided over the second substrate has a bottom emission type structure, in which the organic light emitting element emits light toward the surface of the second substrate 1501 opposite to the other surface of the second substrate over which the organic light emitting element 1520 is provided, i.e., toward the first substrate. Accordingly, the first electrode 1505 of the organic light emitting element 1520 is formed using a transparent conductive film whereas the second electrode 1507 thereof is formed using an electrode having a function of reflecting light. As the electrode having a function of reflecting light, the materials described in Embodiment Mode 1 may be used.

Further, arrows of FIG. 21A indicate the directions of light emitted from the respective organic light emitting elements.

According to the above described structure, the organic light emitting elements 1521, 1522, and 1523 emit light toward the both sides of the first substrate 1500 whereas the white organic light emitting element 1520 emits light toward the surface of the second substrate 1501 opposite to the other surface of the second substrate over which the organic light emitting element 1520 is provided. Light emitted toward the second substrate 1501 from the organic light emitting elements 1521, 1522, and 1523 is reflected by the second electrode 1507 (the electrode having a function of reflecting light) of the white organic light emitting element 1520 provided over the second substrate 1501, and the reflected light travels toward the first substrate 1500. A display screen is provided over the first substrate 1500, and an image whose brightness is controlled by the white organic light emitting element 1520 is displayed on the display screen.

In the display device having the structure in which the organic light emitting elements are sealed with the three substrates, the positions of the organic light emitting elements provided over the first substrate and the organic light emitting elements provided over the second substrate, may be counterchanged. Further, display screens may be provided over both of the first and second substrates.

Figure 21B:
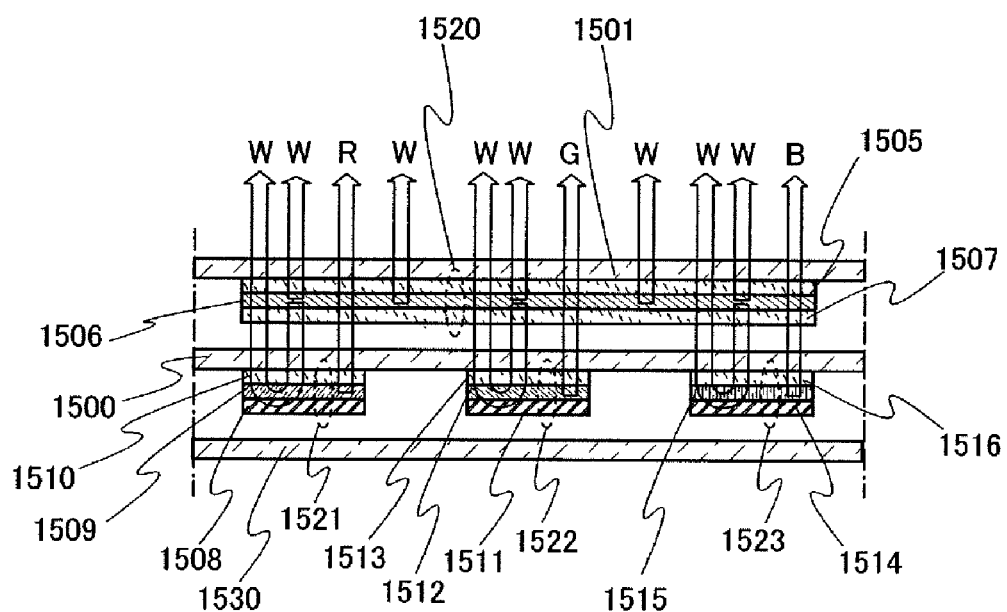

FIG. 21B shows an example in which positions of the organic light emitting elements provided over the first substrate and the organic light emitting elements provided over the second substrate are counterchanged. In FIG. 21B, the same portions as those of FIG. 21A are denoted by same reference numerals.

The first substrate 1500 and the second substrate 1501 are attached to each other such that the surface of the second substrate 1501 over which the organic light emitting element 1520 is provided faces the surface of the first substrate 1500 opposite to the other surface of the first substrate over which the organic light emitting elements 1521, 1522, and 1523 are provided. Further, the first substrate 1500 and the third substrate are attached to each other such that the surface of the first substrate over which the organic light emitting elements 1521, 1522, and 1523 are provided faces the surface of the third substrate.

Differing from FIG. 21A, in FIG. 21B, the positions of the first substrate 1500 and the second substrate 1501 are counterchanged, the second electrodes 1508, 1511, and 1514 of the organic light emitting elements 1521, 1522, and 153 provided over the first substrate are formed using electrodes having a function of reflecting light, and the second electrode 1507 of the organic light emitting element 1520 provided over the second substrate 1501 is formed using a transparent conductive film.

According to this structure, the organic light emitting elements 1521, 1522, and 1523 provided over the first substrate 1500 emit light toward the direction opposite to the surface of the first substrate 1500 over which the organic light emitting elements 1521, 1522, and 1523 are provided while the organic light emitting element 1520 provided over the second substrate 1501 emits light toward the both surfaces of the second substrate. Light emitted toward the first substrate 1500 from the white organic light emitting element 1520 is reflected by the second electrodes (electrodes having a function of reflecting light) of the organic light emitting elements 1521, 1522, and 1523 provided over the first substrate, and then the reflected light travels toward the second substrate 1501. In this case, a display screen is provided over the second substrate, and an image whose brightness is controlled by the white organic light emitting element 1520 is displayed on the display screen.

Moreover, an example of a display device having organic light emitting elements sealed with three substrates in which display screens are provided over both surfaces of substrates, will be described with reference to FIG. 22.

Figure 22:
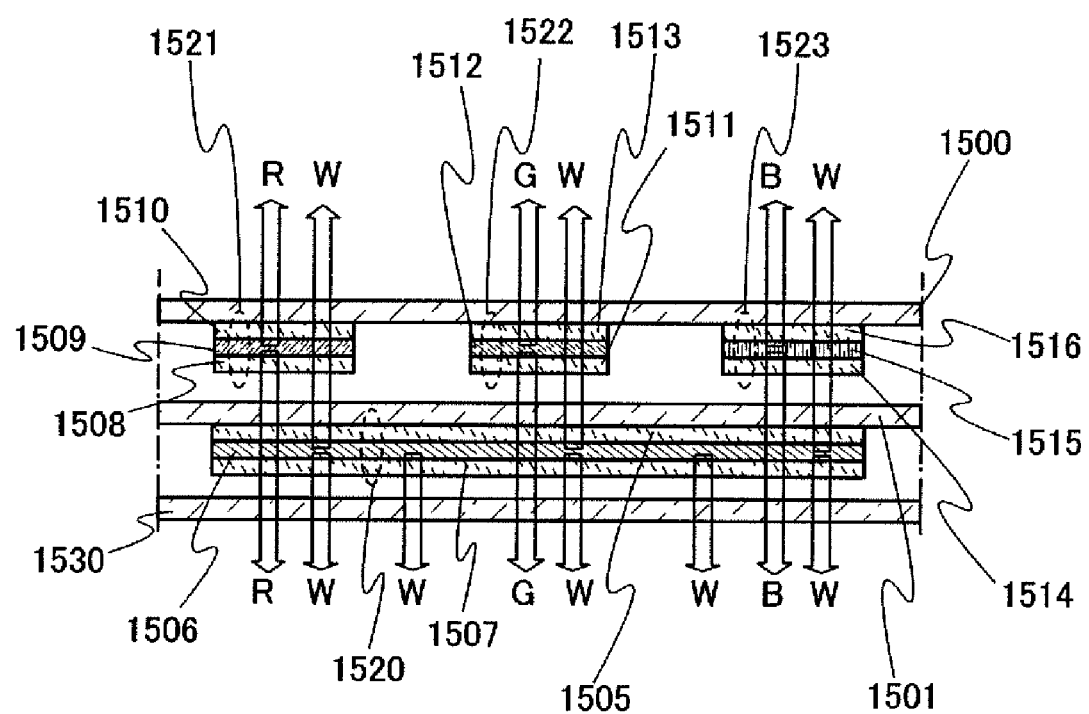
FIG. 22 is a cross sectional view showing a pixel structure of a display device described in Embodiment 2.

In FIG. 22, the same reference numerals are used in the same portions as those of FIG. 21A. Differing from FIG. 21A, in FIG. 22, the second electrode 1507 of the organic light emitting element 1520 provided over the second substrate 1501 is formed using a transparent conductive film.

According to this structure, since the first and second electrodes of the organic light emitting elements 1521, 1522, and 1523 provided over the first substrate 1500 and the organic light emitting element 1520 provided over the second substrate 1501 are formed using transparent conductive films, the organic light emitting elements 1521, 1522, and 1523 provided over the first substrate and the organic light emitting element 1520 provided over the second substrate have a dual emission structure. Thus, light is emitted from both of the first substrate 1500 and the third substrate 1530 as shown in FIG. 22, and hence, the display screens can be provided over the both of the first and third substrates.

Note that, an image recognized on the display screen formed over the first substrate is a mirrored image of an image recognized on the display screen formed over the third substrate. Further, since the first and second substrates are the light transmitting substrates, the display screens of the first and second substrates are formed while a viewer can see the view beyond the first and third substrates.

Further, by providing polarizing plates over the first and third substrates, it is possible to prevent a viewer from seeing the view beyond the first and third substrates on the display screens formed over the first and third substrates.

Furthermore, a display screen may be provided only over the third substrate. In this case, the organic light emitting elements provided over the first substrate may have a top emission structure, the organic light emitting element provided over the second substrate may have a dual emission structure, and light transmitting substrates may be used as the second and third substrates. That is, the second electrodes of the organic light emitting elements provided over the first substrate may be formed using a transparent conductive film and the first and second electrodes of the organic light emitting element provided over the second substrate may be formed using transparent conductive films.

FIG. 21A shows the structure in which the display screen is provided only over the first substrate 1500. Alternatively, in a case where the display screen is provided only over the third substrate 1530, the second electrodes 1508, 1511, and 1514 of the organic light emitting elements 1521, 1522, and 1523 provided over the first substrate 1500 may be formed using a transparent conductive film, and the first electrode 1505 and the second electrode 1507 of the organic light emitting element 1520 provided over the second substrate 1501 may be formed using transparent conductive films.

Embodiment 3

Figure 23:
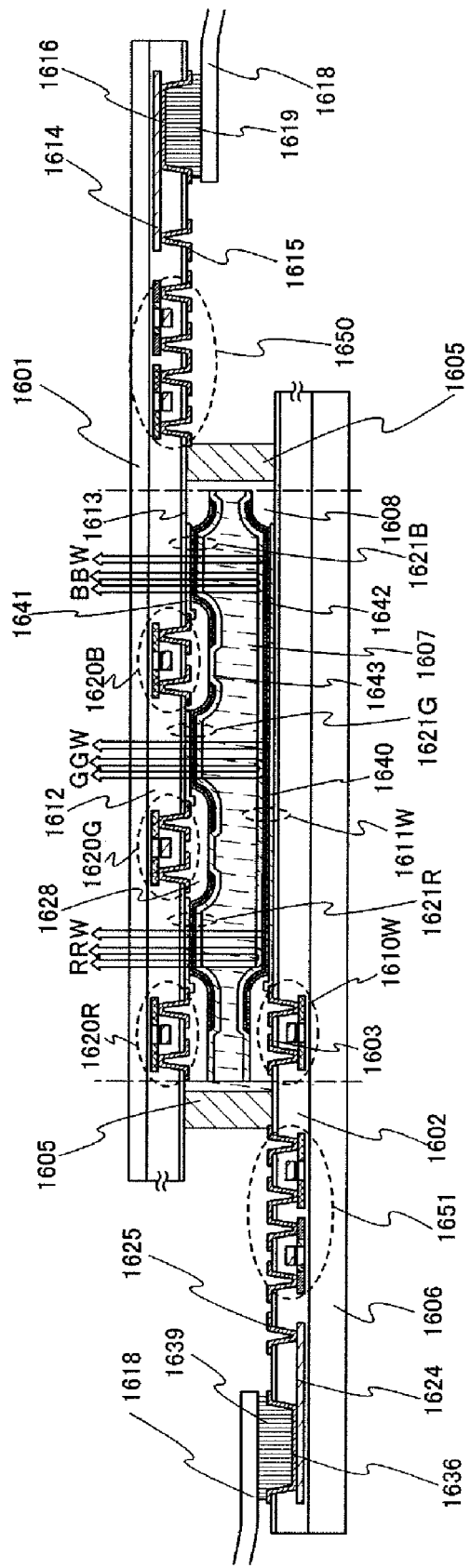
FIG. 23 is a cross sectional view showing a display device described in Embodiment 3.

In this embodiment, an example of a more specific cross sectional structure of the display device shown in FIG. 1 will be described with reference to FIG. 23. FIG. 23 is a cross sectional view along a line A-A' of the display device shown in FIG. 1. Note that, FIG. 23 shows a more specific cross sectional structure of the display device shown in FIG. 1 in a case where the display device has the cross sectional structure shown in FIG. 3A. Specifically, an example of a cross sectional structure of the display device of FIG. 1 in a case where a first substrate over which red, green, and blue organic light emitting elements are provided is overlapped with a second substrate over which a white organic light emitting element is provided and a display screen is provided over the first substrate, will be shown here. Note that, in FIG. 23, a cross sectional portion shows a cross sectional view of one pixel.

First, TFTs 1620R, 1620G, and 1620B provided in a pixel portion, a peripheral driver circuit TFT 1650, an insulating film 1612, and a protection film 1613 are formed over a first substrate 1601. Leading wirings 1614 and 1615, and a connection terminal 1616 are formed at the same time of forming these TFTs. Further, the TFT 1620R is a thin film transistor for driving a red organic light emitting element; the TFT 1620G a thin film transistor for driving a green organic light emitting element; and the TFT 1620B, a thin film transistor for driving a blue organic light emitting element.

Next, first electrodes 1641 serving as anodes (or cathodes) of organic light emitting elements 1621R, 1621G, and 1621B are formed, and an insulator (a partition wall) 1628 covering the edges of the first electrodes are formed. Subsequently, layers containing organic compounds and second electrodes are formed to form the organic light emitting elements 1621R, 16216, and 1621B. Note that the organic light emitting element 1621R is a red organic light emitting element; 1621G, a green organic light emitting element; and 1621B, a blue organic light emitting element. The first and second electrodes of the respective organic light emitting elements are formed using transparent conductive films. By forming the first and second electrodes of the respective organic light emitting elements by using the transparent conductive films, the organic light emitting elements have a dual emission structure.

A protection film 1643 is formed over the organic light emitting elements 1621R, 1621G, and 1621B.

Further, the layer containing the organic compound included in the organic light emitting element 1621R contains a red light emitting material, the layer containing the organic compound included in the organic light emitting element 1621G contains a green light emitting element, and the layer containing the organic compound included in the organic light emitting element 1621B contains a blue light emitting material.

A TFT 1610W, a peripheral driver circuit TFT 1651, an insulating film 1602, and a protection film 1603 are also formed over a second substrate 1606. Leading wirings 1624 and 1625, and a connection terminal 1636 are formed at the same time of forming the TFT 1610W. Note that the TFT 1610W is a thin film transistor for driving a white organic light emitting element.

Next, a first electrode 1640 serving as an anode (or a cathode) of the organic light emitting element 1611W is formed, and an insulator (a partition wall) 1608 covering the edge of the first electrode is formed. Subsequently, a layer containing an organic compound and a second electrode are formed to achieve the organic light emitting element 1611W. Note that, the organic light emitting element 1611W is a white organic light emitting element, the first electrode of the organic light emitting element 1611W is formed using an electrode having a function of reflecting light, and the second electrode is formed using a transparent conductive film.

A protection film 1642 is formed over the organic light emitting element 1611W. Further, the layer containing the organic compound included in the organic light emitting element 1611W contains a white light emitting material.

Next, the first substrate 1601 and the second substrate 1606 are attached to each other with a sealing material 1605 and a filler 1607. As the filler 1607, a transparent material is used. As shown in FIG. 23, the first and second substrates are attached to each other such that a surface of the first substrate over which the organic light emitting elements 1621R, 1621G, and 1621B are formed faces a surface of the second substrate over which the organic light emitting element 1611W is formed while the organic light emitting elements 1621R, 1621Q and 1621B formed over the first substrate are overlapped with the organic light emitting element 1611W formed over the second substrate. Thus, a display device for full color display whose brightness can be controlled by the white organic light emitting element, is completed.

Then, FPCs 1618 and 1638 are attached to the connection terminals 1616 and 1636 by anisotropic conductive films 1619 and 1639.

In the display device as shown in FIG. 23, the organic light emitting elements 1621R, 1621G, and 1621B formed over the first substrate emit light toward the both surfaces of the first substrate. Light emitted toward the second substrate from the organic light emitting elements 1621R, 1621G, and 1621B is reflected by the first electrode (the electrode having a function of reflecting light) of the white organic light emitting element 1611W formed over the second substrate, and the reflected light travels toward the first substrate. Further, the white organic light emitting element 1611W formed over the second substrate emits light toward the first substrate. Accordingly, a viewer can recognize a display generated by light emitted from the respective organic light emitting elements, which passes through the first substrate. In this case, a display screen is provided over the first substrate. Further, in FIG. 23, arrows indicate the directions of light emitted from the respective organic light emitting elements.

In the case of the structure shown in FIG. 23, only white light emitted from the organic light emitting element 1611W formed over the second substrate passes through the first substrate at a portion in which the organic light emitting elements 1621R, 1621G and 1621B are not formed over the first substrate, and for example, at a portion where the TFTs 1620R, 1620G, and 1620B are formed. Accordingly, the white light is sometimes seen at the portion. In this case, the insulator (partition wall) 1628 covering the edges of the first electrodes formed over the first substrate is colored and this colored partition wall 1628 may serve as a black matrix. In order to color the partition wall 1628, the partition wall may be formed using a resin material in which a fine particle pigment is dispersed.

Figure 24:
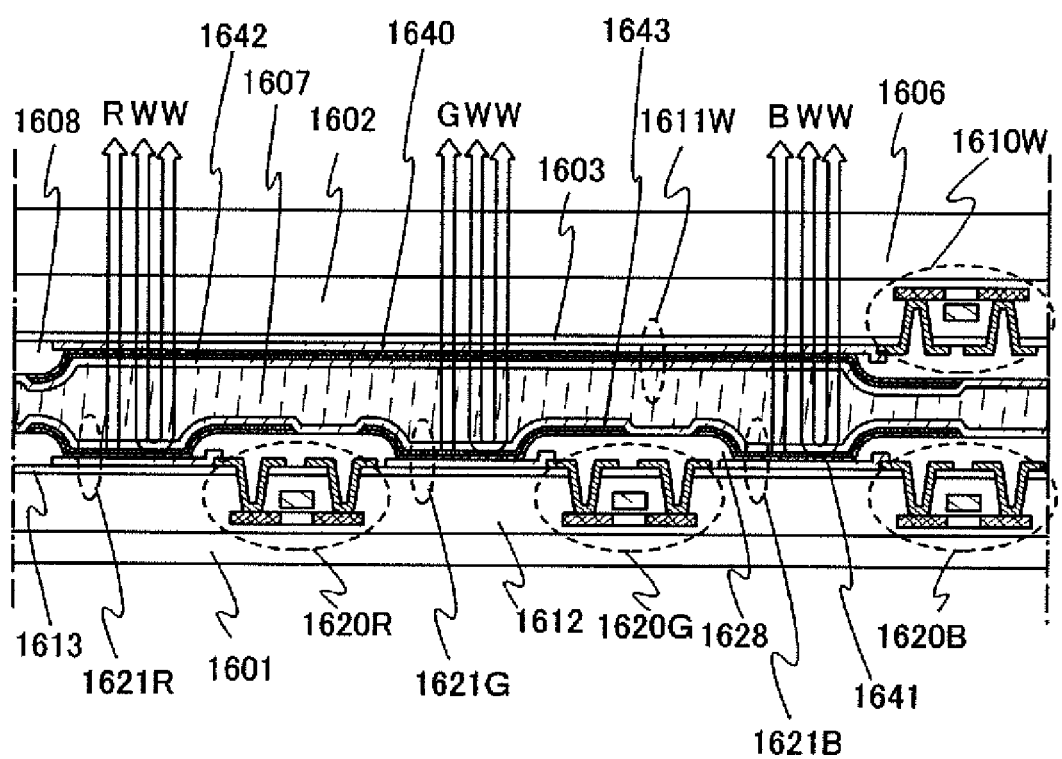
FIG. 24 is a cross sectional view showing a display device described in Embodiment 3.

Further, a structure in which the positions of the first substrate and the second substrate of the structure of FIG. 23 are counterchanged, will be described with reference to FIG. 24. A connection portion between a peripheral driver circuit and an FPC is not shown in FIG. 24, and FIG. 24 shows a cross sectional view of one pixel in a pixel portion. In FIG. 24, the same portions as those of FIG. 23 are denoted by the same reference numerals.

The display device shown in FIG. 24 may be manufactured in the same manner as the display device shown in FIG. 23. However, in the case of the display device shown in FIG. 24, the first electrodes of the organic light emitting elements 1621R, 1621G, and 1621B formed over the first substrate are formed using electrodes having a function of reflecting light while the second electrodes are formed using transparent conductive films. Further, the first and second electrodes of the white organic light emitting element 1611W formed over the second substrate are formed using transparent conductive films.

In the display device shown in FIG. 24, the organic light emitting elements 1621R, 1621G, and 1621B formed over the first substrate emit light toward a surface of the first substrate over which the organic light emitting elements 1621R, 1621G, and 1621B are formed. That is, light generated in the organic light emitting elements 1621R, 1621G and 1621B is emitted toward the second substrate. The white organic light emitting element 1611W formed over the second substrate emits light toward the both surfaces of the second substrate. Light emitted toward the first substrate from the organic light emitting element 1611W is reflected by the first electrodes (electrodes having a function of reflecting light) of the organic light emitting elements 1621R, 1621G, and 1621B formed over the first substrate, and the reflected light travels toward the second substrate. Thus, the display device shown in FIG. 24 has a structure in which a viewer can recognize a display generated by light emitted from the respective organic light emitting elements, which passes through the second substrate. That is, a display screen is provided over the second substrate. Note that, in FIG. 24, arrows indicate the directions of light emitted from the respective organic light emitting elements.

In the display device shown in FIG. 24, the organic light emitting element 1611W is formed at a portion through which light generated from the organic light emitting elements 1621R, 1621G and 1621B passes. Accordingly, the partition wall 1608 does not exist in the portion through which light generated from the organic light emitting elements 1621R, 1621G and 1621B passes, and therefore, light generated from the organic light emitting elements 1621R, 1621G and 1621B easily passes through the second substrate 1606.

In addition, when the interlayer insulating film 1602 and the protection film 1603 are formed using a material having high transmittance with respect to light emitted from the organic light emitting elements 1621R, 1621G, and 1621B, light emitted from the organic light emitting elements can easily passes through the interlayer insulating film and the protection film. Also, in order to further increase the transmittance, a part of the interlayer insulating film 1602 or the protection film 1603 may be selectively eliminated at a portion through which light emitted from the organic light emitting elements 1621R, 1621G, and 1621B passes.

In FIG. 23 and FIG. 24, the TFTs for driving the organic light emitting elements have a top gate structure. However, the structure of the TFTs is not limited to the top gate structure, and a known TFT structure such as a bottom gate structure can be used.

Further, the display screen is formed only over the one surface of the display device in each of FIG. 23 and FIG. 24. Alternatively, display screens can be provided over the both surfaces of each display device (i.e., the display screens are provided over the first and second substrates). In this case, the first and second electrodes of the organic light emitting elements 1621R, 1621G and 1621B formed over the first substrate and the first and second electrodes of the organic light emitting element 1611W formed over the second substrate may be formed using transparent conductive films.

The example of Embodiment Mode 1 in which the white organic light emitting element is formed over the second substrate, is employed in this embodiment. Furthermore, this embodiment can be applied to other Embodiment Modes and Embodiments.

Embodiment 4

A structural example in which a viewer cannot see the view beyond the first and second substrates in a case where images are displayed over both surfaces of a display device, will be described in this embodiment with reference to FIGS. 31A and 31B.

Figure 31A:
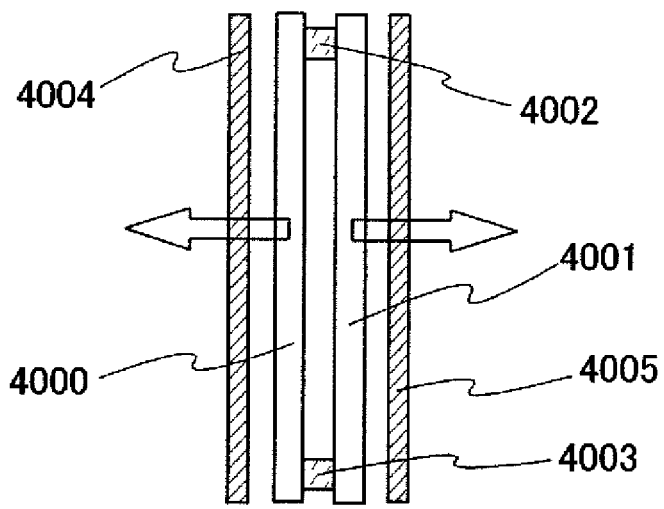
FIGS. 31A and 31B are cross sectional views of a display device described in Embodiment 4.
Figure 31B:
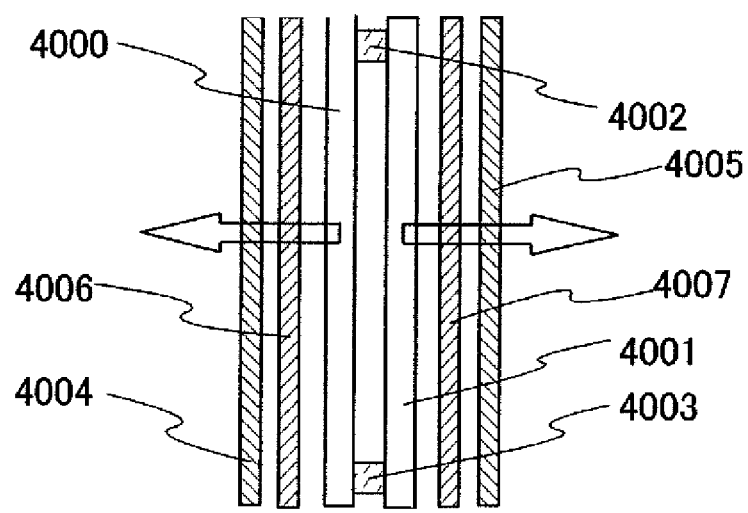

FIGS. 31A and 31B are cross sectional views of display devices, wherein images are displayed on both surfaces of each display device. Arrows indicate the directions of light emission. In FIG. 31A, reference numeral 4000 is a first substrate and reference numeral 4001 is a second substrate. A dual emission type organic light emitting elements are provided over one surface of each of the first and second substrates 4000 and 4001 though not shown in the drawings. The first and second substrates 4000 and 4001 are attached to each other such that the organic light emitting elements provided over the first and second substrates are face each other and are sealed with a sealing material 4002 and a sealing material 4003. Thus, a panel is obtained. Further, the first and second substrates are sandwiched between a first polarizing plate 4004 and a second polarizing plate 4005 such that polarizing directions of light are orthogonal to each other. When the first and second polarizing plates 4004 and 4005 are arranged such that the polarizing directions of light are orthogonal to each other, outside light can be shielded. In addition, light emitted from the panel only passes through one polarizing plate so as to perform a display. Accordingly, by providing the first polarizing plate 4004 and the second polarizing plate 4005 in such a manner, since a portion other than a portion displaying an image becomes black, a viewer cannot see the view beyond the first and second substrates when the viewer sees the both display screens provided over the first and second substrates, thereby preventing the display screen from being difficult to be recognized.

Further, λ/4 wavelength plates may be provided between the first substrate 4000 and the first polarizing plate 4004 and between the second substrate 4001 and the second polarizing plate 4005. An example of this structure will be shown in FIG. 31B. In FIG. 31B, the same portions as those of FIG. 31A are denoted by the same reference numerals. Differing from FIG. 31A, in FIG. 31B, a first λ/4 wavelength plate 4006 is provided between the first substrate 4000 and the first polarizing plate 4004 and a second λ/4 wavelength plate 4007 is provided between the second substrate 4001 and the second polarizing plate 4005. When the first and second λ/4 wavelength plates are provided between the first substrate and the first polarizing plate and between the second substrate and the second polarizing plate, it is possible to prevent a viewer from seeing the view beyond the first and second substrates on the display screens. In addition, reduction in contrast caused by reflection of outside light at the panel can be inhibited.

In FIGS. 31A and 31B, there are a space between the first substrate and the first polarizing plate, a space between the first substrate and the first λ/4 wavelength plate, a space between the first λ/4 wavelength plate and the first polarizing plate, a space between the second substrate and the second polarizing plate, a space between the second substrate and the second λ/4 wavelength plate, and a space between the second λ/4 wavelength plate and the second polarizing plate. However, this embodiment is not limited to the structure, and they may be provided to be in contact with one another.

Furthermore, in FIG. 31B, a first λ/2 wavelength plate may be provided between the first polarizing plate 4004 and the first λ/4 wavelength plate 4006 and a second λ/2 wavelength plate may be provided between the first polarizing plate 4005 and the second λ/4 wavelength plate 4007.

The examples of preventing a viewer from seeing the view beyond the first and second substrates on the display screens is described in this embodiment. In a case where an image is displayed on one display screen, it is not necessary to prevent a viewer from seeing the view beyond the first and second substrates, and therefore, a polarizing plate is not required. However, in this case, it is necessary to prevent reduction in contrast caused by reflection of outside light at the panel. Accordingly, in the case where an image is displayed on one display screen, reduction in contrast caused by reflection of outside light at the panel can be prevented by providing a λ/4 wavelength plate between the display screen and the viewer or a λ/4 wavelength plate and a λ/2 wavelength plate between the display screen and the viewer.

Note that the present embodiment can be implemented in the above described display device having any structure, and can be applied to all of Embodiment Modes 1 through 7 and Embodiments 1 through 4.

Embodiment 5

By incorporating display devices according to the present invention, various kinds of electronic appliances can be manufactured. As the electronic appliances, a camera such as a video camera and a digital camera; a goggle type display (a head mounted display); a navigation system; a sound reproduction device (such as a car audio and an audio component system); a laptop personal computer; a game machine; a portable information terminal (such as a mobile computer, a cellular telephone, a portable game machine, and an electronic book); a picture reproducer provided with a recording medium (typically, a device which can play the recording medium such as a digital versatile disc (DVD) and display images thereof); and the like can be given. Specific examples of these electronic appliances are shown in FIGS. 25A to 25H and FIG. 26.

Figure 25A:
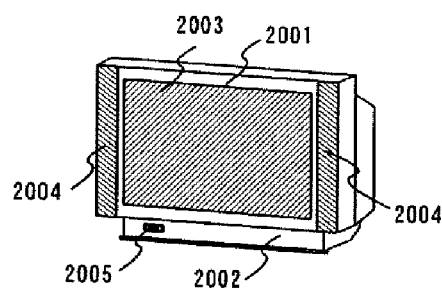
FIGS. 25A to 25H are diagrams showing electronic appliances described in Embodiment 4.

FIG. 25A is a television including a housing 2001, a supporting base 2002, a display portion 2003, speaker portions 2004, a video input terminal 2005, and the like. The present invention can be applied to the display portion 2003. Further, the television also includes all information displaying apparatuses for a computer, a TV broadcasting, advertisement, and the like.

Figure 25B:
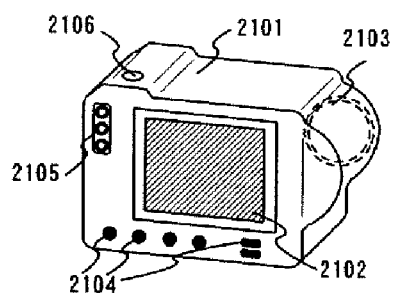

FIG. 25B is a digital camera including a main body 2101, a display portion 2102, an image receiving portion 2103, operation keys 2104, an external connection port 2105, a shutter 2106, and the like. The present invention can be applied to the display portion 2102.

Figure 25C:
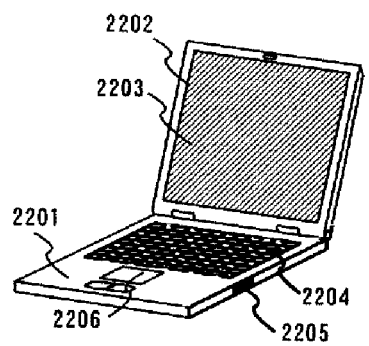

FIG. 25C is a laptop personal computer including a main body 2201, a housing 2202, a display portion 2203, a keyboard 2204, an external connection port 2205, a pointing mouse 2206, and the like. The present invention can be applied to the display portion 2203.

Figure 25D:
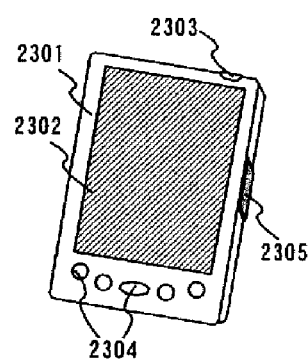

FIG. 25D is a mobile computer including a main body 2301, a display portion 2302, a switch 2303, operation keys 2304, an infrared port 2305, and the like. The present invention can be applied to the display portion 2302.

Figure 25E:
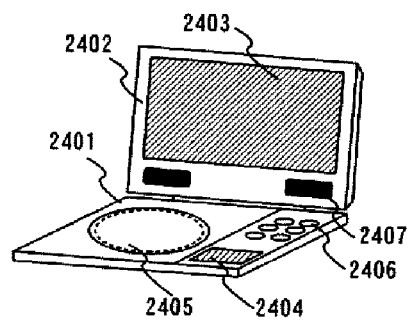

FIG. 25E is a portable picture reproducer equipped with a recording medium (specifically, a DVD reproducer), including a main body 2401, a housing 2402, a display portion A 2403, a display portion B 2404, a recording medium (e.g., a DVD or the like) reading portion 2405, operation keys 2406, speakers 2407, and the like. The display portion A 2403 mainly displays image information whereas the display portion B mainly displays character information. The present invention can be applied to the display portion A 2403 and the display portion B 2404. Further, the picture reproducer equipped with a recording medium includes a home-use game machine and the like.

Figure 25F:
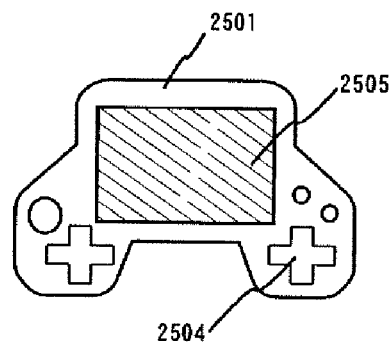

FIG. 25F is a game machine including a main body 2501, a display portion 2505, operation switches 2504, and the like.

Figure 25G:
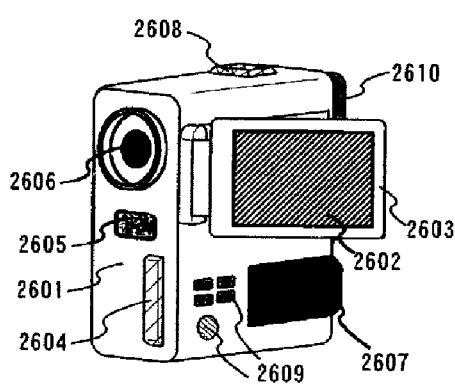

FIG. 25G is a video camera including a main body 2601, a display portion 2602, a housing 2603, an external connection port 2604, a remote control receiver 2605, an image receiving portion 2606, a buttery 2607, an audio input portion 2608, operation keys 2609, eyepiece portions 2610, and the like. The present invention can be applied to the display portion 2602.

Figure 25H:
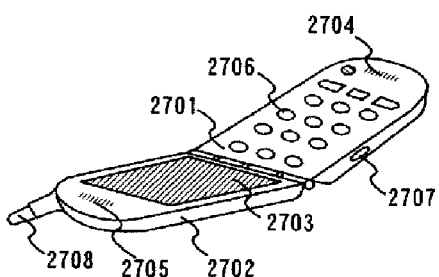

FIG. 25H is a cellular phone including a main body 2701, a housing 2702, a display portion 2703, an audio input portion 2704, an audio output portion 2705, operation keys 2706, an external connection port 2707, an antenna, 2708 and the like. The present invention can be applied to the display portion 2703.

Figure 26:
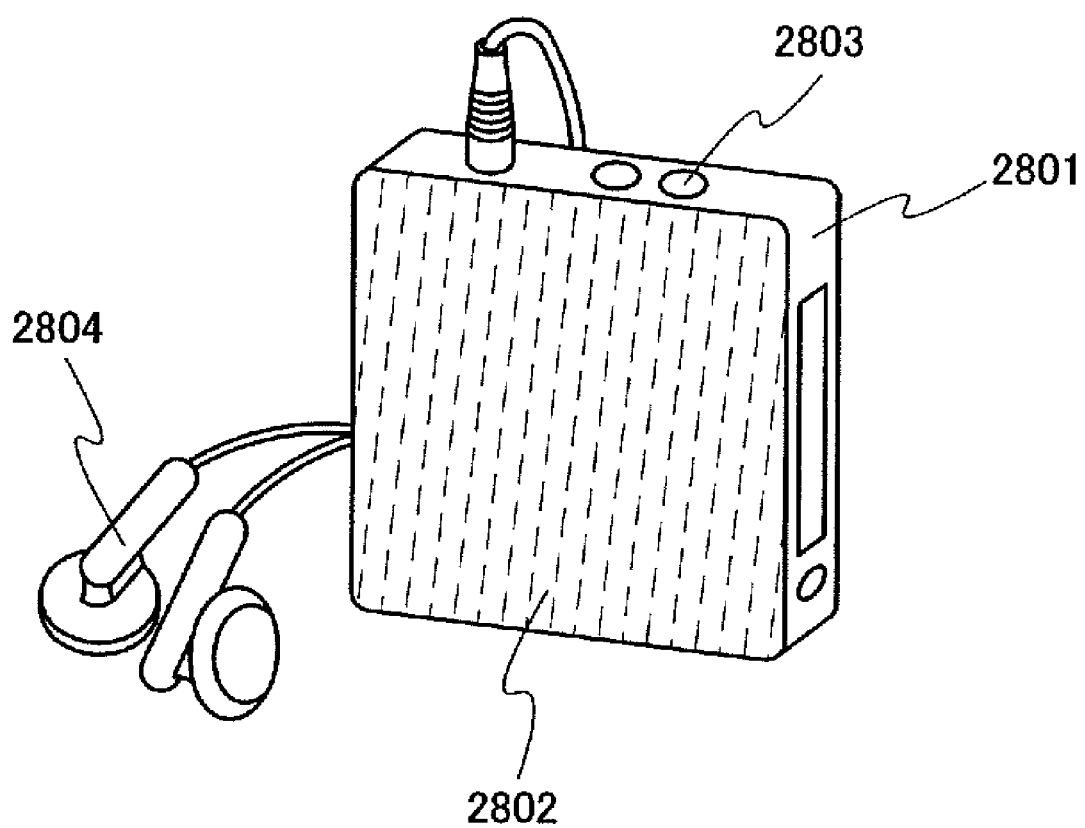
FIG. 26 is a diagram showing an electronic appliance described in Embodiment 4.

FIG. 26 is an audio player including a main body 2801, a half-mirror panel 2802, operation keys 2803, earphones 2804, and the like. A display portion is provided in a part of the half-mirror panel 2802. When an image is not displayed on the display portion, the half-mirror panel is like a mirror. A display device according to the present invention can be applied to the display device provided in a part of the half-mirror panel 2802.

The digital camera, the laptop personal computer, the gate machine, the video camera, the cellular phone, and the like among the above mentioned electronic appliances can be freely carried, and therefore, they can be used in the open air and in doors. Since brightness in the open air is different from brightness in doors, optimum brightness (which is easily visible) of a display screen is differed between a case of using such electronic appliances in the open air and a case of using them in doors. When a panel is formed by attaching a substrate over which red, green, and blue organic light emitting elements are provided to another substrate over which a white organic light emitting element is provided, and a light sensor for detecting surrounding brightness is provided to change luminance of the white organic light emitting element in accordance with the surrounding brightness detected by the light sensor, brightness of a display screen can be controlled in accordance with changes in brightness around an electronic appliance.

As set forth above, the display devices obtained according to the present invention can be used as display portions for various electronic appliances. Note that the light emitting device manufactured using any structures described in Embodiment Modes 1 through 7 and Embodiments 1 through 4 may be used for the electronic appliances of this embodiment.

This application is based on Japanese Patent Application Serial No. 2005-121746 filed in Japan Patent Office on Apr. 19, 2005, the entire contents of which are hereby incorporated by reference.

What is claimed is:

1. A display device comprising:
   a first substrate;
   a second substrate;
   a first and a second organic light emitting element provided over a surface of the first substrate and electrically connected to thin film transistors; and
   a third and a fourth organic light emitting element provided over a surface of the second substrate,
   wherein the first substrate faces the second substrate,
   wherein each of the first, the second, the third and the fourth organic light emitting elements includes a first electrode, a second electrode, and a layer containing an organic compound sandwiched between the first electrode and the second electrode,
   wherein the first and second electrodes of at least one of the organic light emitting elements provided over the first and second substrates comprise a transparent conductive film,
   wherein a first light emitting region of the first organic light emitting element and a second light emitting region of the second organic light emitting element provided over the first substrate are at least partly overlapped with a third light emitting region of the third organic light emitting element and a fourth light emitting region of the fourth organic light emitting element provided over the second substrate, and
   wherein the first, the second, the third and the fourth organic light emitting elements are included in one pixel.

2. The display device according to claim 1,
   wherein the first light emitting region is overlapped with the third light emitting region, and
   wherein the second light emitting region is overlapped with the fourth light emitting region.

3. The display device according to claim 1,
   wherein the first light emitting region is overlapped with the third light emitting region and the fourth light emitting region, and
   wherein the second light emitting region is overlapped with the third light emitting region and the fourth light emitting region.

4. The display device according to claim 1,
   wherein the first organic light emitting element emits a red light and the second organic light emitting element emits either a green light or a white light,
   wherein the third organic light emitting element emits a blue light and the fourth organic light emitting element emits either a green light or a white light,
   wherein the first light emitting region is overlapped with the third light emitting region, and
   wherein the second light emitting region is overlapped with the fourth light emitting region.

5. The display device according to claim 1,
wherein the first organic light emitting element emits a red light and the second organic light emitting element emits either a green light or a white light,
wherein the third organic light emitting element emits a blue light and the fourth organic light emitting element emits either a green light or a white light,
wherein the first light emitting region is overlapped with the fourth light emitting region, and
wherein the second light emitting region is overlapped with the third light emitting region.

6. The display device according to claim 1,
wherein the first organic light emitting element emits a red light and the second organic light emitting element emits either a green light or a white light,
wherein the third organic light emitting element emits a blue light and the fourth organic light emitting element emits either a green light or a white light,
wherein the first light emitting region is overlapped with the third light emitting region and the fourth light emitting region, and
wherein the second light emitting region is overlapped with the third light emitting region the fourth light emitting region.

7. The display device according to claim 1,
wherein the third organic light emitting element emits a red light and the fourth organic light emitting element emits either a green light or a white light,
wherein the first organic light emitting element emits a blue light and the second organic light emitting element emits either a green light or a white light,
wherein the third light emitting region is overlapped with the first light emitting region and the second light emitting region, and
wherein the fourth light emitting region is overlapped with the first light emitting region and the second light emitting region.

8. The display device according to claim 1,
wherein the first organic light emitting element emits a blue light and the second organic light emitting element emits either a green light or a white light,
wherein the third organic light emitting element emits a red light and the fourth organic light emitting element emits either a green light or a white light,
wherein the first light emitting region is overlapped with the fourth light emitting region, and
wherein the second light emitting region is overlapped with the third light emitting region.

9. The display device according to claim 1,
wherein the first organic light emitting element emits a blue light and the second organic light emitting element emits either a green light or a white light,
wherein the third organic light emitting element emits a red light and the fourth organic light emitting element emits either a green light or a white light,
wherein the first light emitting region is overlapped with the third light emitting region and the fourth light emitting region, and
wherein the second light emitting region emitting element is overlapped with the third light emitting region and the fourth light emitting region.

* * * * *